United States Patent
Seo et al.

(10) Patent No.: US 11,381,895 B2
(45) Date of Patent: Jul. 5, 2022

(54) DISPLAY DEVICE

(71) Applicant: Samsung Display Co., LTD., Yongin-si (KR)

(72) Inventors: Young Seok Seo, Seoul (KR); Jung Hun Noh, Yongin-si (KR); Seung Lyong Bok, Hwaseong-si (KR); Yi Joon Ahn, Seoul (KR); Sun Mi Yu, Seoul (KR); Jin Oh Kwag, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/070,527

(22) Filed: Oct. 14, 2020

(65) Prior Publication Data
US 2021/0120324 A1 Apr. 22, 2021

(30) Foreign Application Priority Data
Oct. 18, 2019 (KR) .......................... 10-2019-0129531

(51) Int. Cl.
*G06F 3/044* (2006.01)
*H04R 1/02* (2006.01)
(Continued)

(52) U.S. Cl.
CPC ........... *H04R 1/028* (2013.01); *G06F 3/0412* (2013.01); *G06F 3/0446* (2019.05); *H01L 27/323* (2013.01); *H01L 27/3234* (2013.01); *H01L 27/3244* (2013.01); *H01L 51/529* (2013.01); *H04R 3/00* (2013.01);
(Continued)

(58) Field of Classification Search
CPC . G06F 2203/04105; G06F 2203/04107; G06F 3/0412; G06F 3/0446; G06K 9/0002; G06K 9/0004; G09G 3/3233; G09G 3/3266; H01L 27/3225; H01L 27/323; H01L 27/3234; H01L 27/3244; H01L 51/529; H04R 17/005; H04R 1/028;
(Continued)

(56) References Cited

U.S. PATENT DOCUMENTS 7,489,066 B2 2/2009 Scott et al.
10,971,552 B2 * 4/2021 Park ..................... H01L 27/3209
(Continued)

FOREIGN PATENT DOCUMENTS

CN 109244108 1/2019
KR 10-2019-0013680 2/2019
(Continued)

*Primary Examiner* — Calvin C Ma
(74) *Attorney, Agent, or Firm* — Kile Park Reed & Houtteman PLLC

(57) ABSTRACT

A display device includes a display panel including a display layer including light-emitting elements disposed on a substrate, and a sensor electrode layer disposed on the display layer. The sensor electrode layer includes a first sound electrode and a second sound electrode; a vibration layer electrically contacting the first sound electrode and the second sound electrode and being deformed in response to a first sound driving voltage applied to the first sound electrode and a second sound driving voltage applied to the second sound electrode; and sensor electrodes disposed on the vibration layer. The sensor electrodes sense an input.

55 Claims, 61 Drawing Sheets

(51) Int. Cl.
*H04R 3/00* (2006.01)
*H01L 27/32* (2006.01)
*H01L 51/52* (2006.01)
*G06F 3/041* (2006.01)
*G09G 3/3266* (2016.01)
*G09G 3/3233* (2016.01)
*G06V 40/13* (2022.01)

(52) U.S. Cl.
CPC ............ *G06F 2203/04105* (2013.01); *G06F 2203/04107* (2013.01); *G06V 40/1306* (2022.01); *G06V 40/1318* (2022.01); *G09G 3/3233* (2013.01); *G09G 3/3266* (2013.01); *H04R 2499/15* (2013.01)

(58) Field of Classification Search
CPC ............ H04R 2400/01; H04R 2440/01; H04R 2499/15; H04R 3/00; H04R 7/045
USPC .................. 345/156, 170–178, 690–696
See application file for complete search history.

(56) References Cited

U.S. PATENT DOCUMENTS

| | | | | |
|---|---|---|---|---|
| 2019/0028669 | A1* | 1/2019 | Shin | G02F 1/133308 |
| 2019/0122018 | A1* | 4/2019 | Kho | G06V 40/1306 |
| 2020/0245071 | A1* | 7/2020 | Won | H04R 7/045 |
| 2021/0048842 | A1* | 2/2021 | Choi | G10K 9/122 |
| 2021/0058691 | A1* | 2/2021 | Kim | H01L 27/3225 |
| 2021/0076135 | A1* | 3/2021 | Choi | H04R 1/028 |
| 2021/0120324 | A1* | 4/2021 | Seo | H04R 7/045 |
| 2021/0200265 | A1* | 7/2021 | Ko | G09F 9/301 |

FOREIGN PATENT DOCUMENTS

| | | |
|---|---|---|
| KR | 10-2019-0019802 | 2/2019 |
| KR | 10-2019-0025085 | 3/2019 |
| KR | 10-2019-0037866 | 4/2019 |
| KR | 10-1966227 | 4/2019 |
| KR | 10-2019-0056618 | 5/2019 |

* cited by examiner

SU1 : SU11, SU12, SU13, SU14

DISPLAY DEVICE

CROSS REFERENCE TO RELATED APPLICATION(S)

This application claims priority to and benefits of Korean Patent Application No. 10-2019-0129531 under 35 U.S.C. § 119 filed on Oct. 18, 2019, filed in the Korean Intellectual Property Office, the entire contents of which are incorporated herein by reference.

BACKGROUND

1. Technical Field

The disclosure relates to a display device.

2. Description of the Related Art

As the information-oriented society evolves, various demands for display devices are ever increasing. For example, display devices are being employed in a variety of electronic devices such as, for example, smart phones, digital cameras, laptop computers, navigation devices, and smart televisions.

The display device may include a display panel that may display an image and a sound generator that may emit sound. Recently, a sound generator that may be attached to a surface of a display panel and vibrate the display panel to generate sound is developed. Research is ongoing for further reducing the thickness and size of sound generators.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may provide a display device including sound units incorporated into a display panel.

Additional features of embodiments will be set forth in the description which follows, and in part may be apparent from the description, or may be learned by practice of the disclosure herein.

According to an embodiment, a display device may include a display panel that may include a display layer including light-emitting elements disposed on a substrate, and a sensor electrode layer disposed on the display layer. The sensor electrode layer may comprise a first sound electrode and a second sound electrode; a vibration layer electrically contacting the first sound electrode and the second sound electrode, wherein the vibration layer may be deformed in response to a first sound driving voltage applied to the first sound electrode and a second sound driving voltage applied to the second sound electrode; and sensor electrodes disposed on the vibration layer. The sensor electrodes may sense an input.

The first sound electrode and the second sound electrode may be disposed on a same layer.

The first sound electrode may comprise a first sound stem electrode extended in one direction; and first sound branch electrodes protruding from the first sound stem electrode in another direction. The second sound electrode may comprise a second sound stem electrode extended in the one direction; and second sound branch electrodes protruding from the second sound stem electrode in the another direction.

The first sound branch electrodes and the second sound branch electrodes may be arranged alternately in the one direction.

The first sound electrode may not overlap the second sound electrode in a thickness direction of the substrate.

The vibration layer may be disposed on the first sound electrode and the second sound electrode.

The sensor electrodes may comprise sensing electrodes arranged in a first direction; and driving electrodes arranged in a second direction. The sensor electrode layer may comprise a first connection electrode electrically connected with adjacent ones of the driving electrodes in the second direction.

The vibration layer may be disposed on the first connection electrode.

Each of the adjacent ones of the driving electrodes in the second direction may be electrically connected to the first connection electrode through a first contact hole penetrating the vibration layer.

The sensor electrode layer may further comprise a first sensor insulating layer disposed on the first connection electrode.

Each of the adjacent ones of the driving electrodes in the second direction may be electrically connected to the first connection electrode through a first contact hole penetrating the first sensor insulating layer.

The first sound electrode and the second sound electrode may be disposed on the vibration layer.

The sensor electrodes may be disposed on the first sound electrode and the second sound electrode.

The sensor electrodes may comprise sensing electrodes arranged in a first direction; and driving electrodes arranged in a second direction, and the sensor electrode layer may comprise a first connection electrode electrically connected with adjacent ones of the driving electrodes in the second direction.

The first connection electrode may be disposed on the vibration layer.

Each of the adjacent ones of the driving electrodes in the second direction may be electrically connected to the first connection electrode through a first contact hole penetrating the vibration layer.

The sensor electrode layer may further comprise a first sensor insulating layer disposed on the first connection electrode.

The driving electrodes and the sensing electrodes may be disposed on the first sensor insulating layer.

The first sound electrode may be disposed on the vibration layer, and the vibration layer may be disposed on the second sound electrode.

The first sound electrode may overlap the second sound electrode in a thickness direction of the substrate.

The sensor electrodes may comprise sensing electrodes arranged in a first direction; and driving electrodes arranged in a second direction, and the sensor electrode layer may comprise a first connection electrode electrically connected with adjacent ones of the driving electrodes in the second direction.

The vibration layer may be disposed on the first connection electrode.

The first connection electrode and the second sound electrode may be disposed on a same layer.

The sensor electrode layer may further comprise a first sensor insulating layer disposed on the first connection electrode.

Each of the adjacent ones of the driving electrodes in the second direction may be electrically connected to the first connection electrode through a first contact hole penetrating the first sensor insulating layer.

According to an embodiment, a display device may include a display panel that may comprise a display layer including light-emitting elements disposed on a surface of a substrate, and a sound electrode layer including sound units disposed on an opposite surface of the substrate. Each of the sound units may comprise a first sound electrode; a second sound electrode disposed on the first sound electrode; and a first vibration layer disposed between the first sound electrode and the second sound electrode. The first vibration layer may be deformed in response to a first sound driving voltage applied to the first sound electrode and a second sound driving voltage applied to the second sound electrode. First sound electrodes of the sound units arranged in a first direction among the sound units may be electrically connected to one another. Second sound electrodes of the sound units arranged in a second direction among the sound units may be electrically connected to one another.

The sound electrode layer may further comprise a first sound line disposed between the first sound electrodes of the sound units adjacent to each other in the first direction; and a second sound line disposed between the second sound electrodes of the sound units adjacent to each other in the second direction.

The sound electrode layer may further comprise a light-shielding layer disposed between the opposite surface of the substrate and the sound electrode layer.

The display panel may comprise a bottom panel cover disposed on the sound electrode layer, the bottom panel cover may comprise a buffer that absorbs an external shock applied to the display panel, and the buffer may not overlap the sound units in a thickness direction of the substrate.

The buffer may comprise through holes in which the sound units may be disposed.

The bottom panel cover may further comprise a heat dissipation member disposed on the buffer.

The sound electrode layer may comprise vibration units spaced apart from the sound units, and each of the vibration units may comprise a first vibration electrode; a second vibration electrode disposed on the first vibration electrode; and a second vibration layer disposed between the first vibration electrode and the second vibration electrode. The second vibration layer may be deformed in response to a first vibration driving voltage applied to the first vibration electrode and a second vibration driving voltage applied to the second vibration electrode.

The sound units may be adjacent to the vibration units.

Each of the sound units may comprise a first subsidiary sound unit disposed adjacent to a first side surface and a second side surface of the vibration units; a second subsidiary sound unit disposed adjacent to the first side surface and a third side surface of the vibration units; a third subsidiary sound unit disposed adjacent to the second side surface and a fourth side surface of the vibration units; and a fourth subsidiary sound unit disposed adjacent to the third side surface and the fourth side surface of the vibration units.

A first sound electrode of the first subsidiary sound unit may be electrically connected to a first sound electrode of the second subsidiary sound unit, a first sound electrode of the third subsidiary sound unit may be electrically connected to a first sound electrode of the fourth subsidiary sound unit, the first sound electrode of the first subsidiary sound unit may be spaced apart from the first sound electrode of the third subsidiary sound unit, and the first sound electrode of the second subsidiary sound unit may be spaced apart from the first sound electrode of the fourth subsidiary sound unit.

A second sound electrode of the first subsidiary sound unit may be electrically connected to a second sound electrode of the third subsidiary sound unit, a second sound electrode of the second subsidiary sound unit may be electrically connected to a second sound electrode of the fourth subsidiary sound unit, the second sound electrode of the first subsidiary sound unit may be spaced apart from the second sound electrode of the second subsidiary sound unit, and the second sound electrode of the third subsidiary sound unit may be spaced apart from the second sound electrode of the fourth subsidiary sound unit.

The sound electrode layer may comprise a first subsidiary sound connection line electrically connected to a first sound electrode of the first subsidiary sound unit and a first sound electrode of the second subsidiary sound unit; a second subsidiary sound connection line electrically connected to a first sound electrode of the third subsidiary sound unit and a first sound electrode of the fourth subsidiary sound unit; a third subsidiary sound connection line electrically connected to a second sound electrode of the first subsidiary sound unit and a second sound electrode of the third subsidiary sound unit; and a fourth subsidiary sound connection line electrically connected to a second sound electrode of the second subsidiary sound unit and a second sound electrode of the fourth subsidiary sound unit.

The sound electrode layer may further comprise a first vibration line electrically connected with the first sound electrodes of the vibration units adjacent to each other in the first direction; and a second vibration line electrically connected with the second sound electrodes of the vibration units adjacent to each other in the second direction.

The first vibration line may be disposed between the first subsidiary sound connection line and the second subsidiary sound connection line, and the second vibration line may be disposed between the third subsidiary sound connection line and the fourth subsidiary sound connection line.

The first vibration lines may be disposed between the first subsidiary sound unit and the third subsidiary sound unit and may be disposed between the second subsidiary sound unit and the fourth subsidiary sound unit, and the second vibration lines may be disposed between the first subsidiary sound unit and the second subsidiary sound unit and may be disposed between the third subsidiary sound unit and the fourth subsidiary sound unit.

The sound electrode layer may comprise a shielding unit spaced apart from the sound units, and the shielding unit may comprise a first shielding electrode; a second shielding electrode overlapping the first shielding electrode in a thickness direction of the substrate; and a third vibration layer disposed between the first shielding electrode and the second shielding electrode. The third vibration layer may be deformed in response to a first shielding driving voltage applied to the first shielding electrode and a second shielding driving voltage applied to the second shielding electrode.

The first sound driving voltage applied to the first sound electrode of the sound unit adjacent to the shielding unit may be equal to the second shielding driving voltage applied to the second shielding electrode of the shielding unit, and the second sound driving voltage applied to the second sound electrode of the sound unit adjacent to the shielding unit may be equal to the first shielding driving voltage applied to the first shielding electrode of the shielding unit.

The second shielding electrode may be electrically connected to at least one of the first sound electrodes, and the first shielding electrode may be electrically connected to at least one of the second sound electrodes.

The sound electrode layer may comprise force sensing units spaced apart from the sound units, and each of the force sensing units may comprise a force driving electrode; a force sensing electrode spaced apart from the force driving electrode; and a force sensing layer disposed on the force driving electrode and the force sensing electrode and having a resistance variable in response to a force applied to the force sensing layer.

The force driving electrode, the force sensing electrode, and the first sound electrode are made of a same material.

Each of the force sensing units may further comprise a bump disposed on the force sensing layer.

The bump and the second sound electrode may be made of a same material.

The sound electrode layer may comprise a fixed magnet disposed on the second sound electrode, and the bottom panel cover may further comprise a planar coil overlapping the fixed magnet in the thickness direction of the substrate and disposed on the buffer.

A current may flow through the planar coil to generate a magnetic field of the fixed magnet and a magnetic field of the planar coil, the current may flow from an end to another end of the planar coil to generate an attractive force between the fixed magnet and the planar coil, and the current may flow from the another end to the end of the planar coil to generate a repulsive force between the fixed magnet and the planar coil.

According to an embodiment, a display device may include a display panel that may comprise a substrate including an upper surface and a side surface extended from a side of the upper surface, a display layer including light-emitting elements disposed on a surface of the substrate in the upper surface and the side surface, and a sound electrode layer including a sound unit disposed on an opposite surface of the substrate; and a sensor unit disposed on the opposite surface of the substrate in the side surface. The sound unit may comprise a first sound electrode; a second sound electrode disposed on the first sound electrode; and a vibration layer disposed between the first sound electrode and the second sound electrode. The vibration layer may be deformed in response to a first sound driving voltage applied to the first sound electrode and a second sound driving voltage applied to the second sound electrode.

The sensor unit may be a fingerprint sensor unit that emits ultrasonic waves or light and detects ultrasonic waves or light reflected by a fingerprint.

The sensor unit may be a force sensing unit that may comprise a force driving electrode; a force sensing electrode spaced apart from the force driving electrode; and a force sensing layer disposed on the force driving electrode and the force sensing electrode and having a resistance variable in response to a force applied to the force sensing layer.

The sound electrode layer may comprise a second sound unit disposed on the opposite surface of the substrate in the side surface of the substrate.

According to an embodiment, the first sound electrodes, the second sound electrodes and a vibration layer may be formed or disposed on a sensor electrode layer for sensing a user's touch input in a display device. Accordingly, in addition to sensing a user's touch input using driving electrodes and sensing electrodes of the sensor electrode layer, sound may be output by vibrating the vibration layer by the first and second sound electrodes of the sensor electrode layer. Sound may be output by using the sound units incorporated into the display panel.

According to an embodiment, a sound electrode layer including first sound electrodes, second sound electrodes and a vibration layer may be disposed between the substrate of a display panel and a bottom panel cover in a display device. Therefore, sound may be output by vibrating the vibration layer by the first sound electrodes and the second sound electrodes of the sound electrode layer. Sound may be output by using the sound units incorporated into the display panel.

Other features and embodiments may be apparent from the following detailed description, the drawings, and the claims.

It is to be understood that both the foregoing description and the following detailed description are not to be construed as limiting of an embodiment as described or claimed herein.

BRIEF DESCRIPTION OF THE DRAWINGS

The accompanying drawings, which are included to provide a further understanding of the disclosure, illustrate embodiments wherein.

DETAILED DESCRIPTION OF THE EMBODIMENTS

Figure 1:
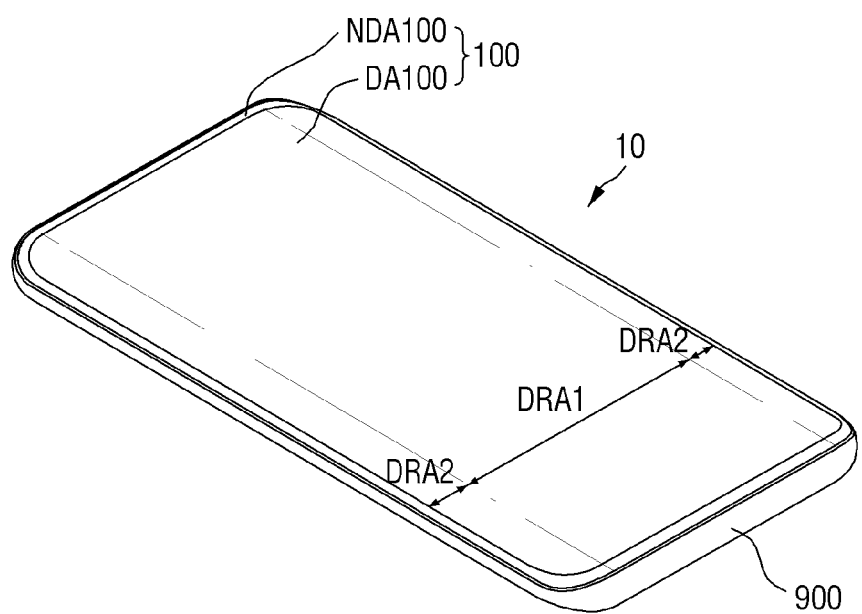
FIG. 1 is a perspective view of a display device according to an embodiment.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure and like reference numerals refer to like elements throughout the specification.

It will also be understood that when a layer, film, region, substrate, or area, or element is referred to as being "on" another layer, film, region, substrate, or area, or element, it can be directly on the other layer, film, region, substrate, or area, or element, or intervening layers, films, regions, substrates, or areas, or elements may also be present. In contrast, when a layer, film, region, substrate, or area, or element is referred to as being "directly on" another a layer, film, region, substrate, or area, or element, there may be no intervening layers, films, regions, substrates, or areas, or elements present.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "includes" and/or "including", "have" and/or "having" are used in this specification, they or it may specify the presence of stated features, integers, steps, operations, elements and/ or components, but do not preclude the presence or addition of other features, integers, steps, operations, elements, components, and/or any combination thereof.

Also, when an element is referred to as being "in contact" or "contacted" or the like to another element, the element may be in "electrical contact" or in "physical contact" with another element; or in "indirect contact" or in "direct contact" with another element.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

As used herein, the singular forms "a," "an" and "the" are intended to include the plural forms as well, unless the context clearly indicates otherwise.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

As used herein, the term "unit" or "module" denotes a structure or element as illustrated in the drawings and as described in the specification. However, the disclosure is not limited thereto. The term "unit" or "module" is not to be limited to that which is illustrated in the drawings In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
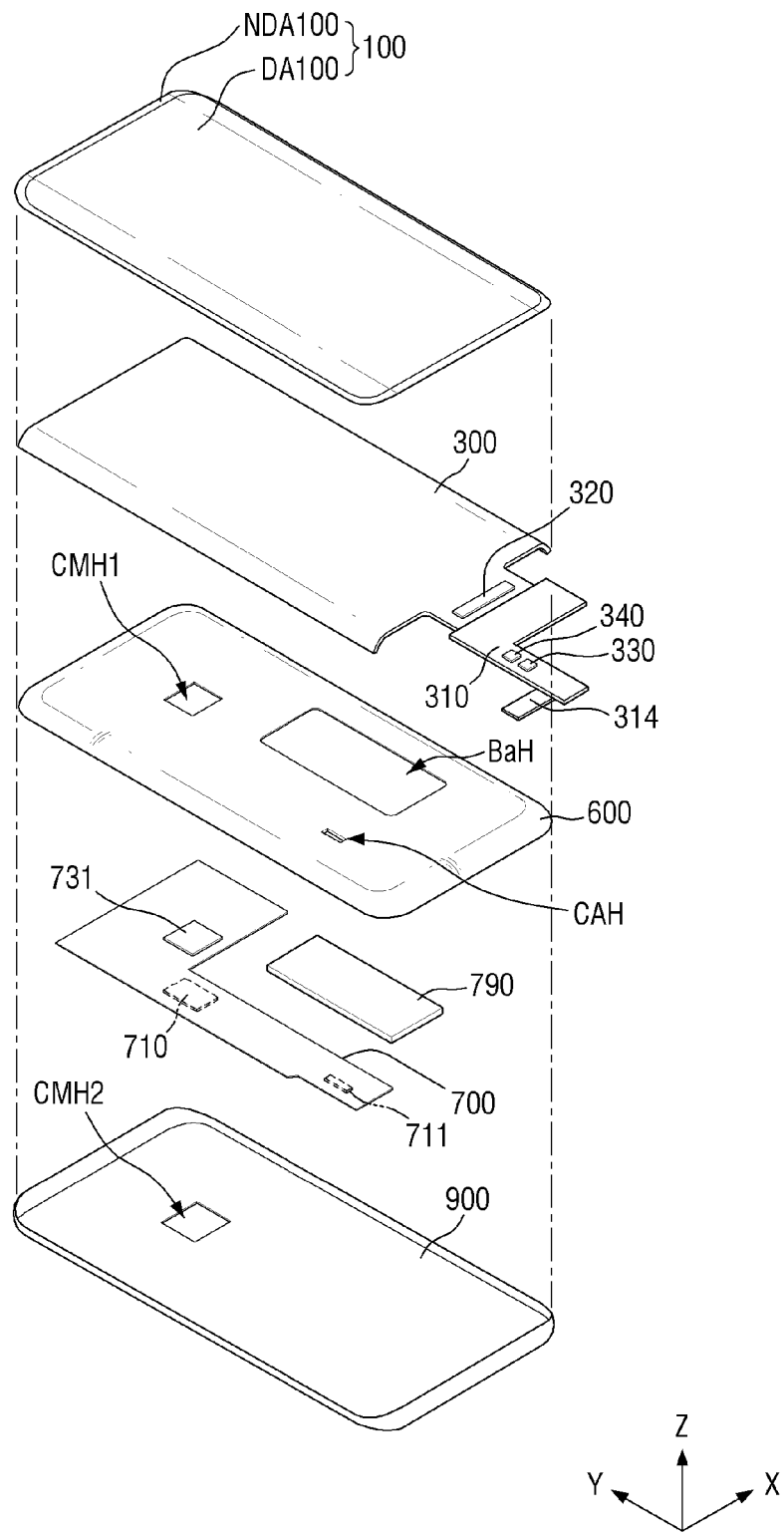
FIG. 2 is an exploded, perspective view of a display device according to an embodiment.

FIG. 1 is a perspective view of a display device according to an embodiment. FIG. 2 is an exploded, perspective view of a display device according to an embodiment.

Referring to FIGS. 1 to 2, a display device 10 according to an embodiment is for displaying moving images or still images. The display device 10 may be used as the display screen of portable electronic devices such as a mobile phone, a smart phone, a tablet PC, a mobile communications terminal, an electronic notebook, an electronic book, a portable multimedia player (PMP), a navigation device and a ultra mobile PC (UMPC), as well as the display screen of various products such as a television, a notebook, a monitor, a billboard and the Internet of Things. In addition, the display device 10 according to an embodiment may be applied to wearable devices such as a smart watch, a watch phone, an eyeglass display, and a head-mounted display (HMD) device. In addition, the display device 10 according to an embodiment may be used as a center information display (CID) disposed in the instrument of a vehicle and the center fascia or the dashboard of a vehicle, as a room mirror display on the behalf of the side mirrors of a vehicle (room mirror display), as a display placed on the back of the front seats for entertainment for the rear seats of a vehicle.

In the example shown in FIGS. 1 and 2, the display device 10 according to an embodiment is applied to a smart phone for convenience of illustration. The display device 10 according to an embodiment may include a cover window 100, a display panel 300, a display circuit board 310, a display driver 320, a sensor driver 330, a sound driver 340, a bracket 600, a main circuit board 700, a battery 790 and a bottom cover 900.

As used herein, the term "upper side" refers to the side of the display panel 300 in the z-axis direction where the cover window 100 is disposed, whereas the term "lower side" refers to the opposite side of the display panel 300 in the z-axis direction where the bracket 600 is disposed. As used herein, the terms "left," "right," "upper" and "lower" sides indicate relative positions in a case that the display panel 300 is viewed from the top. For example, the "left side" refers to the opposite direction indicated by the arrow of the x-axis, the "right side" refers to the direction indicated by the arrow of the x-axis, the "upper side" refers to the direction indicated by the arrow of the z-axis, and the "lower side" refers to the opposite direction indicated by the arrow of the z-axis.

The display device 10 may have a substantially rectangular shape in a case that the display device 10 is viewed from the top. For example, the display device 10 may have a substantially rectangular shape having shorter sides in a first direction (x-axis direction) and longer sides in a second direction (y-axis direction) in a case that the display device 10 is viewed from the top as shown in FIG. 1. Each of the corners where the short side in the first direction (x-axis direction) meets the longer side in the second direction (y-axis direction) may be rounded with a predetermined curvature or may be a right angle. The shape of the display device 10 in a case that the display device 10 is viewed from the top is not limited to a substantially rectangular shape, but may be formed in another substantially polygonal shape, circular shape, or elliptical shape.

The display device 10 may include a first area DRA1, and second areas DRA2 extended from the right and left sides of the first area DRA1, respectively. The first area DRA1 may be either flat or curved. The second areas DRA2 may be either flat or curved. In a case that both the first area DRA1 and the second areas DRA2 may be formed as curved surfaces, the curvature of the first area DRA1 may be different from the curvature of the second areas DRA2. In a case that the first area DRA1 is formed as a curved surface, it may have a constant curvature or a varying curvature. In a case that the second areas DRA2 may be formed as curved surfaces, they may have a constant curvature or a varying curvature. In a case that both the first area DRA1 and the second areas DRA2 may be formed as flat surfaces, the angle between the first area DRA1 and the second areas DRA2 may be an obtuse angle.

Although the second areas DRA2 may be extended from the left and right sides of the first area DRA1, respectively, in FIG. 1, this is merely illustrative. The second area DRA2 may be extended from only one of the right and left sides of the first area DRA1. Alternatively, the second area DR2 may be extended from at least one of upper and lower sides of the first area DR1, as well as the left and right sides. Alternatively, the second areas DRA2 may be eliminated, and the display device 10 may include only the first area DRA1.

The cover window 100 may be disposed on the display panel 300 to cover or overlap the upper surface of the display panel 300. Thus, the cover window 100 may protect the upper surface of the display panel 300.

The cover window 100 may include a transmissive portion DA100 corresponding to the display panel 300 and a non-transmissive portion NDA100 corresponding to the other area than the display panel 300. The cover window 100 may be disposed in the first region DR1 and the second regions DR2. The transmissive portion DA100 may be disposed in a part of the first region DR1 and a part of each of the second regions DR2. The non-transmissive portion NDA100 may include an opaque material that blocks light. The non-transmissive portion NDA100 may include a pattern that may be perceived by a user in a case that no image is displayed.

The display panel 300 may be disposed under or below the cover window 100. The display panel 300 may be disposed such that it overlaps with the transmissive portion DA100 of the cover window 100. The display panel 300 may be disposed in the first area DR1 and the second areas DR2. A user may see images from the display panel 300 in the first area DR1 as well as the second areas DR2.

The display panel 300 may be a light-emitting display panel including light-emitting elements. For example, the display panel 300 may be an organic light-emitting display panel using organic light-emitting diodes including organic emissive layer, a micro light-emitting diode display panel using micro LEDs, a quantum-dot light-emitting display panel including quantum-dot light-emitting diodes including an quantum-dot emissive layer, or an inorganic light-emitting display panel using inorganic light-emitting elements including an inorganic semiconductor.

The display panel 300 may be a rigid display panel and thus may not be easily bent, or a flexible display panel that may be flexible and thus may be easily bent, folded or rolled. For example, the display panel 300 may be a foldable display panel that may be folded and unfolded, a curved display panel having a curved display surface, a bended display panel having a bent area other than the display surface, a rollable display panel that may be rolled and unrolled, and a stretchable display panel that may be stretched.

The display panel 300 may be implemented as a transparent display panel to allow a user to see an object or a background under or below the display panel from above the display panel 300 through it. Alternatively, the display panel 300 may be implemented as a reflective display panel that may reflect an object or a background on the upper surface of the display panel 300.

Figure 4:
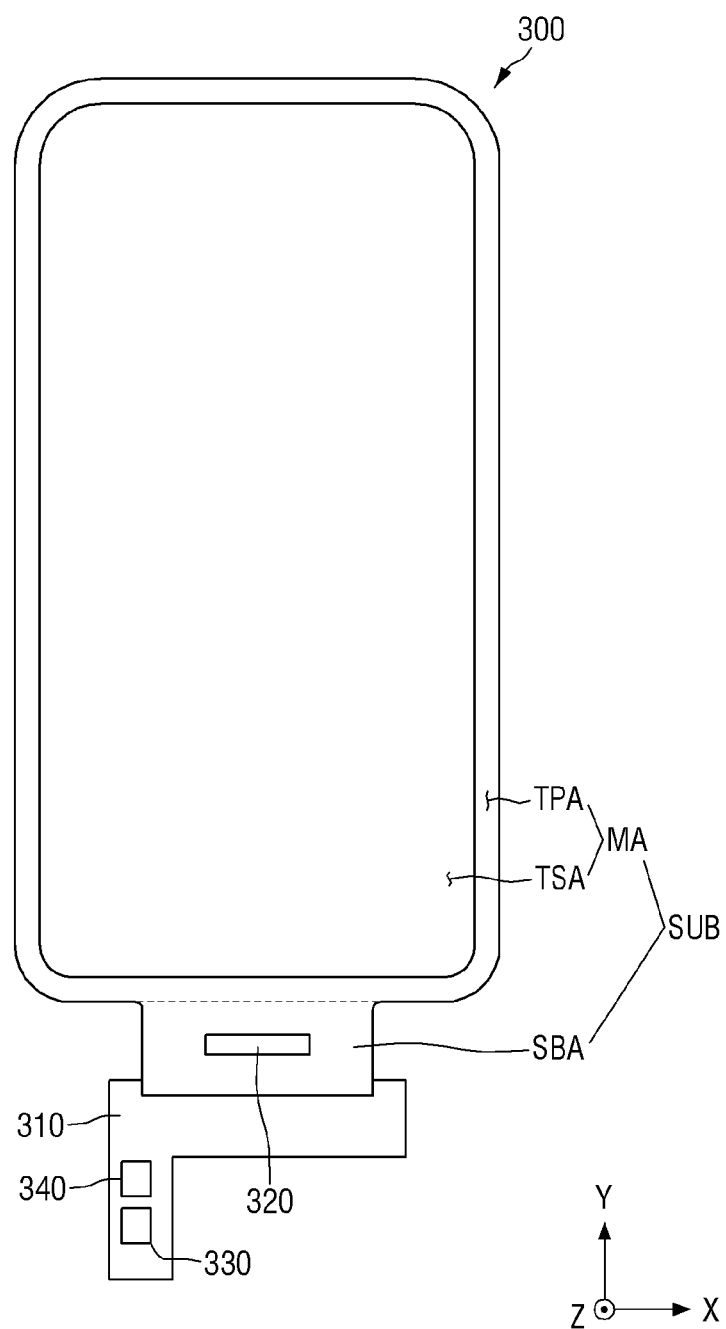
FIG. 4 is a plan view showing a display panel according to an embodiment.

As shown in FIG. 4, the display panel 300 may include a main area MA where images may be displayed, and a subsidiary area SBA protruding from one side of the main area MA.

The display circuit board 310 may be attached in the subsidiary area SBA of the display panel 300. The display circuit board 310 may be attached in the subsidiary area SBA of the display panel 300 using an anisotropic conductive film. The display circuit board 310 may be a flexible printed circuit board (FPCB) that may be bent, a rigid printed circuit board (PCB) that may be rigid and not bendable, or a hybrid printed circuit board including a rigid printed circuit board and a flexible printed circuit board.

The display driver 320 may be disposed on the subsidiary area SBA of the display panel 300. The display driver 320 may receive control signals and supply voltages and may generate and output signals and voltages for driving the display panel 300. The display driver 320 may be implemented as an integrated circuit (IC).

The sensor driver 330 and the sound driver 340 may be disposed on the display circuit board 310. Each of the sensor driver 330 and the sound driver 340 may be implemented as an integrated circuit. Alternatively, the sensor driver 330 and the sound driver 340 may be implemented as one integrated circuit. The sensor driver 330 and the sound driver 340 may be attached on the display circuit board 310.

The sensor driver 330 may be electrically connected to sensor electrodes of a sensor electrode layer of the display panel 300 through the display circuit board 310, and thus it may output touch driving signals to the sensor electrodes and may sense the voltage charged in the mutual capacitance. The sound driver 340 may be electrically connected to sound electrodes of a sensor electrode layer of the display panel 300 through the display circuit board 310, and thus it may output sound driving voltages to the sound electrodes.

The sensor electrode layer of the display panel 300 may sense a user's touch input using at least one of a variety of touch sensing schemes such as resistive sensing and capacitive sensing. For example, in a case that a user's touch input is sensed by using the sensor electrode layer of the display panel 300 by the capacitive sensing, the sensor driver 330 applies driving signals to the driving electrodes among the sensor electrodes, and senses the voltages charged in the mutual capacitance between the driving electrodes and the sensing electrodes through the sensing electrodes among the sensor electrodes, thereby determining whether there is a user's touch. User's touches may include a physical contact and a near proximity. A user's physical contact refers to that an object such as the user's finger or a pen is brought into contact with the cover window 100 disposed on the sensor electrode layer. A near proximity refers to that an object such as the user's finger or a pen is close to but is spaced apart from the cover window 100, such as hovering over it. The sensor driver 330 may transmit detection data to the main processor 710 based on the sensed voltages, and the main processor 710 may analyze the detection data to calculate the coordinates of the position where the touch input is made.

On the display circuit board 310, a power supply for supplying driving voltages for driving the pixels PX, the scan driver and the display drive 320 of the display panel 300 may be disposed. Alternatively, the power supply may be integrated with the display drive 320, in which case, the display driver 320 and the power supply may be implemented as a single integrated circuit.

The bracket 600 for supporting the display panel 300 may be disposed under or below the display panel 300. The bracket 600 may include plastic, metal, or both plastic and metal. In the bracket 600, a first camera hole CMH1 in which a camera device 731 may be inserted, a battery hole BH in which the battery 790 may be disposed, a cable hole CAH through which a cable 314 connected to the display circuit board 310 may pass, for example.

The main circuit board 700 and the battery 790 may be disposed under or below the bracket 600. The main circuit board 700 may be either a printed circuit board or a flexible printed circuit board.

The main circuit board 700 may include a main processor 710, a camera device 731, and a main connector 711. The maintain processor 710 may be implemented as an integrated circuit. The camera device 731 may be disposed on both the upper and lower surfaces of the main circuit board 700, and the main processor 710 and the main connector 711 may be disposed on one of the upper and lower surfaces of the main circuit board 700.

The main processor 710 may control all the functions of the display device 10. For example, the main processor 710 may output digital video data to the display driver 320 through the display circuit board 310 so that the display panel 300 displays images. In addition, the main processor 710 receives detection data from the sensor driver 330. The main processor 710 may determine whether there is a user's touch based on the detection data, and may execute an operation associated with the user's physical contact or near proximity if so. For example, the main processor 710 may calculate the coordinates of the user's touch by analyzing the detection data, and then may run an application indicated by an icon touched by the user or perform the operation. The main processor 710 may be an application processor, a central processing unit, or a system chip implemented as an integrated circuit.

The camera device 731 processes image frames such as still image and video obtained by the image sensor in the camera mode and outputs them to the main processor 710. The camera device 731 may include at least one of a camera sensor (for example, CCD, CMOS, etc. within the spirit and the scope of the disclosure), a photo sensor (or an image sensor), and a laser sensor.

The cable 314 passing through the cable hole CAH of the bracket 600 may be connected to the main connector 711, and thus the main circuit board 700 may be electrically connected to the display circuit board 310.

Figure 3:
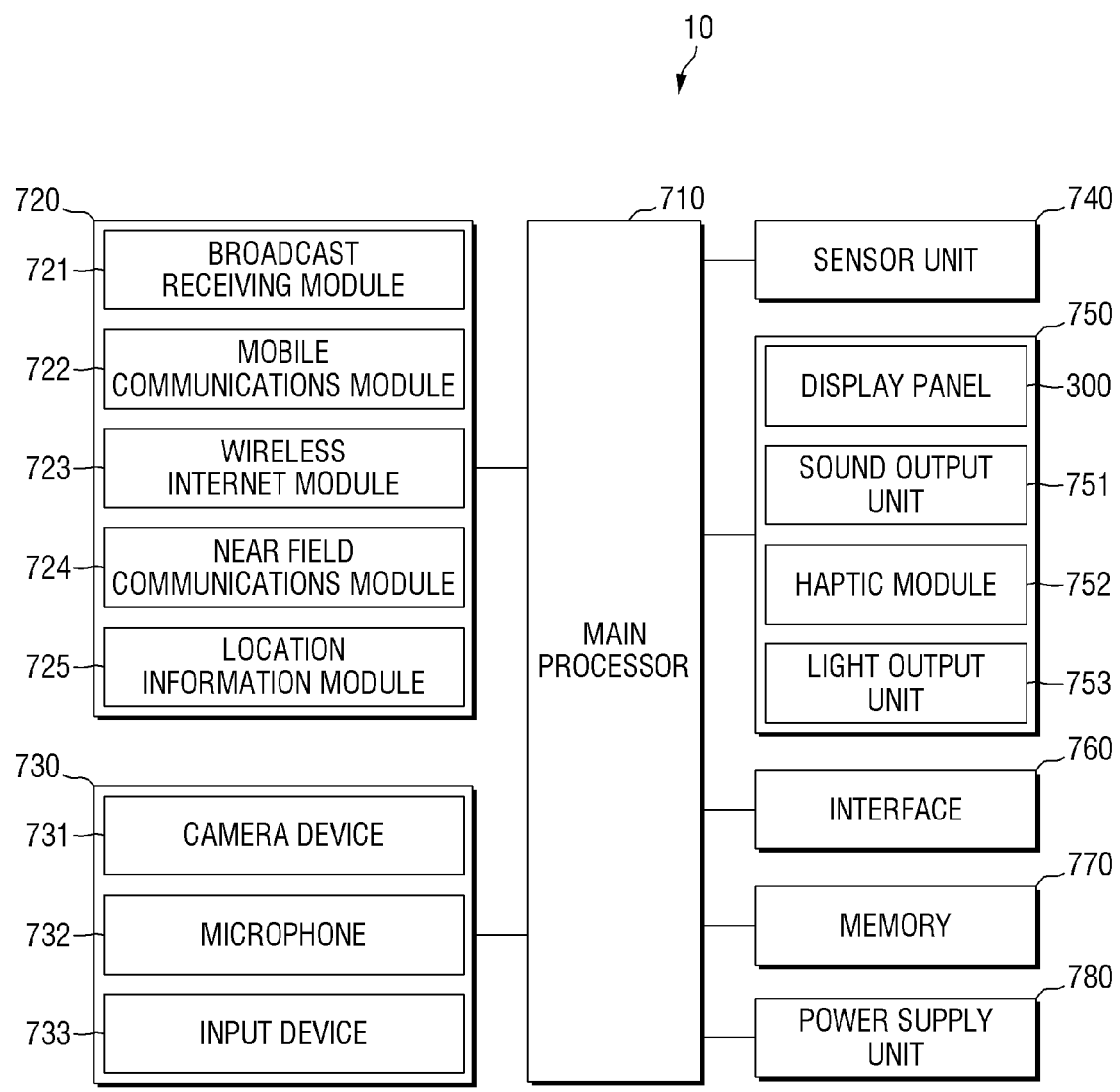
FIG. 3 is a block diagram showing a display device according to an embodiment.

In addition to the main processor 740, the camera device 731 and the main connector 711, the main circuit board 700 may include a wireless communications unit 720, at least one input unit 730, at least one sensor unit 740, at least one output unit 750, at least one interface unit 760, a memory 770, and a power supply unit 780, shown in FIG. 3.

For example, the wireless communications unit 720 may include at least one of a broadcasting receiving module 721, a mobile communications module 722, a wireless Internet module 723, a near-field communications module 724, and a location information module 725.

The broadcast receiving module 721 receives a broadcast signal and/or broadcast related information from an external broadcast managing server through a broadcast channel. The broadcasting channel may include a satellite channel and a terrestrial channel.

The mobile communications module 722 may transmit/receive wireless signals to/from at least one of a base station, an external terminal and a server in a mobile communications network established according to technical standards or communications schemes for mobile communications (for example, global system for mobile communications (GSM), code division multi access (CDMA), code division multi access 2000 (CDMA2000), enhanced voice-data optimized or enhanced voice-data only (EV-DO), wideband CDMA (WCDMA), high speed downlink packet access (HSDPA), high speed uplink packet access (HSUPA), long term evolution (LTE), long term evolution-advanced (LTE-A), within the spirit and the scope of the disclosure.). The wireless signals may include a voice call signal, a video call signal, or a variety of types of data depending on transmission and reception of a text/multimedia message.

The wireless Internet module 723 refers to a module for wireless Internet connection. The wireless Internet module 723 may transmit and receive wireless signals in a communications network according to wireless Internet technologies. Examples of wireless Internet technologies include wireless LAN (WLAN), wireless-fidelity (Wi-Fi), wireless fidelity (Wi-Fi) Direct, digital living network alliance (DLNA), within the spirit and the scope of the disclosure.

The near-field communications module 724 is for near field communications, and may support near field communications by using at least one of: Bluetooth™, radio frequency identification (RFID), infrared data association (IrDA), ultra wideband (UWB), ZigBee, near-field communications (NFC), Wi-Fi, Wi-Fi Direct and wireless universal serial bus (Wireless USB). The near-field communications module 724 may support wireless communications between the display device 10 and a wireless communications system, between the display device 10 and another electronic device, or between the display device 10 and a network where another electronic device (or an external server) may be located or disposed over wireless area networks. The wireless area network may be a wireless personal area network. Another electronic device may be a wearable device that may exchange (or interworking) data with the display device 10.

The location information module 725 is a module for acquiring the location (or current location) of the display device 10. Examples of the location information module 725 include a global positioning system (GPS) module or a wireless fidelity (Wi-Fi) module. For example, the display device 10 utilizing a GPS module may acquire its location 10 by using signals transmitted from GPS satellites. By utilizing a Wi-Fi module, the display device 10 may acquire its location based on the information of wireless access points (APs) that transmit/receive wireless signals to/from the Wi-Fi module. The location information module 725 refers to any module that may be used to acquire the location (or current location) of the display device 10 and is not limited to a module that calculates or acquires the location of the display device 10 by itself.

The input unit 730 may include an image input unit for inputting an image signal, such as a camera device 731, an audio input unit for inputting an audio signal, such as a microphone 732, and an input device 733 for receiving information from a user.

The camera device 731 processes an image frame such as a still image or a moving image obtained by an image sensor in a video call mode or a recording mode. The processed image frames may be displayed on the display panel 300 or stored in the memory 770.

The microphone 732 processes external sound signals into electrical voice data. The processed voice data may be utilized in a variety of ways depending on a function or an application being executed on the display device 10. In the microphone 732, a variety of algorithms for removing different noises generated during a process of receiving an external sound signal may be implemented.

The main processor 710 may control the operation of the display device 10 in response to the information input through the input device 733. The input device 733 may include a mechanical input means or a touch input means such as a button, a dome switch, a jog wheel, a jog switch, for example, positioned on the rear or side surface of the display device 10. The touch input means may be implemented with the sensor electrode layer of the display panel 300.

The sensor unit 740 may include one or more sensors that may sense at least one of information in the display device 10, the environment information surrounding the display device 10, and user information, and generate a sensing signal associated with it. The main processor 710 may control driving or operation of the display device 10 or may perform data processing, function, or operation associated with an application installed on the display device 10 based on the sensing signal. The sensor unit 740 may include at least one of: a proximity sensor, an illumination sensor, an acceleration sensor, a magnetic sensor, a gravity sensor (G-sensor), a gyroscope sensor, a motion sensor, a RGB sensor, an infrared sensors (IR sensor), a finger scan sensor, an ultrasonic sensor, an optical sensor, a battery gauge, an environmental sensor (for example, a barometer, a hygrometer, a thermometer, a radiation sensor, a heat sensor, a gas sensor, within the spirit and the scope of the disclosure), and a chemical sensor (for example, an electronic nose, a healthcare sensor, a biometric sensor, within the spirit and the scope of the disclosure).

The proximity sensor may refer to a sensor that may detect the presence of an object approaching a predetermined detection surface or a nearby object by using an electromagnetic force, an infrared ray, for example, without using a mechanical contact. Examples of the proximity sensor include a transmissive photoelectric sensor, a direct reflective photoelectric sensor, a mirror reflective photoelectric sensor, a high-frequency oscillation proximity sensor, a capacitive proximity sensor, a magnetic proximity sensor, an infrared proximity sensor, for example. The proximity sensor may detect not only a proximity touch but also a proximity touch pattern such as a proximity touch distance, a proximity touch direction, a proximity touch speed, a proximity touch time, a proximity touch position, and a proximity touch moving state. The main processor 710 may process data (or information) corresponding to the proximity touch operation and the proximity touch pattern detected by the proximity sensor, and may control the display panel 300 so that it displays visual information corresponding to the processed data. The ultrasonic sensor may recognize location information of an object using ultrasonic waves. The main processor 710 may calculate the location of an object based on information detected from the optical sensor and the ultrasonic sensors. Because the speed of the light is different from the speed of the ultrasonic waves, the position of the object may be calculated using the time taken for the light to reach the optical sensor and the time taken for the ultrasonic wave to reach the ultrasonic sensor.

The output unit 750 is for generating outputs associated with visual, auditory, tactile effects, and the like, may include at least one of the display panel 300, the sound output unit 751, the haptic module 752 and the light output unit 753.

The display panel 300 displays (outputs) information processed by the display device 10. For example, the display panel 300 may display information on an application run on the screen of the display device 10, or user interface (UI) or graphic user interface (GUI) information according to the execution screen information. The display panel 300 may include a display layer for displaying images and a sensor electrode layer for sensing a user's touch input. As a result, the display panel 300 may work as one of the input devices 733 providing an input interface between the display device 10 and the user, and also work as one of the output units 750 for providing an output interface between the display device 10 and the user.

The sound output unit 751 may output source data received from the wireless communications unit 720 or stored in the memory 770 in a call signal reception mode, a talking or recording mode, a voice recognition mode, a broadcast reception mode or the like within the spirit and the scope of the disclosure. The sound output unit 751 may also output a sound signal associated with a function performed in the display device 10 (for example, a call signal reception sound, a message reception sound, etc. within the spirit and the scope of the disclosure) The sound output unit 751 may include a receiver and a speaker. At least one of the receiver and the speaker may be a sound generator that may be incorporated into the display panel 300 and may output sound using a vibration layer which vibrates by the inverse piezoelectric effect, i.e., contracts and expands according to an electrical signal.

The haptic module 752 may generate a variety of tactile effects sensed by a user. The haptic module 752 may provide a user with vibration as the tactile effect. The intensity and pattern of the vibration generated by the haptic module 752 may be controlled by user selection or setting of the main processor 710. For example, the haptic module 752 may output different vibrations by synthesizing them or sequentially. In addition to the vibration, the haptic module 752 may generate various types of tactile effects, such as stimulus effects by a pin arrangement vertically moving on a skin, a spraying or suction force through a spraying or suction hole, a graze on a skin, contact of an electrode, and an electrostatic force, or effects of cold or hot feeling reproduced by using a device that may absorb or may generate heat. The haptic module 752 may not only transmit a tactile effect through direct contact, but also may allow a user to feel the tactile effect through a muscle sense such as a finger or an arm.

The light output unit 753 outputs a signal for notifying occurrence of an event by using light of a light source. Examples of the events occurring in the display device 10 may include message reception, call signal reception, missed call, alarm, schedule notification, email reception, information reception through an application, within the spirit and the scope of the disclosure. The signal output from the light output unit 753 is produced as the display device 10 emits light of a single color or multiple colors through the front or the rear surface. The signal output may be terminated once the display device 10 detects that the user has checked the event.

The interface 760 serves as a path to various types of external devices electrically connected to the display device 10. The interface 150 may include at least one of a wired/wireless headset port, an external charger port, a wired/wireless data port, a memory card port, a port for electrically connecting to a device including an identity module, an audio input/output (I/O) port, a video I/O port and an earphone port. In a case that an external device is electrically connected to the interface 760 of the display device 10, appropriate control associated with the connected external device may be carried out.

The memory 770 stores data supporting various functions of the display device 10. The memory 770 may store application programs that may be run on the display device 10, and data items and instructions for operating the display device 10. At least some or a predetermined number of the application programs may be downloaded from an external server via wireless communications. The memory 770 may store an application program that may operate the main processor 710, and may temporally store input/output data, for example, a phone book, a message, a still image, a moving picture, for example therein. The memory 770 may store haptic data for vibration in different patterns provided to the haptic module 752 and acoustic data regarding various sounds provided to the sound output unit 751. The memory 770 may include at least one of a flash memory type storage medium, a hard disk type storage medium, a solid state disk (SSD) type storage medium, a silicon disk drive (SDD) type storage medium, a multimedia card micro type storage medium, a card type memory (for example, an SD or XD memory), a random access memory (RAM), a static random access memory (SRMA), a read-only memory (ROM), an electrically erasable programmable read-only memory (EEPROM), a programmable read-only memory (PROM), a magnetic memory, a magnetic disk, and an optical disk.

The power supply unit 780 may receive a power from an external power source and an internal power source to supply the power to each of elements included in the display device 10 under the control of the main processor 710. The power supply unit 780 may include the battery 790. The power supply unit 780 may include a connection port. The connection port may be an example of the interface 760 to which the external charger for supplying power for charging the battery may be electrically connected. Alternatively, the power supply unit 780 may charge the battery 790 in a wireless manner without using the connection port. The battery 790 may receive power from an external wireless power transmitter using at least one of inductive coupling based on the magnetic induction phenomenon or magnetic resonance coupling based on the electromagnetic resonance phenomenon. The battery 790 may be disposed so that it does not overlap the main circuit board 700 in the third direction (z-axis direction). The battery 790 may overlap the battery hole BH of the bracket 600.

The bottom cover 900 may be disposed under or below the main circuit board 700 and the battery 790. The bottom cover 900 may be fastened and fixed to the bracket 600. The bottom cover 900 may form the exterior of the lower surface of the display device 10. The bottom cover 900 may include plastic, metal or plastic and metal.

A second camera hole CMH2 may be formed or disposed in the bottom cover 900 via which the lower surface of the camera device 731 is exposed. The positions of the camera device 731 and the first and second camera holes CMH1 and CMH2 in line with the camera device 731 are not limited to those of an embodiment shown in FIGS. 1 and 2.

Figure 5:
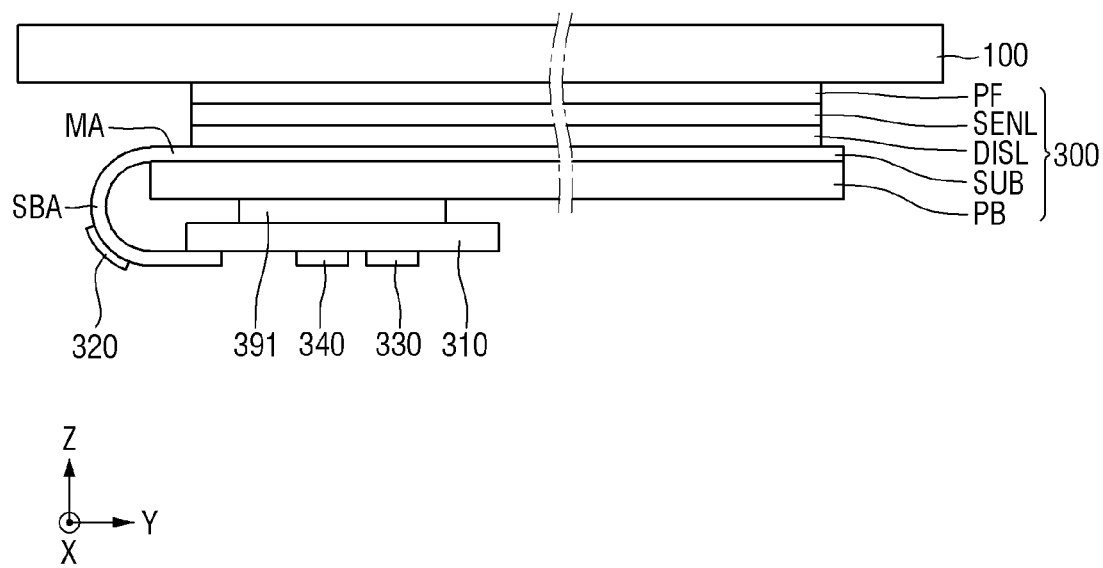
FIG. 5 is a side view showing an example of the display panel of FIG. 4.

FIG. 4 is a plan view showing a display panel according to an embodiment. FIG. 5 is a side view showing an example of the display panel of FIG. 4. FIG. 4 shows a plan view of the display panel 300 with the subsidiary area SBA of the display panel 300 unfolded. FIG. 5 shows a side view of the display panel 300 with the subsidiary area SBA bent and disposed on the lower surface of the display panel 300.

Referring to FIGS. 4 and 5, the display panel 300 may include a substrate SUB, a display layer DISL, a sensor electrode layer SENL, a polarizing film PF, and a bottom panel cover PB.

The substrate SUB may be made of an insulating material such as glass, quartz and a polymer resin. The substrate SUB may be a rigid substrate or a flexible substrate that may be bent, folded, rolled, and so on.

The substrate SUB may include the main area MA and the subsidiary area SBA. The main area MA may include a sensor area TSA where sensor electrodes of the sensor electrode layer SENL may be disposed, and a sensor peripheral area TPA which is a peripheral area of the sensor area TSA.

The subsidiary area SBA may protrude from one side of the main area MA in the second direction (y-axis direction). As shown in FIG. 4, the length of the subsidiary area SBA in the first direction (x-axis direction) may be smaller than the length of the main area MA in the first direction (x-axis direction). The length of the subsidiary area SBA in the second direction (y-axis direction) may be smaller than the length of the main area MA in the second direction (y-axis direction). It is, however, to be understood that the disclosure is not limited thereto. The subsidiary area SBA may be bent and disposed on the lower surface of the substrate SUB. The subsidiary area SBA may overlap the main area MA in the thickness direction (z-axis direction) of the substrate SUB. The display circuit board 310 and the display driver 320 may be disposed in the subsidiary area SBA.

The display layer DISL may be disposed on the main area MA of the substrate SUB. The display layer DISL may include pixels and display images. The display layer DISL may include a thin-film transistor layer on which thin-film transistors may be formed or disposed, an emission layer on which light-emitting elements emitting light may be formed, and an encapsulation layer that may encapsulate the emission layer.

Figure 6:
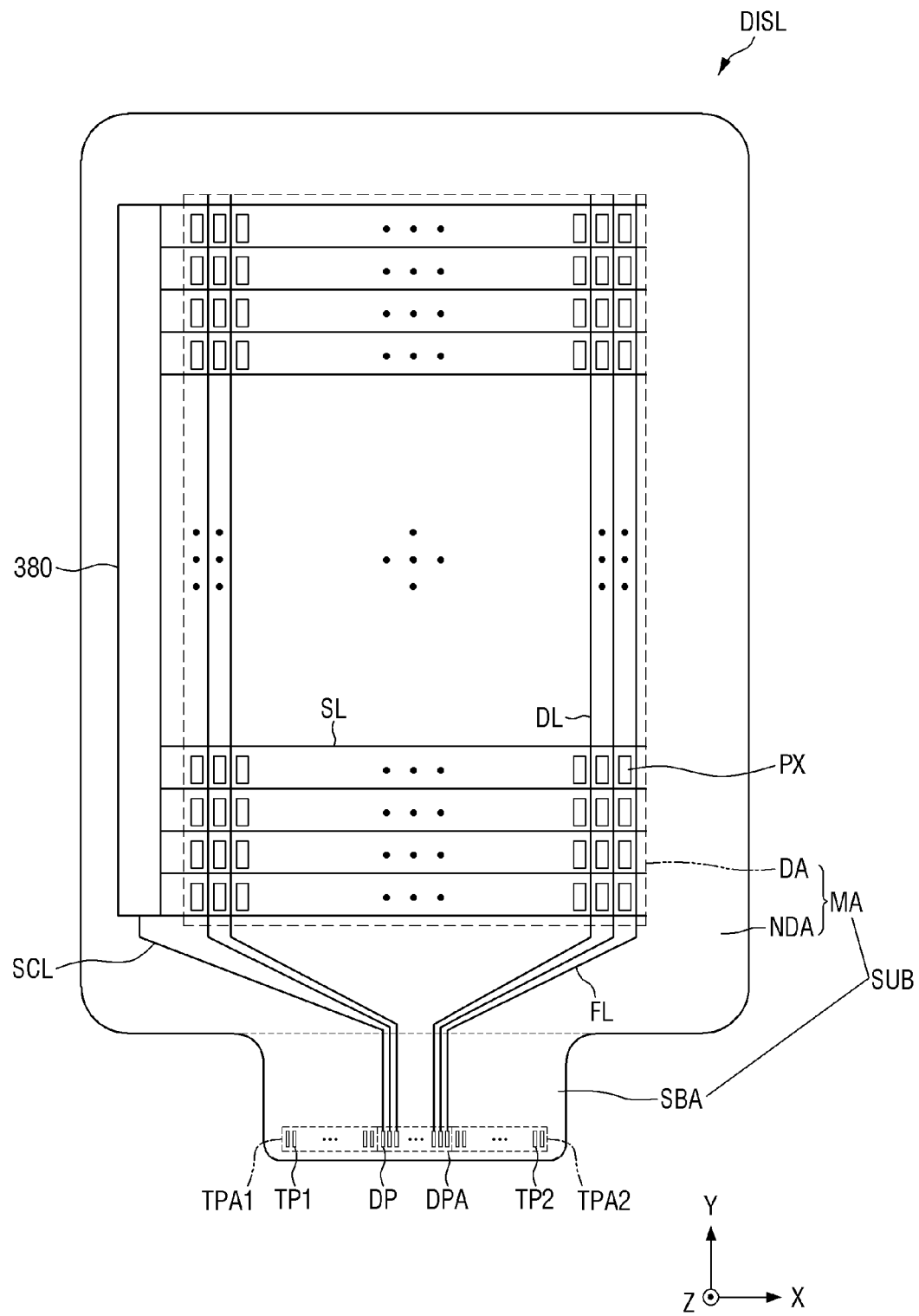
FIG. 6 is a view showing a layout of a display layer of a display panel according to an embodiment.

As shown in FIG. 6, the display layer DISL may be divided into a display area DA and a non-display area NDA. In the display area DA, pixels may be disposed to display images. In the non-display area NDA, no image is displayed. The non-display area NDA may surround or be adjacent to the display area DA. The non-display area NDA may be defined as the area from the outer side of the display area DA to the edge of the display panel 300. In addition to the pixels, scan lines, data lines, power lines, for example, electrically connected to the pixels may be disposed in the display area DA. In the non-display area NDA, the scan driver that may apply scan signals to scan lines, fan-out lines electrically connecting the data lines with the display driver 320, for example, may be disposed.

The sensor electrode layer SENL may be disposed on the display layer DISL. The sensor electrode layer SENL may include sensor electrodes and may sense whether there is a user's touch. The sensor electrode layer SENL may include a first layer in which connection electrodes electrically connecting the driving electrodes among the sensor electrodes may be formed or disposed, and a second layer in which the sensor electrodes may be formed or disposed.

The sensor electrode layer SENL may include a sensor area TSA and a sensor peripheral area TPA. In the sensor area TSA, sensor electrodes may be disposed to sense a user's touch input. In the sensor peripheral area TPA, no sensor electrodes may be disposed. The sensor peripheral area TPA may surround or be adjacent to the sensor area TSA. The sensor peripheral area TPA may be defined as the area from the outer side of the sensor area TSA to the edge of the display panel 300. The sensor electrodes, the connection electrodes, and conductive patterns may be disposed in the sensor area TSA. Sensor lines electrically connected to the sensor electrodes may be disposed in the sensor peripheral area TPA.

The sensor area TSA of the sensor electrode layer SENL may overlap the display area DA of the display layer DISL. The sensor peripheral area TPA of the sensor electrode layer SENL may overlap the non-display area NDA of the display layer DISL.

The polarizing film PF may be disposed on the sensor electrode layer SENL. The polarizing film may include a linear polarizer and a retardation film such as a λ/4 (quarter-wave) plate. The phase retardation film may be disposed on the sensor electrode layer SENL, and the linear polarizer may be disposed on the phase retardation film.

The cover window 100 may be disposed on the polarizing film PF. The cover window 100 may be attached onto the polarizing film PF by a transparent adhesive member such as an optically clear adhesive (OCA) film.

A bottom panel cover PB may be disposed under or below the display panel 300. The bottom panel cover PB may be attached to the lower surface of the display panel 300 by an adhesive member. The adhesive member may be a pressure-sensitive adhesive (PSA). The bottom panel cover PB may include at least one of: a light-blocking member for absorbing light incident from outside, a buffer for absorbing external impact, and a heat dissipating member for efficiently discharging heat from the display panel 300.

An adhesion member 391 is disposed between the display circuit board 310 and the bottom panel cover PB. The display circuit board 310 may be attached to the bottom panel cover PB using the adhesion member 391. The adhesion member 391 may be a pressure sensitive adhesive, but is not limited thereto.

The light-blocking member may be disposed under or below the display panel 300. The light-blocking member may block the transmission of light to prevent the elements disposed thereunder from being seen from above the display panel 300, such as the display circuit board 310. The light-blocking member may include a light-absorbing material such as a black pigment and a black dye.

The buffer may be disposed under or below the light-blocking member. The buffer absorbs an external impact to prevent the display panel 300 from being damaged. The buffer may be made up of a single layer or multiple layers. For example, the buffer may be formed of a polymer resin such as polyurethane, polycarbonate, polypropylene and polyethylene, or may be formed of a material having elasticity such as a rubber and a sponge obtained by foaming a urethane-based material or an acrylic-based material.

The heat dissipating member may be disposed under or below the buffer. The heat-dissipating member may include a first heat dissipation layer including graphite or carbon nanotubes, and a second heat dissipation layer formed of a thin metal film such as copper, nickel, ferrite and silver, which may block electromagnetic waves and have high thermal conductivity.

FIG. 6 is a view showing a layout of a display layer of a display panel according to an embodiment.

Referring to FIG. 6, the display layer DISL may include a display area DA including sub-pixels PX, and a non-display area NDA including no sub-pixels PX. The sub-pixels PX, the scan lines SL and the data lines DL may be disposed in the display area DA. The scan lines SL may be arranged or disposed in the first direction (x-axis direction), while the data lines DL may be arranged or disposed in the second direction (y-axis direction) intersecting the first direction (x-axis direction). The scan lines SL may be electrically connected to the scan driver 380 in the non-display area NDA. The data lines DL may be electrically connected to display pads DP through fan-out lines FL in the non-display area NDA.

Each of the sub-pixels PX may be electrically connected to at least one of the scan lines SL and at least one of the data lines DL. Each of the sub-pixels PX may include thin-film transistors including a driving transistor and at least one switching transistor, a light-emitting element, and a capacitor. In a case that a scan signal is applied from a scan line SL, each of the sub-pixels PX receives a data voltage of a data line DL and supplies a driving current to the light-emitting element according to the data voltage applied to the gate electrode of the driving transistor, so that light may be emitted.

The non-display area NDA may be the remaining area of the display layer DISL except the display area DA. In the non-display area NDA, the scan driver 380 for applying scan signals to the scan lines SL, scan control lines SCL, fan-out lines FL for electrically connecting the data lines DL with the display pad DP, and sensing pads TP1 and TP2 electrically connected to the sensing lines may be disposed.

The scan driver 380 may be electrically connected to the display pads DP through scan control lines SCL, and accordingly may receive a scan control signal from the display driver 320 disposed on the display circuit board 310. The scan driver 380 generates scan signals according to a scan control signal and supplies the scan signals to the scan lines SL. The sub-pixels PX to which the data voltages may be supplied may be selected by the scan signals of the scan driver 380 and the data voltages may be supplied to the selected sub-pixels PX. Although the scan driver 380 may be formed or disposed in the non-display area NDA on one outer side, for example, the left outer side of the display area DA in the drawing, the disclosure is not limited thereto. The scan driver 380 may be formed or disposed in the non-display area NDA on two outer sides, for example, the left outer side and the right outer side of the display area DA.

The display panel 300 may include display pads DP electrically connected to the data lines DL and the scan control lines SCL, and sensing pads TP1 and TP2 electrically connected to the sensing lines. A display pad area DPA in which the display pads DP may be disposed may be disposed between a first sensor pad area TPA1 in which the first sensor pads TP1 may be disposed and a second sensor pad area TPA2 in which the second sensor pads TP2 may be disposed. As shown in FIG. 6, the display pad area DPA may be disposed at the center of one edge of the display panel 300, the first sensor pad area TPA1 may be disposed at the left side of the edge of the display panel 300, and the second sensor pad area TPA2 may be disposed on the right side of the edge of the display panel 300.

Figure 7:
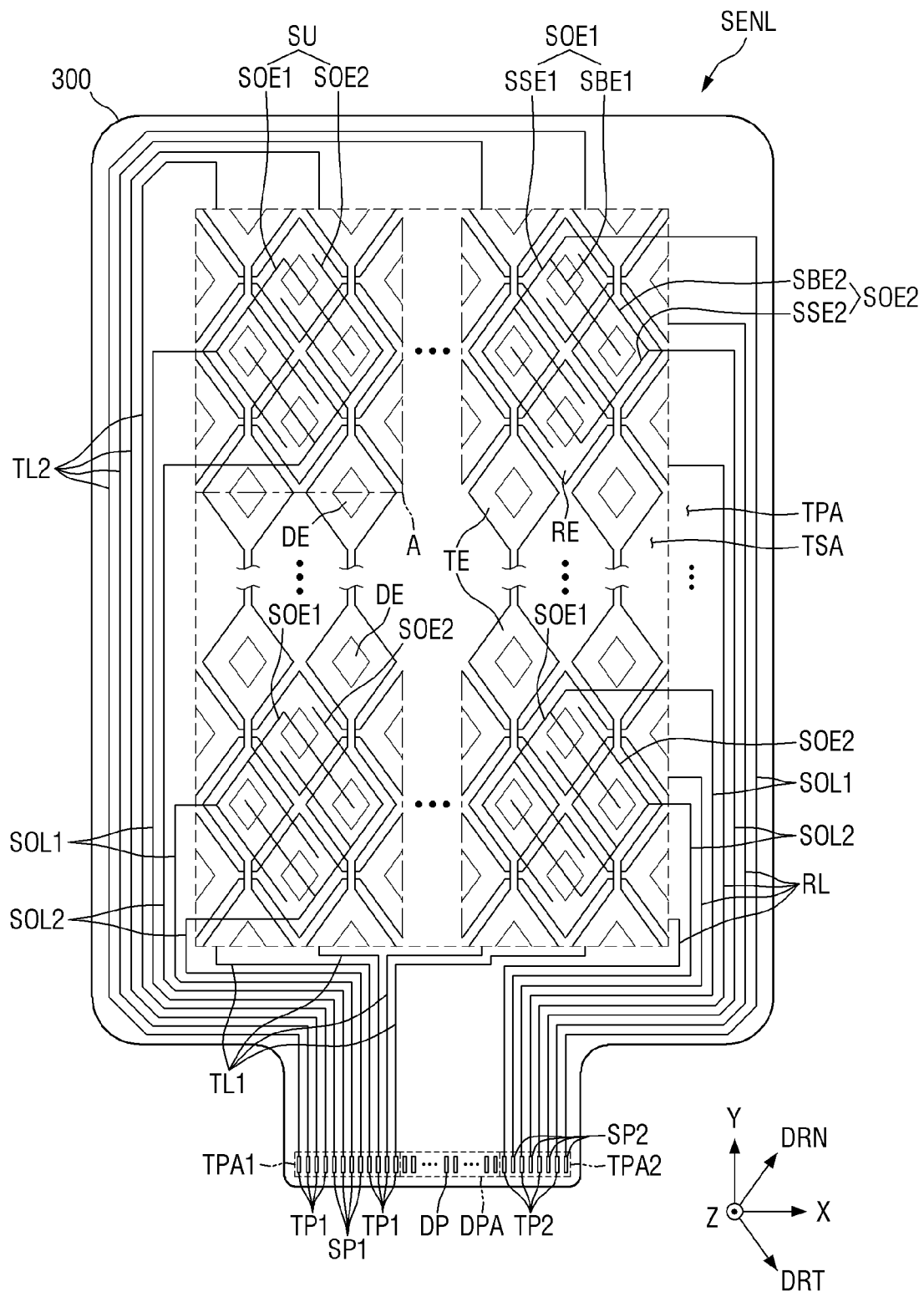
FIG. 7 is a view showing a layout of a sensor electrode layer of a display panel according to an embodiment.
Figure 8:
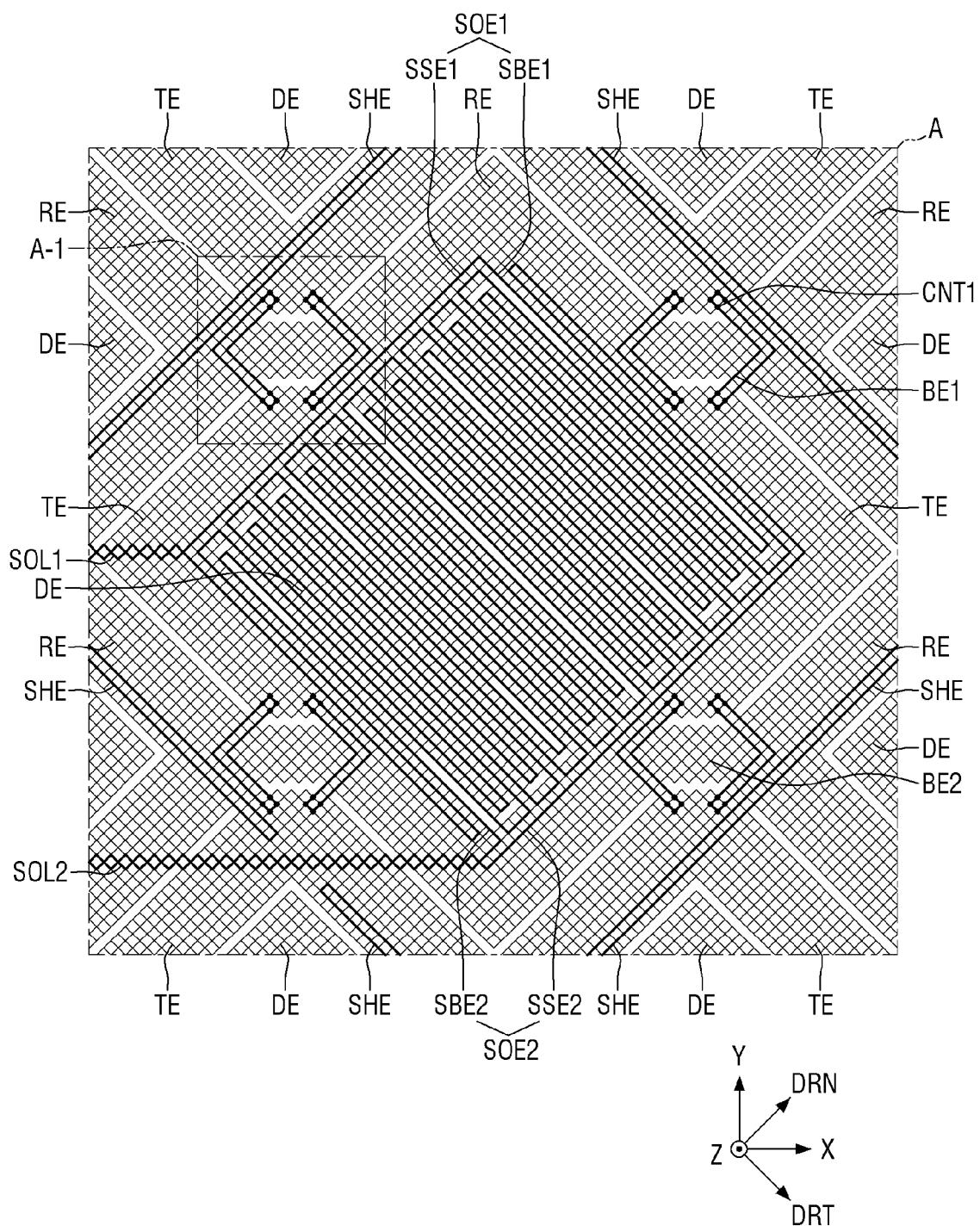
FIG. 8 is an enlarged plan view showing a part of the sensor area of FIG. 7.

FIG. 7 is a view showing a layout of a sensor electrode layer of a display panel according to an embodiment. FIG. 8 is an enlarged plan view showing a part of the sensor area of FIG. 7.

In the example shown in FIG. 7, the sensor electrodes TE and RE of the sensor electrode layer SENL include two kinds of electrodes, for example, the driving electrodes TE and the sensing electrodes RE, and the mutual capacitive sensing may be carried out by using two layers, for example, driving signals may be applied to the driving electrodes TE and then the voltages charged at the mutual capacitances may be sensed through the sensing electrodes RE. It is, however, to be understood that the disclosure is not limited thereto. For example, the sensor electrode layer SENL may be driven by mutual capacitance sensing using one layer or by self-capacitance sensing.

For convenience of illustration, FIG. 7 shows only sensor electrodes TE and RE, dummy patterns DE, sensor lines TL1, TL2 and RL, sensor pads TP1 and TP2, sound electrodes SOE1 and SOE2, sound lines SOL1 and SOL2, and sound pads SP1 and SP2. FIG. 8 is an enlarged plan view of area A of FIG. 7.

Referring to FIGS. 7 and 8, the sensor electrode layer SENL may include the sensor area TSA for sensing a user's touch, and the sensor peripheral area TPA disposed around the sensor area TSA. The sensor area TSA may overlap the display area DA of the display layer DISL, and the sensor peripheral area TPA may overlap the non-display area NDA of the display layer DISL.

The sensor electrodes TE and RE may be disposed in the sensor area TSA. The sensor electrodes TE and RE may include first sensor electrodes TE and second sensor electrodes RE. In an embodiment shown in FIGS. 7 and 8, the first sensor electrode is the driving electrode TE, and the second sensor electrode is the sensing electrode RE. In FIGS. 7 and 8, the driving electrodes TE, the sensing electrodes RE and the dummy patterns DE each have a substantially diamond shape in a case that the driving electrodes TE, the sensing electrodes RE and the dummy patterns DE are viewed from the top, but the disclosure is not limited thereto.

The sensing electrodes RE may be arranged or disposed in the first direction (x-axis direction) and electrically connected to one another. The driving electrodes TE may be arranged or disposed in the second direction (y-axis direction) crossing or intersecting the first direction (x-axis direction) and may be electrically connected to one another. The driving electrodes TE may be electrically separated from the sensing electrodes RE. The driving electrodes TE may be spaced apart from the sensing electrodes RE. The driving electrodes TE may be arranged or disposed in parallel in the second direction (y-axis direction).

As shown in FIG. 8, in order to electrically separate the sensing electrodes RE from the driving electrodes TE at their intersections, the driving electrodes TE adjacent to each other in the second direction (y-axis direction) may be electrically connected through the first connection electrodes BE1, and the sensing electrodes RE adjacent to each other in the first direction (x-axis direction) may be electrically connected through second connection electrodes BE2. The first connection electrode BE1 may be formed or disposed on a different layer from the driving electrodes TE and may be electrically connected to the driving electrodes TE through the first contact holes CNT1.

Each of the first connection electrodes BE1 may be bent at least once. In FIG. 8, the first connection electrodes BE1 may be bent in the shape of angle brackets "<" or ">", but the shape of the first connection electrodes BE1 is not limited thereto. Since the driving electrodes TE adjacent to each other in the second direction (y-axis direction) may be electrically connected by the first connection electrodes BE1, even if any of the first connection electrodes BE1 is disconnected, the driving electrodes TE may still be stably connected with each other. Although two adjacent ones of the driving electrodes TE are may be electrically connected by two first connection electrodes BE1 in the example shown in FIG. 8, but the number of first connection electrodes BE1 is not limited thereto.

As shown in FIG. 8, the second connection electrode BE2 is formed or disposed on the same layer as the sensing electrodes RE and may have a shape extended from the sensing electrodes RE. The sensing electrodes RE and the second connection electrode BE2 may be formed of the same or similar material.

By virtue of the first connection electrodes BE1 and the second connection electrodes BE2, the driving electrodes TE adjacent to each other in the second direction (y-axis direction) may be electrically connected to each other, while the driving electrodes TE adjacent to each other the first direction (x-axis direction) may be electrically insulated from each other. In addition, the sensing electrodes RE adjacent to each other in the first direction (x-axis direction) may be electrically connected to each other, while the sensing electrodes RE adjacent to each other in the second direction (y-axis direction) may be electrically insulated from each other. In addition, as the driving electrode TE may be electrically insulated from the sensing electrodes RE, mutual capacitances may be formed or disposed at intersections of the driving electrodes TE and the sensing electrodes RE.

The dummy patterns DE may be electrically separated from the driving electrodes TE and the sensing electrodes RE. The driving electrodes TE, the sensing electrodes RE and the dummy patterns DE may be disposed apart from each other. The dummy patterns DE may be surrounded by or may be adjacent to the driving electrodes TE and the sensing electrodes RE, respectively. Each of the dummy patterns DE may be electrically floated.

The parasitic capacitance between the second electrode of the emission layer EML and the driving electrode TE or the sensing electrode RE may be reduced due to the dummy patterns DE. In a case that the parasitic capacitance is reduced, there is an advantage in that the mutual capacitance between the driving electrode TE and the sensing electrode RE may be charged more quickly. However, as the areas of the driving electrode TE and the sensing electrode RE may be reduced due to the dummy patterns DE, the mutual capacitance between the driving electrode TE and the sensing electrode RE may be reduced. As a result, the voltage charged in the mutual capacitance may be easily affected by noise. Therefore, the area of the dummy patterns DE may be determined by the trade-off between the parasitic capacitance and the mutual capacitance.

The sensor lines TL1, TL2 and RL may be disposed in the sensor peripheral area TPA. The sensor lines TL1, TL2 and RL may include sensing lines RL electrically connected to the sensing electrodes RE, and first driving lines TL1 and second driving lines TL2 electrically connected to the driving electrodes TE.

The sensing electrodes RE disposed on one side of the sensor area TSA may be electrically connected to the sensing lines RL. For example, some or a predetermined number of the sensing electrodes RE electrically connected in the first direction (x-axis direction) that may be disposed at the right end may be electrically connected to the sensing lines RL as shown in FIG. 7. The sensing lines RL may be electrically connected to second sensor pads TP2. Therefore, the sensor driver 330 may be electrically connected to the sensing electrodes RE.

The driving electrodes TE disposed on one side of the sensor area TSA may be electrically connected to the first driving lines TL1, while the driving electrodes TE disposed on the other side of the sensor area TSA may be electrically connected to the second driving lines TL2. For example, some or a predetermined number of the driving electrodes TE electrically connected to one another in the second direction (y-axis direction) on the lowermost side may be electrically connected to the first driving line TL1, while some or a predetermined number of the driving electrodes TE disposed on the uppermost side may be electrically connected to the second driving line TL2, as shown in FIG. 7. The second driving lines TL2 may be connected to the driving electrodes TE on the upper side of the sensor area TSA via the left outer side of the sensor area TSA. The first driving lines TL1 and the second driving lines TL2 may be connected to the first sensor pads TP1. Therefore, the sensor driver 330 may be electrically connected to the driving electrodes TE.

Sound units SU may be disposed in the sensor area TSA, and a first sound line SOL1 and a second sound line SOL2 may be disposed in the sensor peripheral area TPA. The sound units SU may overlap the driving electrodes TE, the sensing electrodes RE, and the dummy patterns DE. The sound units SU may be spaced apart from one another.

Each of the sound units SU may include a first sound electrode SOE1, a second sound electrode SOE2, and a vibration layer in contact with the first sound electrode SOE1 and the second sound electrode SOE2. The vibration layer may be disposed in the sensor area TSA wholly or partially. For example, in a case that the vibration layer is disposed in a part of the sensor area TSA, it may be disposed in the areas where the sound units SU may be disposed in the sensor area TSA.

The vibration layer may include an electroactive polymer that may be deformed according to a first sound driving voltage applied to the first sound electrode SOE1 and a second sound driving voltage applied to the second sound electrode SOE2. Since the electroactive polymer is disposed in the sensor area TSA overlapping the display area DA of the display panel 300, it should be able to transmit light. For example, the electroactive polymer may include a ferroelectric polymer such as polyvinylidene fluoride (PVDF) and poly(vinylidenefluoride-co-trifluoroethylene (P(VDF-TrFE)). The electroactive polymer may include piezoelectric particles such as ZnO and $BaTiO_3$ to increase the piezoelectric effect. The vibration layer may be mechanically deformed by the inverse piezoelectric effect in a case that the first sound driving voltage is applied to the first sound electrode SOE1 and the second sound driving voltage is applied to the second sound electrode SOE2. In addition, in a case that the vibration layer is mechanically deformed, it may generate voltages on the first sound electrode SOE1 and the second sound electrode SOE2 by the piezoelectric effect. Each of the sound units SU may output sound by vibrating the vibration layer by the inverse piezoelectric effect.

The first sound electrodes SOE1 of the sound units SU may be electrically separated from each other. As shown in FIG. 7, each of the first sound electrodes SOE1 of the sound units SU may be electrically connected to the first sound line SOL1. The second sound electrodes SOE2 of the sound units SU may be electrically separated from each other. As shown in FIG. 7, each of the second sound electrodes SOE2 of the sound units SU may be electrically connected to the second sound line SOL2.

Alternatively, the first sound electrodes SOE1 of some or a predetermined number of the sound units SU may be electrically connected with one another. For example, the first sound electrodes SOE1 of the sound units SU disposed on one side of the sensor area TSA may be electrically connected to one first sound line SOL1. The first sound electrodes SOE1 of the sound units SU disposed on the other side of the sensor area TSA may be electrically connected to another first sound line SOL1. In addition, the second sound electrodes SOE2 of some or a predetermined number of the sound units SU may be electrically connected with one another. For example, the second sound electrodes SOE2 of the sound units SU disposed on one side of the sensor area TSA may be electrically connected to one second sound line SOL2. The second sound electrodes SOE2 of the sound units SU disposed on the other side of the sensor area TSA may be electrically connected to another second sound line SOL2.

In each of the sound units SU, the first sound electrode SOE1 may be spaced apart from the second sound electrode SOE2. In each of the sound units SU, the first sound electrode SOE1 may be electrically separated from the second sound electrode SOE2.

Each of the first sound electrodes SOE1 may include a first sound stem electrode SSE1 and first sound branch electrodes SBE1. The first sound stem electrode SSE1 may be extended in a direction DRN. The first sound stem electrode SSE1 may be electrically connected to the first sound connection line SOL1. The first sound branch electrodes SBE1 may branch off from the first sound stem electrode SSE1 and may be extended in other direction DRT intersecting the direction DRN.

Each of the second sound electrodes SOE2 may include a second sound stem electrode SSE2 and second sound branch electrodes SBE2. The second sound stem electrode SSE2 may be extended in the direction DRN and may be in parallel to the first sound stem electrode SSE1. The second sound stem electrode SSE2 may be electrically connected to the second sound connection line SOL2. The second sound branch electrodes SBE2 may branch off from the second sound stem electrode SSE2 and may be extended in the direction DRT. The first sound branch electrodes SBE1 and the second sound branch electrodes SBE2 may be alternately arranged or disposed in the direction DRN. As an example, in the direction DRN, they may be arranged or disposed in the order of the first sound branch electrode SBE1, the second sound branch electrode SBE2, the first sound branch electrode SBE1, the second sound branch electrode SBE2, and so on.

Shielding electrodes SHE may be disposed to surround or be adjacent to the sound unit SU. The shielding electrodes SHE may be electrically connected to at least one of the sound pads SP1 and SP2 through a shielding line. Accordingly, the shielding electrodes SHE may be electrically connected to the sound driver 340. The sound driver 340 may apply a shielding voltage, such as a ground voltage, to the shielding electrodes SHE. Thanks to the shielding electrodes SHE, it is possible to reduce the vibration or sound generated by a sound unit SU from affecting the vibration or sound generated by another sound unit SU.

The first sound electrodes SOE1 and the second sound electrodes SOE2 of the sound units SU disposed on one side of the sensor area TSA may be electrically connected to the first sound lines SOL1 and the second sound lines SOL2 disposed more to the outside. The first sound lines SOL1 and the second sound lines SOL2 may be electrically connected to the first sound pads SP1 disposed in the first sensor pad area TPA1. The first sound electrodes SOE1 and the second sound electrodes SOE2 of the sound units SU disposed on another side of the sensor area TSA may be electrically connected to the first sound lines SOL1 and the second sound lines SOL2 disposed more to the outside. The first sound lines SOL1 and the second sound lines SOL2 may be electrically connected to the second sound pads SP2 disposed in the second sensor pad area TPA2. Therefore, the sound driver 340 may be electrically connected to the first sound electrodes SOE1 and the second sound electrodes SOE2.

As shown in FIG. 7, in each of the sound units SU, a first sound driving voltage may be applied to the first sound electrode SOE1 through the first sound line SOL1, and a second sound driving voltage may be applied to the second sound electrode SOE2 through the second sound line SOL2. Accordingly, each of the sound units SU may drive a vibration layer PEL in contact with the first sound electrode SOE1 and the second sound electrode SOE2 by the first sound driving voltage and the second sound driving voltage, thereby outputting sound. The vibration layer PEL of each of the sound units SU will be described in detail later with reference to FIG. 11.

Figure 11:
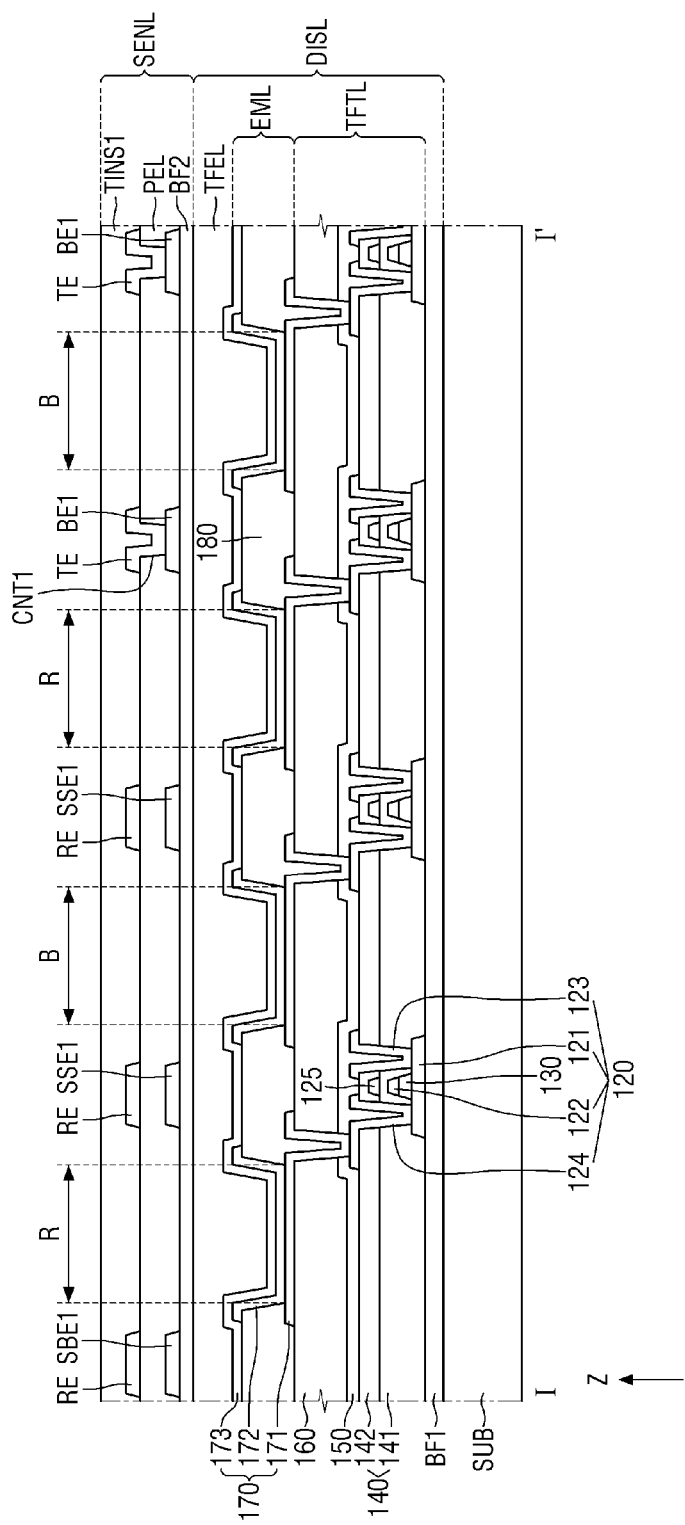
FIG. 11 is a schematic cross-sectional view taken along line I-I' of FIG. 10.

By way of example, in a case that the sensor electrode layer SENL is formed or disposed directly on the encapsulation layer TFEL as shown in FIG. 11, the distance between the second electrode of the emission layer EML and each of the driving electrode TE, the sensing electrode RE, the dummy pattern DE, the first connection electrode BE1, the second connection electrode BE2, the first sound electrode SOE1, the second sound electrode SOE2 and the shielding electrode SHE may be closed. Accordingly, a large parasitic capacitance may be formed between the second electrode of the emission layer EML and each of them. Such parasitic capacitance may be proportional to the area where the second electrode of the emission layer EML overlaps with each of the driving electrode TE, the sensing electrode RE, the dummy pattern DE, the first connection electrode BE1, the second connection electrode BE2, the first sound electrode SOE1, the second sound electrode SOE2 and the shielding electrode SHE. Accordingly, in order to reduce such parasitic capacitance, the driving electrode TE, the sensing electrode RE, the dummy pattern DE, the first connection electrode BE1, the second connection electrode BE2, the first sound electrode SOE1, the second sound electrode SOE2 and the shielding electrode SHE may be formed in a mesh topology when viewed from the top.

Figure 9:
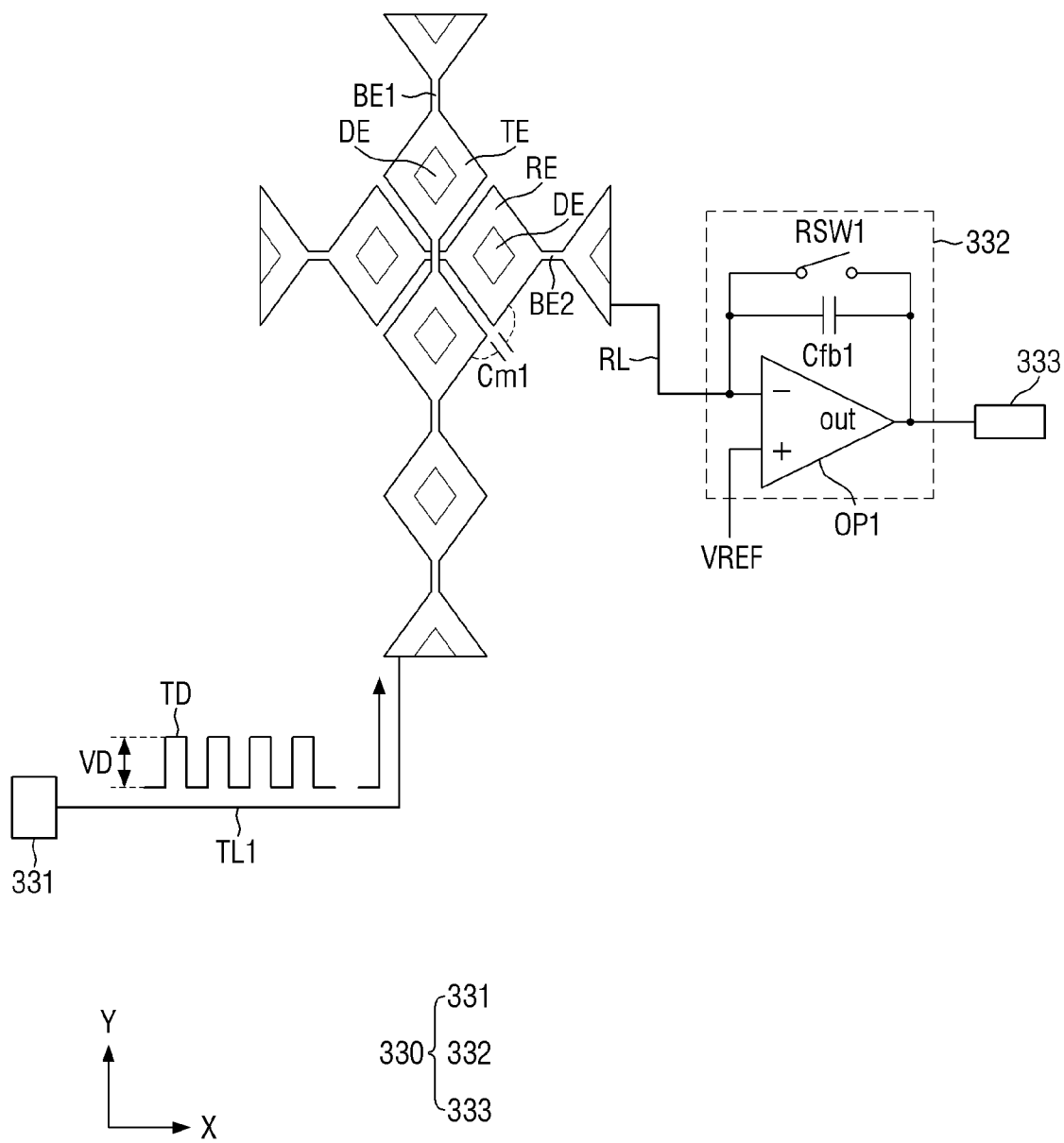
FIG. 9 is a view showing an example of the sensor driver electrically connected to the driving electrodes and the sensing electrodes of FIG. 7.

FIG. 9 is a view showing an example of the sensor driver electrically connected to the driving electrodes and the sensing electrodes of FIG. 7.

For convenience of illustration, FIG. 9 shows only driving electrodes TE arranged or disposed in a row and electrically connected to each other in the second direction (y-axis direction), and sensing electrodes RE arranged or disposed in a row and electrically connected to each other in the first direction (x-axis direction).

Referring to FIG. 9, the sensor driver 330 may include a driving signal output 331, a first sensor detector 332, and a first analog-to-digital converter 333.

The driving signal output 331 may output a touch driving signal TD to the driving electrodes TE through a first driving line TL1, and the touch driving signal TD to the driving electrodes TE through a second driving line TL2. The touch driving signal TD may include pulses. The height of the touch driving signal may be represented as VD.

The driving signal output 331 may output the touch driving signal TD to the driving lines TL1 and TL2 in a predetermined order. For example, the driving signal output 331 may output the touch driving signal TD sequentially from the driving electrodes TE disposed on the left side of the touch sensing area TSA of FIG. 7 to the driving electrodes TE disposed on the right side of the touch sensing area TSA.

The first sensor detector 332 detects a voltage charged in a first mutual capacitance Cm1 through the sensing line RL electrically connected to the sensing electrodes RE. As shown in FIG. 8, the first mutual capacitance Cm1 may be formed or disposed between the driving electrode TE and the sensing electrode RE.

The first sensor detector 332 may include a first operational amplifier OP1, a first feedback capacitor Cfb1, and a first reset switch RSW1. The first operational amplifier OP1 may include a first input terminal (−), a second input terminal (+), and an output terminal (out). The first input terminal (−) of the first operational amplifier OP1 may be electrically connected to the sensing line RL, the initialization voltage VREF may be supplied to the second input terminal (+), and the output terminal (out) of the first operational amplifier OP1 may be electrically connected to a first storage capacitor Cs1. The first storage capacitor may be electrically connected between the output terminal (out) of the first operational amplifier OP1 and the ground to store the output voltage Vout1 of the first operational amplifier OP1. The first feedback capacitor Cfb1 and the first reset switch RSW1 may be electrically connected in parallel between the first input terminal (−) and the output terminal (out) of the first operational amplifier OP1. The first reset switch RSW1 controls the connection of both ends of the first feedback capacitor Cfb1. When the first reset switch RSW1 is turned on such that both ends of the first feedback capacitor Cfb1 may be electrically connected, the first feedback capacitor Cfb1 may be reset.

The output voltage Vout1 of the first operational amplifier OP1 may be defined as in Equation 1 below:

$$Vout1 = \frac{Cm1 \times Vt1}{Cfb1} \qquad \text{[Equation 1]}$$

where Vout1 denotes the output voltage of the first operational amplifier OP1, Cm1 denotes the first mutual capacitance, Cfb1 denotes the capacitance of the first feedback capacitor, and Vt1 denotes the voltage charged in the first mutual capacitance Cm1.

The first analog-to-digital converter 333 may convert the output voltage Vout1 stored in the first storage capacitor into first digital data and output the first digital data.

As shown in FIG. 9, the sensor electrode layer SENL may determine whether there is a user's touch by sensing voltages charged in the first mutual capacitances Cm1.

Figure 10:
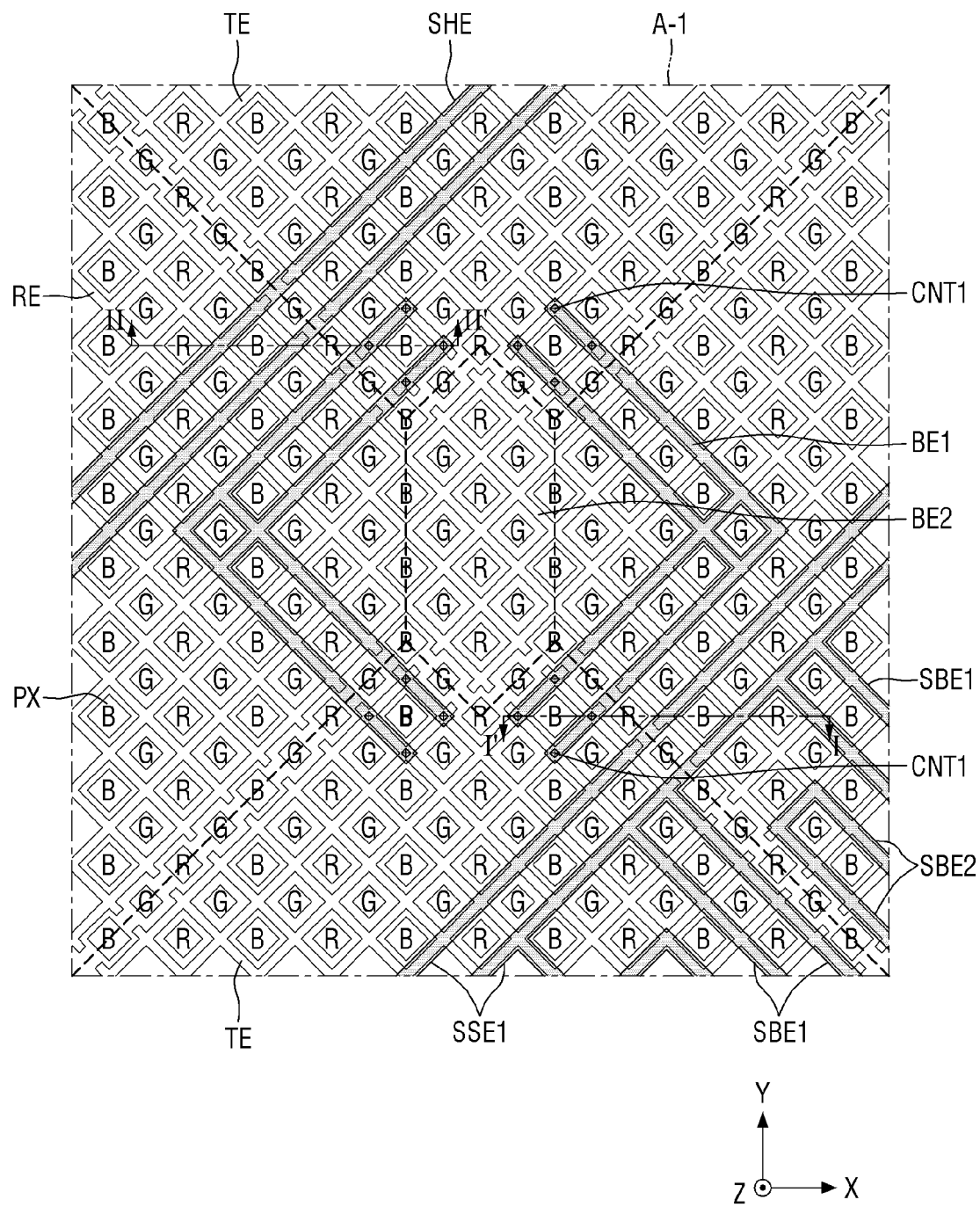
FIG. 10 is an enlarged plan view showing the driving electrodes, the sensing electrodes, the first connection electrodes, the first sound electrode and the shielding electrode of FIG. 8 in detail.

FIG. 10 is an enlarged plan view showing the driving electrodes, the sensing electrodes, the first connection electrodes, the first sound electrode and the shielding electrode of FIG. 8 in detail. FIG. 10 is an enlarged plan view of area A-1 of FIG. 8.

Referring to FIG. 10, the driving electrodes TE, the sensing electrodes RE, the first connection electrodes BE1 the second connection electrodes BE2, the first sound stem electrode SSE1, the second sound branch electrodes SBE2 and the shielding electrode SHE may be formed in a mesh topology when viewed from the top.

The driving electrodes TE, the sensing electrodes RE, the dummy patterns DE and the second connection electrodes BE2 may be formed or disposed in the same layer, and thus they may be spaced apart from each other. There may be a gap between the driving electrode TE and the sensing electrode RE, between the driving electrode TE and the second connection electrode BE2, between the driving electrode TE and the dummy pattern DE, and between the sensing electrode RE and the dummy pattern DE. For convenience of illustration, the boundary between the driving electrode TE and the sensing electrode RE, the boundary between the driving electrode TE and the second connection electrode BE2, and the boundary between the sensing electrode RE and the second connection electrode BE2 may be indicated by dashed lines in FIG. 10.

Since the first connection electrodes BE1, the first sound stem electrode SSE1, the second sound branch electrode SBE2 and the shielding electrode SHE may be formed or disposed on the same layer, they may be spaced apart from one another.

The first connection electrodes BE1 may be electrically connected to the driving electrodes TE through the first contact holes CNT1, respectively. One end of each of the first connection electrodes BE1 may be electrically connected to one of the driving electrodes TE adjacent to each other in the second direction (y-axis direction) through a first contact hole CNT1. The other end of each of the first connection electrodes BE1 may be electrically connected to another one of the driving electrodes TE adjacent to each other in the second direction (y-axis direction) through a first contact hole CNT1. The first connection electrode BE1 may overlap the driving electrodes TE and the sensing electrode RE in the third direction (z-axis direction). Alternatively, the first connection electrode BE1 may overlap the second connection electrode BE2 instead of the sensing electrode RE in the third direction (z-axis direction). Alternatively, the first connection electrode BE1 may overlap the second connection electrode BE2 as well as the sensing electrode RE in the third direction (z-axis direction). Since the first connection electrode BE1 is formed or disposed on a different layer from the driving electrodes TE, the sensing electrodes RE and the second connection electrode BE2, it is possible to prevent a short-circuit from being created in the sensing electrode RE and/or the second connection electrode BE2 even though they overlap the sensing electrode RE and/or the second connection electrode BE2.

The second connection electrode BE2 may be disposed between the sensing electrodes RE. The second connection electrode BE2 may be formed or disposed on the same layer as the sensing electrodes RE and may be extended from each of the sensing electrodes RE. Therefore, the second connection electrode BE2 may be electrically connected to the sensing electrodes RE without any additional contact hole.

The first sound stem electrode SSE1 may overlap at least one driving electrode TE and at least one sensing electrode RE in the third direction (z-axis direction). In addition, the first sound stem electrode SSE1 may overlap the at least one dummy pattern DE in the third direction (z-axis direction) as shown in FIG. 8.

The second sound branch electrode SOE2 may overlap at least one driving electrode TE and at least one sensing electrode RE in the third direction (z-axis direction). Alternatively, the second sound branch electrode SOE2 may overlap one of at least one driving electrode TE and at least one sensing electrode RE in the third direction (z-axis direction). In addition, the second sound electrode SOE2 may overlap the at least one dummy pattern DE in the third direction (z-axis direction) as shown in FIG. 8.

Sub-pixels R, G and B may include a first sub-pixel R emitting a first color, a second sub-pixel G emitting a second color, and a third sub-pixel B emitting a third color. Although the first sub-pixel R is a red sub-pixel, the second sub-pixel G is a green sub-pixel and the third sub-pixel B is a blue sub-pixel in the example shown in FIG. 10, the disclosure is not limited thereto. Although the first sub-pixel R, the second sub-pixel G and the third sub-pixel B have a substantially quadrangular shape in a case that the first sub-pixel R, the second sub-pixel G and the third sub-pixel B are viewed from the top in the example shown in FIG. 10, the disclosure is not limited thereto. For example, the first sub-pixel R, the second sub-pixel G and the third sub-pixel B may have a substantially polygonal shape other than a substantially quadrangular, or a substantially circular or substantially elliptical shape in a case that the first sub-pixel R, the second sub-pixel G and the third sub-pixel B are viewed from the top. In addition, although FIG. 10 illustrates that the third sub-pixel B has the largest size while the second sub-pixel G has the smallest size, the disclosure is not limited thereto.

A pixel PX refers to a group of sub-pixels that may represent grayscales. In the example shown in FIG. 10, a pixel PX may include a first sub-pixel R, two second sub-pixels G and a third sub-pixel B. It is, however, to be understood that the disclosure is not limited thereto. For example, a pixel PX may include a first sub-pixel, a second sub-pixel, and a third sub-pixel.

Because the driving electrodes TE, the sensing electrodes RE, the first connection electrodes BE1, the second connection electrodes BE2, the first sound stem electrode SSE1, the second sound branch electrode SBE2 and the shielding electrode SHE may be formed in a mesh topology when viewed from the top, the sub-pixels R, G and B may not overlap the driving electrodes TE, the sensing electrodes RE, the first connection electrodes BE1, the second connection electrodes BE2, the first sound stem electrode SSE1, the second sound branch electrode SBE2, and the shielding electrode SHE. Accordingly, it is possible to prevent that the luminance of the light emitted from the sub-pixels R, G and B is reduced as it is hidden by the driving electrodes TE, the sensing electrodes RE, the first connection electrodes BE1, the second connection electrodes BE2, the first sound stem electrode SSE1, the second sound branch electrode SBE2 and the shielding electrode SHE.

Figure 12:
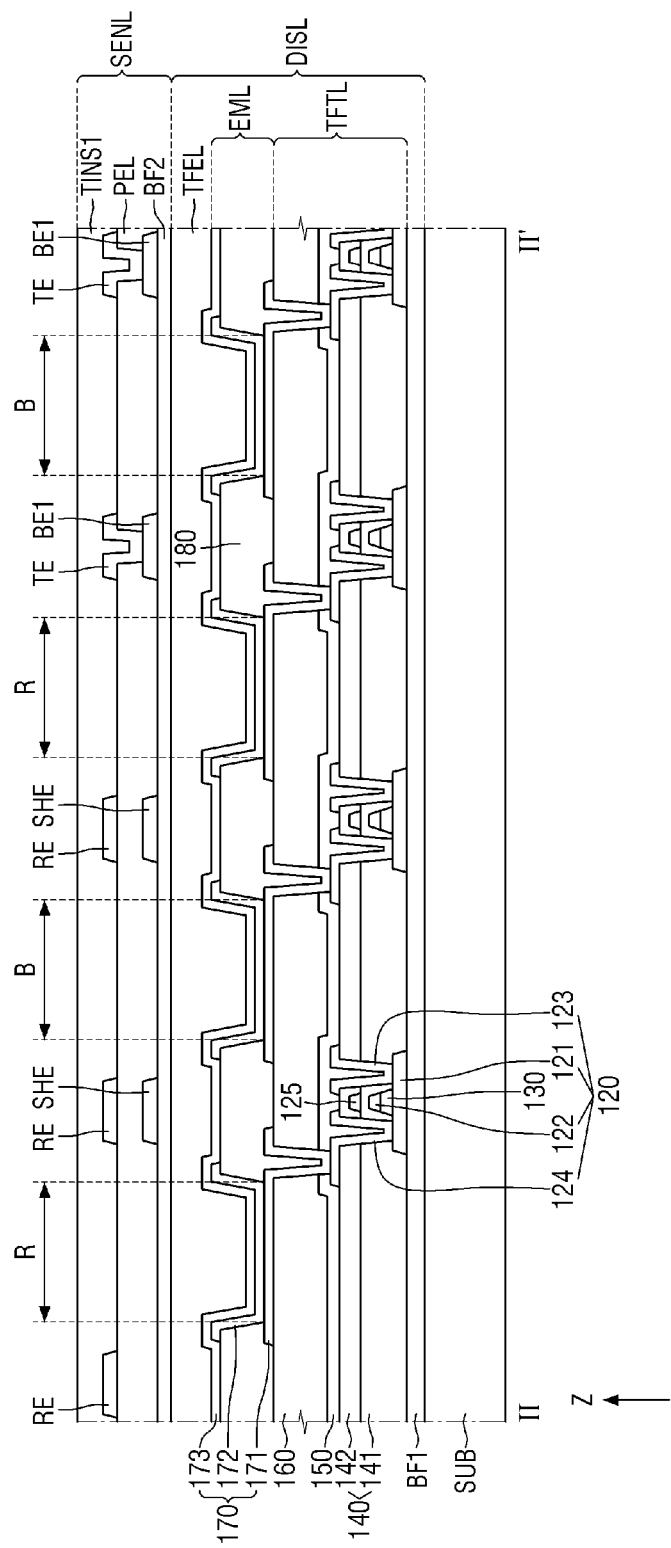
FIG. 12 is a schematic cross-sectional view taken along line II-II' of FIG. 10.

FIG. 11 is a schematic cross-sectional view taken along line I-I' of FIG. 10. FIG. 12 is a schematic cross-sectional view taken along line II-II' of FIG. 10.

Referring to FIGS. 11 and 12, the display layer DISL including a first buffer layer BF1, a thin-film transistor layer TFTL, an emission layer EML and an encapsulation layer TFEL may be disposed on the substrate SUB.

The first buffer layer BF1 may be formed or disposed on a surface of the substrate SUB. The first buffer layer BF1 may be formed or disposed on a surface of the substrate SUB in order to protect the thin-film transistors 120 and organic emitting layer 172 of the light-emitting element layer EML from moisture that may likely permeate through the substrate SUB. The first buffer layer BF1 may be made up of multiple inorganic layers sequentially stacked on one another. For example, the first buffer layer BF1 may be made up of multiple layers in which one or more inorganic layers of a silicon nitride layer, a silicon oxynitride layer, a silicon oxide layer, a titanium oxide layer and an aluminum oxide layer may be alternately stacked on one another. The first buffer layer BF1 may be eliminated.

The thin-film transistor layer TFTL may include thin-film transistors 120, a gate insulating layer 130, an interlayer dielectric layer 140, a protective layer 150, and a planarization layer 160.

The thin-film transistors 120 may be formed or disposed on the first buffer layer BF1. Each of the thin-film transistor 120 may include an activate layer 121, a gate electrode 122, a source electrode 123, and a drain electrode 124. In FIG. 11, the thin-film transistors 120 may be implemented as top-gate transistors in which the gate electrode 122 may be located or disposed above the active layer 121. It is, however, to be understood that the disclosure is not limited thereto. The thin-film transistors 120 may be implemented as bottom-gate transistors in which the gate electrode 122 may be located or disposed below the active layer 121, or as double-gate transistors in which the gate electrodes 122 may be disposed above and below the active layer 121.

The active layer 121 may be formed or disposed on the first buffer layer BF1. The active layer 121 may include polycrystalline silicon, single crystal silicon, low-temperature polycrystalline silicon, amorphous silicon, or an oxide semiconductor. The oxide semiconductor may include, for example, a binary compound (ABx), a ternary compound (ABxCy) and a quaternary compound (ABxCyDz) containing indium, zinc, gallium, tin, titanium, aluminum, hafnium (Hf), zirconium (Zr), magnesium (Mg), for example. For example, the active layer 121 may include an oxide including indium, tin, and titanium (ITZO) or an oxide including indium, gallium and tin (IGZO). A light-blocking layer for blocking external light incident on the active layer 121 may be formed or disposed between the buffer layer and the active layer 121.

The gate insulating layer 130 may be formed or disposed on the active layer 121. The gate insulating layer 130 may be formed or disposed only in a region overlapping with the gate electrode 122 in the third direction (z-axis direction) as shown in FIG. 11, but the disclosure is not limited thereto. The gate insulating layer 130 may be formed of an inorganic layer, for example, a silicon nitride layer, a silicon oxynitride layer, a silicon oxide layer, a titanium oxide layer, or an aluminum oxide layer.

The gate electrodes 122 may be formed or disposed on the gate insulating layer 130. The gate electrode 122 may overlap the active layer 121 in the third direction (z-axis direction). The gate electrode 122 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A first interlayer dielectric layer 141 may be formed or disposed over the gate electrode 122 and the gate line. The first interlayer dielectric layer 141 may be formed of an inorganic layer, for example, a silicon nitride layer, a silicon oxynitride layer, a silicon oxide layer, a titanium oxide layer, or an aluminum oxide layer.

A capacitor electrode 125 may be formed or disposed on the first interlayer dielectric layer 141. The capacitor electrode 125 may overlap the gate electrode 122 in the third direction (z-axis direction). The capacitor electrode 125 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A second interlayer dielectric layer 142 may be formed or disposed over the capacitor electrode 125. The second interlayer dielectric layer 142 may be formed of an inorganic layer, for example, a silicon nitride layer, a silicon oxynitride layer, a silicon oxide layer, a titanium oxide layer, or an aluminum oxide layer.

The source electrode 123 and the drain electrode 124 may be formed or disposed on the second interlayer dielectric layer 142. Each of the source electrode 123 and the drain electrode 124 may be electrically connected to the active layer 121 through a contact hole penetrating through the interlayer dielectric layer 140. The source electrode 123 and the drain electrode may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The protective layer 150 may be formed or disposed on the source electrode 213 and the drain electrode 124 in order to insulate the thin-film transistors 120. The protective layer 150 may be formed of an inorganic layer, for example, a silicon nitride layer, a silicon oxynitride layer, a silicon oxide layer, a titanium oxide layer, or an aluminum oxide layer.

The planarization layer 160 may be formed or disposed on the protective layer 150 to provide a flat surface over the step differences of the thin-film transistors 120. The planarization layer 160 may be formed of an organic layer such as an acryl resin, an epoxy resin, a phenolic resin, a polyamide resin and a polyimide resin.

The emission layer EML may be formed or disposed on the thin-film transistor layer TFTL. The emission layer EML may include light-emitting elements 170 and a bank 180.

The light-emitting elements 170 and the pixel-defining layer 180 may be formed or disposed on the planarization layer 160. Each of the light-emitting elements 170 may include a first electrode 171, an organic emitting layer 172, and a second electrode 173. In FIG. 11, the light-emitting elements 170 may be organic light-emitting diodes including the organic emitting layer 172.

The first electrode 171 may be formed or disposed on the planarization layer 160. Although the first electrode 171 may be electrically connected to the drain electrode 124 of the thin-film transistor 120 through the contact hole penetrating through the protective layer 150 and the planarization layer 160 in the example shown in FIG. 11, the disclosure is not limited thereto. The first electrode 171 may be electrically connected to the source electrode 123 of the thin-film transistor 120 through the contact hole penetrating through the protective layer 150 and the planarization layer 160.

In the top-emission organic light-emitting diode that light exits from the organic emitting layer 172 toward the second electrode 173, the first electrode 171 may be made up of a single layer of molybdenum (Mo), titanium (Ti), copper (Cu) or aluminum (Al), or may be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO). The APC alloy is an alloy of silver (Ag), palladium (Pd) and copper (Cu).

In the bottom-emission organic light-emitting diode that light exits from the organic emitting layer 172 toward the first electrode 173, the first electrode 171 may be formed of a transparent conductive material (TCP) such as ITO and IZO that may transmit light, or a semi-transmissive conductive material such as magnesium (Mg), silver (Ag) and an alloy of magnesium (Mg) and silver (Ag). In a case that the first electrode 171 is made of a semi-transmissive metal material, the light extraction efficiency may be increased by using microcavities.

The bank 180 may partition the first electrode 171 on the planarization layer 160 in order to define each of the sub-pixels PX. The bank 180 may be formed or disposed to cover or overlap the edge of the first electrode 171. The bank 180 may be formed of an organic layer such as an acryl resin, an epoxy resin, a phenolic resin, a polyamide resin and a polyimide resin.

In each of the sub-pixels PX, the first electrode 171, the organic emitting layer 172 and the second electrode 173 so that holes from the first electrode 171 and electrons from the second electrode 173 may be combined with each other in the organic emitting layer 172 to emit light.

The organic emitting layer 172 may be formed or disposed on the first electrode 171 and the pixel-defining layer 180. The organic emitting layer 172 may include an organic material and emit light of a certain color. For example, the organic emitting layer 172 may include a hole transporting layer, an organic material layer, and an electron transporting layer. In the example shown in FIG. 11, the organic emitting layer 172 of the first sub-pixel R may emit red light, the organic emitting layer 172 of the second sub-pixel G may emit green light, and the organic emitting layer 172 of the third sub-pixel B may emit blue light.

Alternatively, the organic emitting layers 172 of the sub-pixels PX may be formed as a single layer to emit white light, ultraviolet light, or blue light. In such case, the first sub-pixel R may overlap a first color filter transmitting red light in the third direction (z-axis direction), the second sub-pixel G may overlap a second color filter transmitting green light in the third direction (z-axis direction), and the third sub-pixel B may overlap a third color filter transmitting blue light in the third direction (z-axis direction). The first color filter, the second color filter and the third color filter may be disposed on the encapsulation layer TFEL. In addition, the first sub-pixel R may overlap a first wavelength converting layer converting blue light into red light in the third direction (z-axis direction), the second sub-pixel G may overlap a second wavelength converting layer converting blue light into green light in the third direction (z-axis direction), and the third sub-pixel B may overlap a transmitting layer outputting blue light as it is in the third direction (z-axis direction). The first wavelength converting layer, the second wavelength converting layer and the third wavelength converting layer may be disposed on the encapsulation layer TFEL. For example, the first wavelength converting layer may be disposed between the encapsulation layer TFEL and the first color filter, the second wavelength converting layer may be disposed between the encapsulation layer TFEL and the second color filter, and the third wavelength converting layer may be disposed between the encapsulation layer TFEL and the third color filter.

The second electrode 173 may be formed or disposed on the organic emitting layer 172. The second electrode 173 may be formed or disposed to cover or overlap the organic emitting layer 172. The second electrode 173 may be a common layer formed or disposed across the sub-pixels PX. A capping layer may be formed or disposed on the second electrode 173.

In the top-emission organic light-emitting diode, the second electrode 173 may be formed of a transparent conductive material (TCP) such as ITO and IZO that may transmit light, or a semi-transmissive conductive material such as magnesium (Mg), silver (Ag) and an alloy of magnesium (Mg) and silver (Ag). In a case that the second electrode 173 is formed of a semi-transmissive conductive material, the light extraction efficiency may be increased by using microcavities.

In the bottom-emission organic light-emitting diode, the second electrode 173 may be made up of a single layer of molybdenum (Mo), titanium (Ti), copper (Cu) or aluminum (Al), or may be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO).

The encapsulation layer TFEL may be formed or disposed on the emission layer EML. The encapsulation layer TFEL is disposed on the second electrode 173. The encapsulation layer TFEL may include at least one inorganic layer to prevent oxygen or moisture from permeating into the organic emitting layer 172 and the second electrode 173. In addition, the encapsulation layer TFEL may include at least one organic layer to protect the light-emitting element layer EML from foreign substances such as dust. For example, the encapsulation layer TFEL may include a first inorganic layer disposed on the second electrode 173, an organic layer disposed on the first inorganic layer, and a second inorganic layer disposed on the organic layer. The first inorganic layer and the second inorganic layer may be formed of, but is not limited to, a silicon nitride layer, a silicon oxynitride layer, a silicon oxide layer, a titanium oxide layer, or an aluminum oxide layer. The organic layer may be formed of, but is not limited to, an acryl resin, an epoxy resin, a phenolic resin, a polyamide resin and a polyimide resin.

The sensor electrode layer SENL may be formed or disposed on the encapsulation layer TFEL. The sensor electrode layer SENL may include a second buffer layer BF2, driving electrodes TE, sensing electrodes RE, first sound electrodes SOE1, second sound electrodes SOE2, shielding electrodes SHE, dummy patterns DE, first connection electrodes BE1, second connection electrodes BE2, first driving lines TL1, second driving lines TL2, sensing lines RL, first sound lines SOL1, second sound lines SOL2, a vibration layer PEL, and a first sensor insulating layer TINS1. FIGS. 11 and 12 show only the driving electrode TE, the sensing electrode RE, the first connection electrodes BE1, the first sound stem electrode SSE1 of the first sound electrode SOE1, and the shielding electrode SHE.

The second buffer layer BF2 may be formed of an inorganic layer, for example, a silicon nitride layer, a silicon oxynitride layer, a silicon oxide layer, a titanium oxide layer, or an aluminum oxide layer.

The first connection electrodes BE1, the first sound stem electrode SSE1 of the first sound electrode SOE1 and the shielding electrodes SHE may be formed or disposed on the second buffer layer BF2. The first sound branch electrodes SBE1 of the first sound electrode SOE1, and the second sound stem electrodes SSE2 and the second sound branch electrodes SBE2 of the second sound electrode SOE2 may also be formed or disposed on the second buffer layer BF2.

The first connection electrodes BE1, the first sound stem electrode SSE1 and the first sound branch electrodes SBE1 of the first sound electrode SOE1, and the second sound stem electrode SSE2 and the second sound branch electrodes SBE2 of the second sound electrode SOE2, and the shielding electrode SHE may be disposed to overlap the bank 180 in the third direction (z-axis direction). The first connection electrodes BE1, the first sound stem electrode SSE1 and the first sound branch electrodes SBE1 of the first sound electrode SOE1, and the second sound stem electrode SSE2 and the second sound branch electrodes SBE2 of the second sound electrode SOE2, and the shielding electrode SHE may be made up of a single layer of molybdenum (Mo), titanium (Ti), copper (Cu) or aluminum (Al), or may be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO).

The vibration layer PEL may be formed or disposed on the first connection electrodes BE1, the first sound stem electrode SSE1 and the first sound branch electrodes SBE1 of the first sound electrode SOE1, the second sound stem electrode SSE2 and the second sound branch electrodes SBE2 of the second sound electrode SOE2, and the shielding electrode SHE. The vibration layer PEL may include an electroactive polymer (piezoelectric polymer) that may be deformed according to a first sound driving voltage applied to the first sound electrode SOE1 and a second sound driving voltage applied to the second sound electrode SOE2 or a non-piezoelectric polymer. Since the electroactive polymer is disposed in the sensor area TSA overlapping the display area DA of the display panel 300, it should be able to transmit light. For example, the electroactive polymer may include a ferroelectric polymer such as polyvinylidene fluoride (PVDF) and poly(vinylidenefluoride-co-trifluoroethylene (P(VDF-TrFE)). Non-piezoelectric polymers may include polyester and urethane.

The vibration layer PEL may be formed or disposed on the first connection electrodes BE1, the first sound stem electrode SSE1 and the first sound branch electrodes SBE1 of the first sound electrode SOE1, the second sound stem electrode SSE2 and the second sound branch electrodes SBE2 of the second sound electrode SOE2, the shielding electrode SHE and the second buffer layer BF2 by printing, doctor blade coating, spraying, or spin coating. It is desired that the vibration layer PEL has a large dielectric constant, a small loss tangent over frequency, and a small leakage current. To this end, it is necessary to reduce the thickness of the vibration layer PEL or increase the area of the vibration layer PEL, and the vibration layer PEL may include piezoelectric particles or piezoelectric powders having a high dielectric constant. For example, the piezoelectric particles or piezoelectric powders may include ZnO, $PbTiO_3$, $BaTiO_3$, $PZT(Pb(TiZr)O_3)$ having a high piezoelectric constant, or a lead-free system such as BNT and SBT.

The piezoelectric particles or the piezoelectric powders may be evenly distributed on the vibration layer PEL, and the size of the piezoelectric particles or the piezoelectric powders may be approximately 2 μm or less.

In a case that the vibration layer PEL may include PVDF, it may be formed using a copolymer in which an additive such as HFP, CTFE and PTFE is added to the PVDF. Alternatively, the vibration layer PEL may be formed using a copolymer in which the additive is added to vinylidene-fluoride (VDF) or trifluoroethylene (TrFE) instead of PVDF.

In order to print or spray the copolymer containing PVDF and piezoelectric particles or piezoelectric powders, equipment such as three roll mill and basket mill may be used to mix a solvent, a dispersant, an antifoaming agent, for example, and to evenly disperse the piezoelectric particles or piezoelectric powders. In doing so, the amount of the solvent and the amount of the additive of the copolymer should be adjusted to form a thick film evenly by the printing and spraying. For example, in a case that the vibration layer PEL may be formed by screen printing, the copolymer may be a piezoelectric composite slurry having the viscosity of approximately 6,000 cps at the room temperature taking into account the mesh of the screen and printing thickness. In addition, in a case that the vibration layer PEL may be formed by printing, spraying or spin coating, the ratio of PVDF and piezoelectric particles or piezoelectric powders to adjust the viscosity of the slurry and to exhibit excellent piezoelectric properties may be approximately 6:4 to 2:8.

Alternatively, the vibration layer PEL may include a copolymer including polyester or urethane and piezoelectric particles or piezoelectric powders. In a case that the vibration layer PEL contains a range of about 65 to about 70% of the piezoelectric particles or the piezoelectric powders, a range of about 9 to about 20% of polyester or urethane, and a range of about 15 to about 21% of the solvent, printing characteristics, piezoelectric characteristics, flexibility and electrode adhesion may be increased. The piezoelectric characteristics may be improved and flexibility is increased as compared with a vibration layer using only the electroactive polymer. Accordingly, there is the advantage that the vibration layer PEL may be formed into a desired size.

The vibration layer PEL may include an acrylic resin, a polyester resin, for example, in order to enhance the adhesion with the first connection electrodes BE1, the first sound stem electrode SSE1 and the first sound branch electrodes SBE1 of the first sound electrode SOE1, the second sound stem electrode SSE2 and the second sound branch electrodes SBE2 of the second sound electrode SOE2, and the shielding electrode SHE. As amounts of the acrylic resin and the polyester resin increase, the amount of PVDF decreases and thus the piezoelectric characteristics of the vibration layer PEL may deteriorate. Therefore, the amounts of the acrylic resin and the polyester resin may be about 6 wt % or less of the vibration layer PEL.

Figure 13:
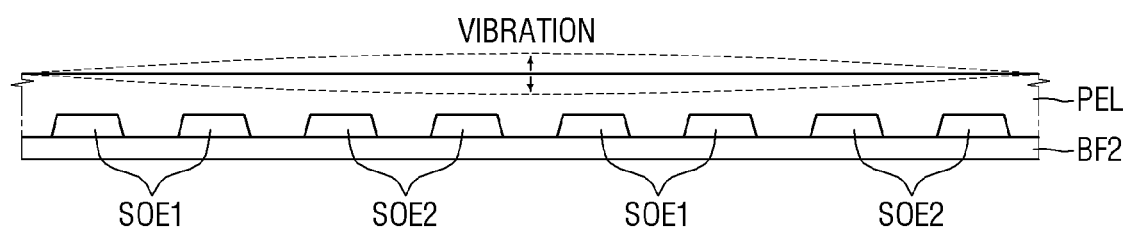
FIG. 13 is a view showing an example of vibration of the vibration layer by the inverse piezoelectric according to a first sound driving voltage applied to the first sound electrode and a second sound driving voltage applied to the second sound electrode of FIG. 9.

The vibrating layer PEL may be mechanically deformed by the inverse piezoelectric effect in a case that the first sound driving voltage is applied to the first sound electrode SOE1 and the second sound driving voltage is applied to the second sound electrode SOE2. For example, in a case that a positive first sound driving voltage is applied to the first sound electrode SOE1 and a negative second sound driving voltage is applied to the second sound electrode SOE2, and then a negative first driving voltage is applied to the first sound electrode SOE1 and a positive second sound driving voltage is applied the second sound electrode SOE2, the vibration layer PEL may repeat expansion and contraction. Accordingly, it may vibrate in the third direction (z-axis direction) as shown in FIG. 13. In addition, in a case that the vibration layer PEL is mechanically deformed, it may generate voltages on the first sound electrode SOE1 and the second sound electrode SOE2 by the piezoelectric effect. Each of the sound units SU may output sound by vibrating the vibration layer PEL by the inverse piezoelectric effect as shown in FIG. 13.

The driving electrodes TE, the sensing electrodes RE, the dummy patterns DE, the second connection electrodes BE2, the first driving lines TL1, the second driving lines TL2, the sense lines RL, the first sound lines SOL1, and the second sound lines SOL2 may be formed or disposed on the vibration layer PEL. The driving electrodes TE, the sensing electrodes RE, the dummy patterns DE, and the second connection electrodes BE2 may be disposed to overlap the bank 180 in the third direction (z-axis direction). The driving electrodes TE, the sensing electrodes RE, the dummy patterns DE, the second connection electrodes BE2, the first driving lines TL1, the second driving lines TL2, the sensing lines RL, the first sound lines SOL1 and the second sound lines SOL2 may be made up of a single layer of molybdenum (Mo), titanium (Ti), copper (Cu) or aluminum (Al) or may be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO).

The vibration layer PEL may be polarized by applying a voltage to the first sound electrode SOE1 and the second sound electrode SOE2. Polarization may be carried out by corona polarization or by apply electric field directly, as known in the art.

First contact holes CNT1 may be formed through the vibration layer PEL to expose the first connection electrodes BE1. The driving electrodes TE may be electrically connected to the first connection electrodes BE1 through the first contact holes CNT1.

The first sensor insulating layer TINS1 may be formed or disposed on the driving electrodes TE, the sensing electrodes RE, the dummy patterns DE, the second connection electrodes BE2, the first driving lines TL1, the second driving lines TL2, the sense lines RL, the first sound lines SOL1 and the second sound lines SOL2. The first sensor insulating layer TINS1 may be formed of an inorganic layer, for example, a silicon nitride layer, a silicon oxynitride layer, a silicon oxide layer, a titanium oxide layer, or an aluminum oxide layer. Alternatively, the first sensor insulating layer TINS1 may be formed of an organic layer, for example, an acryl resin, an epoxy resin, a phenolic resin, a polyamide resin or a polyimide resin.

As shown in FIG. 11, the first sound electrodes SOE1, the second sound electrodes SOE2 and the vibration layer PEL may be formed or disposed on the sensor electrode layer SENL for sensing a user's touch input. Accordingly, it is possible to sense a user's touch input by using the driving electrodes TE and the sensing electrodes RE of the sensor electrode layer SENL, and it is also possible to output sound by vibrating the vibration layer PEL by the first sound electrode SOE1 and the second sound electrode SOE2 of the sensor electrode layer SENL. Sound may be output by using the sound units incorporated into the display panel 300.

Figure 14:
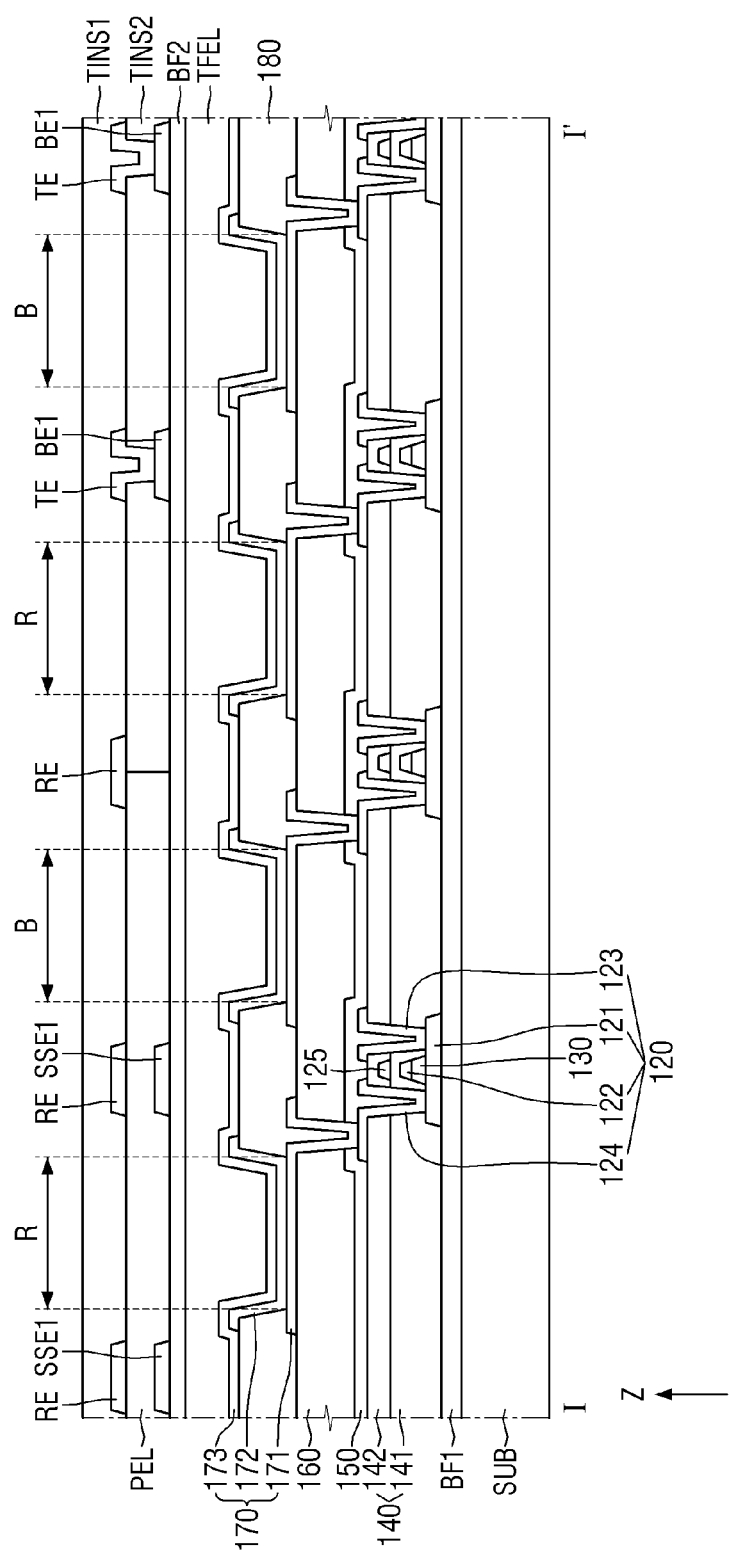
FIG. 14 is a schematic cross-sectional view taken along line I-I' of FIG. 10.
Figure 15:
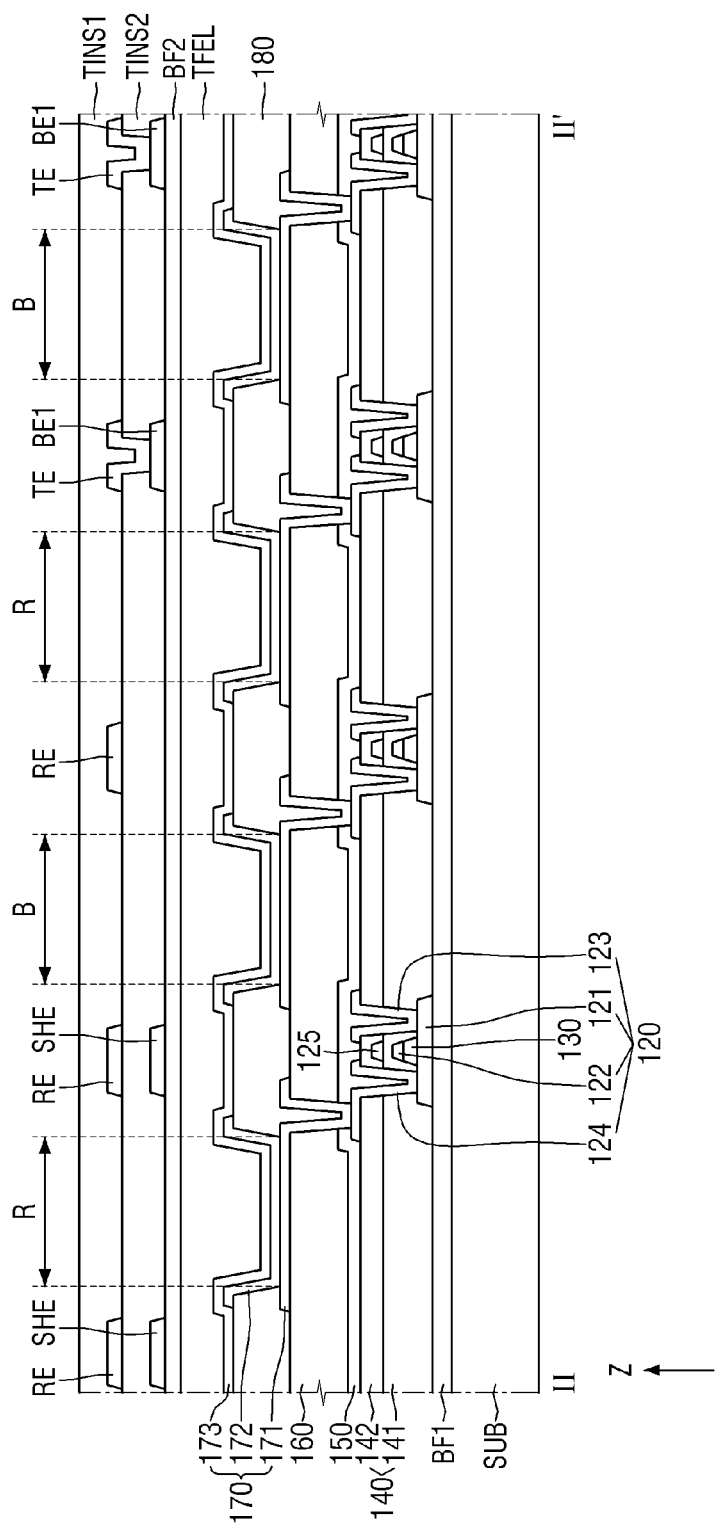
FIG. 15 is a schematic cross-sectional view taken along line II-II' of FIG. 10.

FIG. 14 is a schematic cross-sectional view taken along line I-I' of FIG. 10. FIG. 15 is a schematic cross-sectional view taken along line II-II' of FIG. 10.

An embodiment of FIGS. 14 and 15 may be different from an embodiment of FIGS. 12 and 13 in that a vibration layer PEL may be formed or disposed in a part of the sensor area TSA.

Referring to FIGS. 14 and 15, the vibration layer PEL may be formed or disposed in the portions of the sensor area TSA where the sound units SU is disposed. The vibration layer PEL may be formed or disposed in the area where the first sound electrode SOE1 and the second sound electrode SOE2 may be disposed. A second sensor insulating layer TINS2 may be formed or disposed in the area where the first connection electrodes BE1 and the shielding electrodes SHE may be disposed, instead of the vibration layer PEL.

The second sensor insulating layer TINS2 may be formed or disposed on the first connection electrodes BE1 and the shielding electrodes SHE. The second sensor insulating layer TINS2 may be formed of an organic layer, for example, an acryl resin, an epoxy resin, a phenolic resin, a polyamide resin or a polyimide resin. Alternatively, the second sensor insulating layer TINS2 may include both an inorganic layer and an organic layer.

First contact holes CNT1 may be formed or disposed through the second sensor insulating layer TINS2, via which the first connection electrodes BE1 may be exposed. The driving electrodes TE may be electrically connected to the first connection electrodes BE1 through the first contact holes CNT1. In such case, the first contact holes CNT1 need not be formed or disposed in the vibration layer PEL.

The boundary between the vibration layer PEL and the second sensor insulating layer TINS2 may overlap the sensing electrode RE or the driving electrode TE as shown in FIG. 14, but the disclosure is not limited thereto. The boundary between the vibration layer PEL and the second sensor insulating layer TINS2 may overlap neither the sensing electrode RE nor the driving electrode TE.

The vibration layer PEL and the second sensor insulating layer TINS2 may not overlap each other in the third direction (z-axis direction) as shown in FIG. 14, but the disclosure is not limited thereto. The second sensor insulating layer TINS2 may be disposed on the vibration layer PEL. In such case, the vibration layer PEL and the second sensor insulating layer TINS2 may overlap each other in the third direction (z-axis direction).

Figure 16:
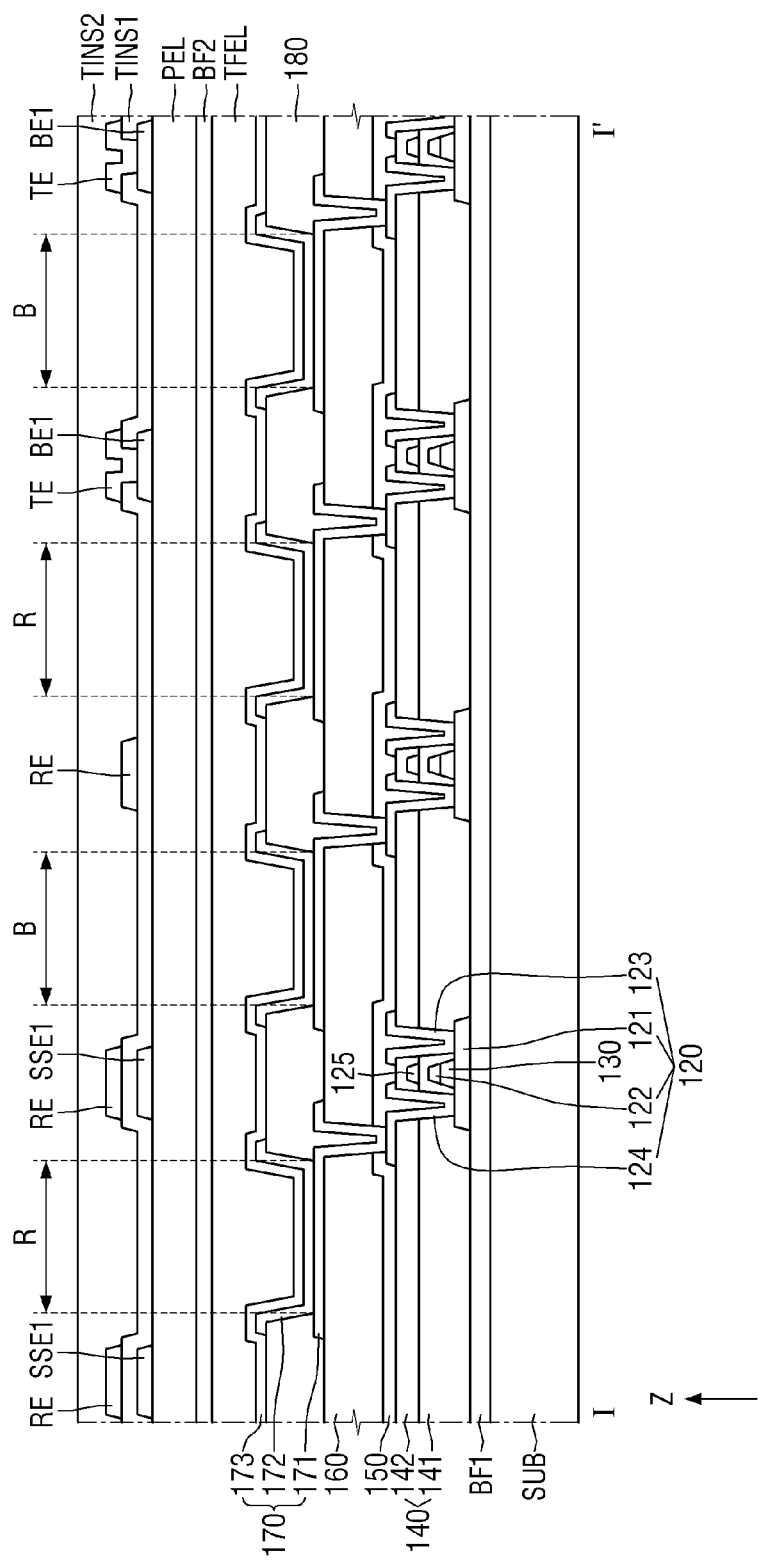
FIG. 16 is a schematic cross-sectional view taken along line I-I' of FIG. 10.
Figure 17:
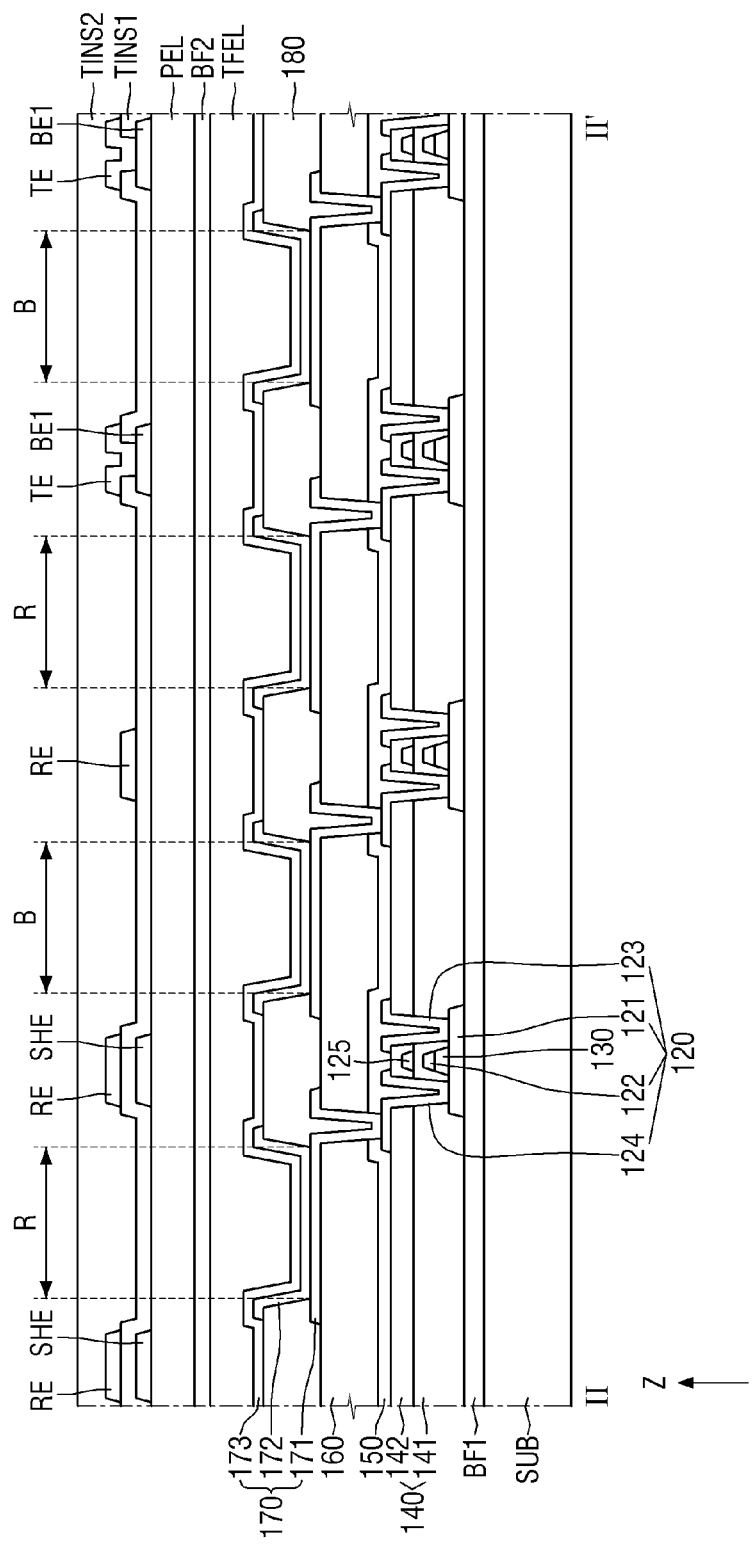
FIG. 17 is a schematic cross-sectional view taken along line II-II' of FIG. 10.

FIG. 16 is a schematic cross-sectional view taken along line I-I' of FIG. 10. FIG. 17 is a schematic cross-sectional view taken along line II-II' of FIG. 10.

An embodiment 16 and 17 may be different from an embodiment of FIGS. 12 and 13 in that first sound electrodes SOE1, second sound electrodes SOE2, shielding electrode SHE and first connection electrodes BE1 may be disposed on a vibration layer PEL.

Referring to FIGS. 16 and 17, the vibration electrode PEL may be disposed on a second buffer layer BF2. The first connection electrodes BE1, the first sound stem electrode SSE1 and the first sound branch electrodes SBE1 of the first sound electrode SOE1, the second sound stem electrode SSE2 and the second sound branch electrodes SBE2 of the second sound electrode SOE2, and the shielding electrode SHE may be formed or disposed on the vibration layer PEL.

A first sensor insulating layer TINS1 may be formed or disposed on the first connection electrodes BE1, the first sound stem electrode SSE1 and the first sound branch electrodes SBE1 of the first sound electrode SOE1, the second sound stem electrode SSE2 and the second sound branch electrodes SBE2 of the second sound electrode SOE2, and the shielding electrode SHE. The first sensor insulating layer TINS1 may be formed of an inorganic layer, for example, a silicon nitride layer, a silicon oxynitride layer, a silicon oxide layer, a titanium oxide layer, or an aluminum oxide layer. Alternatively, the first sensor insulating layer TINS1 may include both an inorganic layer and an organic layer.

The driving electrodes TE, the sensing electrodes RE, the dummy patterns DE, the second connection electrodes BE2, the first driving lines TL1, the second driving lines TL2, the sense lines RL, the first sound lines SOL1, and the second sound lines SOL2 may be formed or disposed on the first sensor insulating layer TINS1. First contact holes CNT1 may be formed or disposed through the first touch second layer TINS1, via which the first connection electrodes BE1 may be exposed. The driving electrodes TE may be electrically connected to the first connection electrodes BE1 through the first contact holes CNT1.

The second sensor insulating layer TINS2 may be formed or disposed on the driving electrodes TE, the sensing electrodes RE, the dummy patterns DE, the second connection electrodes BE2, the first driving lines TL1, the second driving lines TL2, the sense lines RL, the first sound lines SOL1 and the second sound lines SOL2. The second sensor insulating layer TINS2 may be formed of an inorganic layer, for example, a silicon nitride layer, a silicon oxynitride layer, a silicon oxide layer, a titanium oxide layer, or an aluminum oxide layer. Alternatively, the second sensor insulating layer TINS2 may be formed of an organic layer, for example, an acryl resin, an epoxy resin, a phenolic resin, a polyamide resin or a polyimide resin.

As shown in FIG. 16, the first sound electrodes SOE1, the second sound electrodes SOE2 and the vibration layer PEL may be formed or disposed on the sensor electrode layer SENL for sensing a user's touch input. Accordingly, it is possible to sense a user's touch input by using the driving electrodes TE and the sensing electrodes RE of the sensor electrode layer SENL, and it is also possible to output sound by vibrating the vibration layer PEL by the first sound electrode SOE1 and the second sound electrode SOE2 of the sensor electrode layer SENL. Sound may be output by using the sound units incorporated into the display panel 300.

Figure 18:
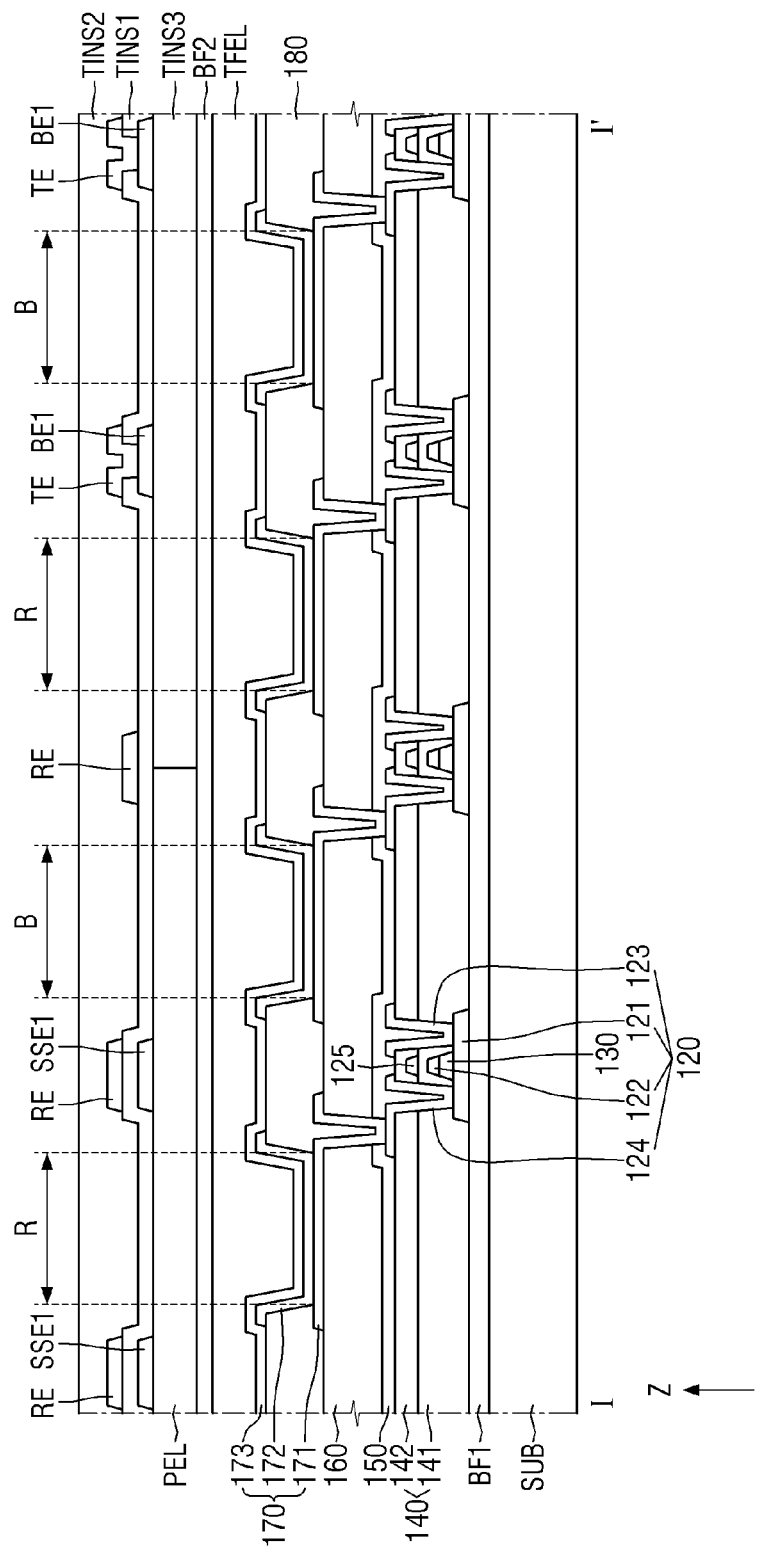
FIG. 18 is a schematic cross-sectional view taken along line I-I' of FIG. 10.
Figure 19:
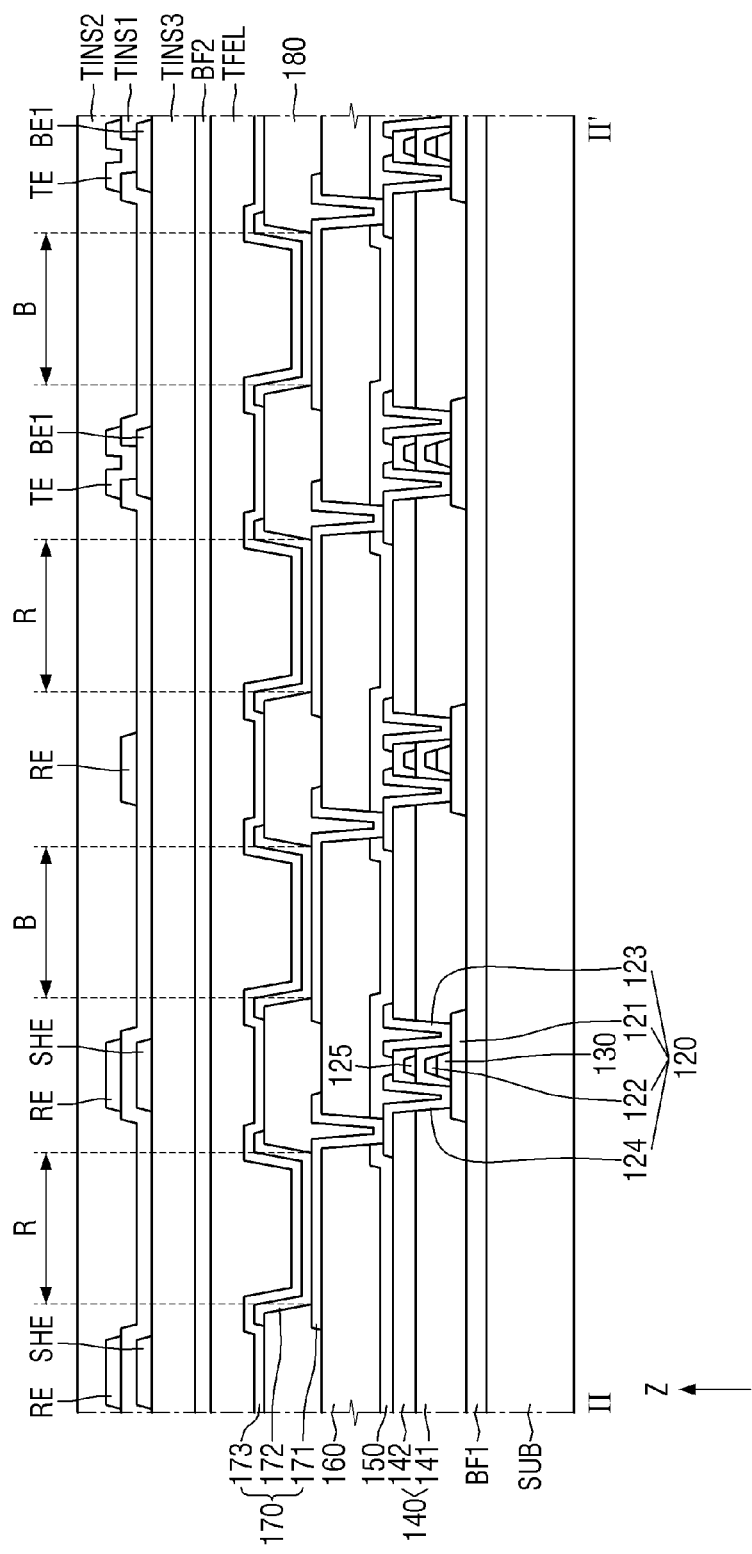
FIG. 19 is a schematic cross-sectional view taken along line II-II' of FIG. 10.

FIG. 18 is a schematic cross-sectional view taken along line I-I' of FIG. 10. FIG. 19 is a schematic cross-sectional view taken along line II-II' of FIG. 10.

An embodiment of FIGS. 18 and 19 may be different from an embodiment of FIGS. 16 and 17 in that a vibration layer PEL may be formed or disposed in a part of the sensor area TSA.

Referring to FIGS. 18 and 19, the vibration layer PEL may be formed or disposed in regions where the sound units SU is disposed in the sensor area TSA. The vibration layer PEL may be formed or disposed in the area where the first sound electrode SOE1 and the second sound electrode SOE2 may be disposed. A third sensor insulating layer TINS3 may be formed or disposed in the region where the first connection electrodes BE1 and the shielding electrodes SHE may be disposed instead of the vibration layer PEL. The third sensor insulating layer TINS3 may be formed of an organic layer, for example, an acryl resin, an epoxy resin, a phenolic resin, a polyamide resin or a polyimide resin. Alternatively, the third sensor insulating layer TINS3 may include both an inorganic layer and an organic layer.

The first sound electrodes SOE1 and the second sound electrodes SOE2 may be formed or disposed on the vibration layer PEL, and the first connection electrodes BE1 and the shielding electrodes SHE may be formed or disposed on the third sensor insulating layer TINS3.

The boundary between the vibration layer PEL and the third sensor insulating layer TINS3 may overlap the sensing electrode RE or the driving electrode TE as shown in FIG. 18, but the disclosure is not limited thereto. The boundary between the vibration layer PEL and the third sensor insulating layer TINS3 may not overlap the sensing electrode RE or the driving electrode TE.

The vibration layer PEL and the third sensor insulating layer TINS3 may not overlap each other in the third direction (z-axis direction) as shown in FIG. 18, but the disclosure is not limited thereto. The third sensor insulating layer TINS3 may be disposed on the vibration layer PEL. In such case, the vibration layer PEL and the third sensor insulating layer TINS3 may overlap each other in the third direction (z-axis direction).

Figure 20:
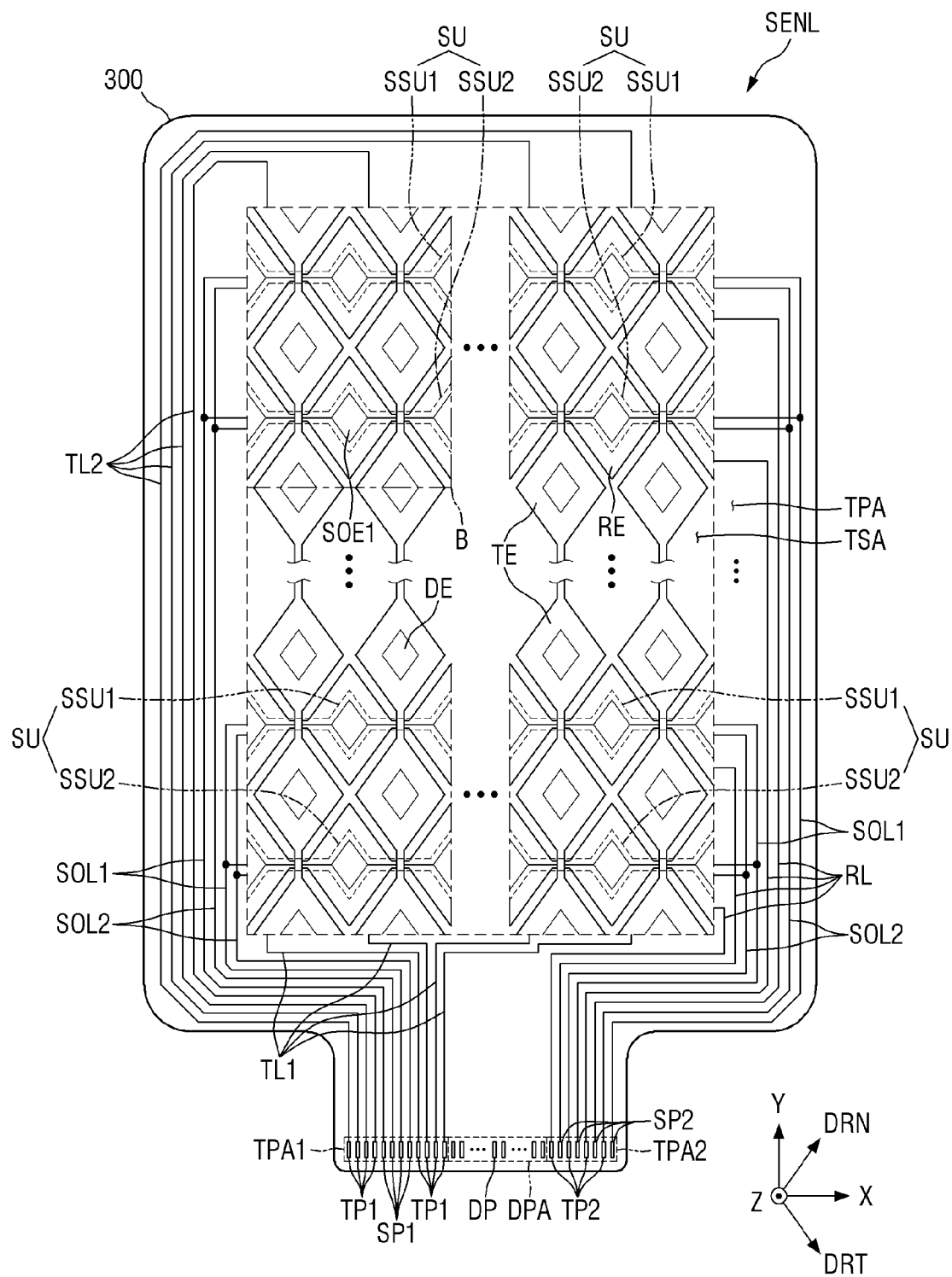
FIG. 20 is a view showing a layout of a sensor electrode layer of a display panel according to an embodiment.
Figure 21:
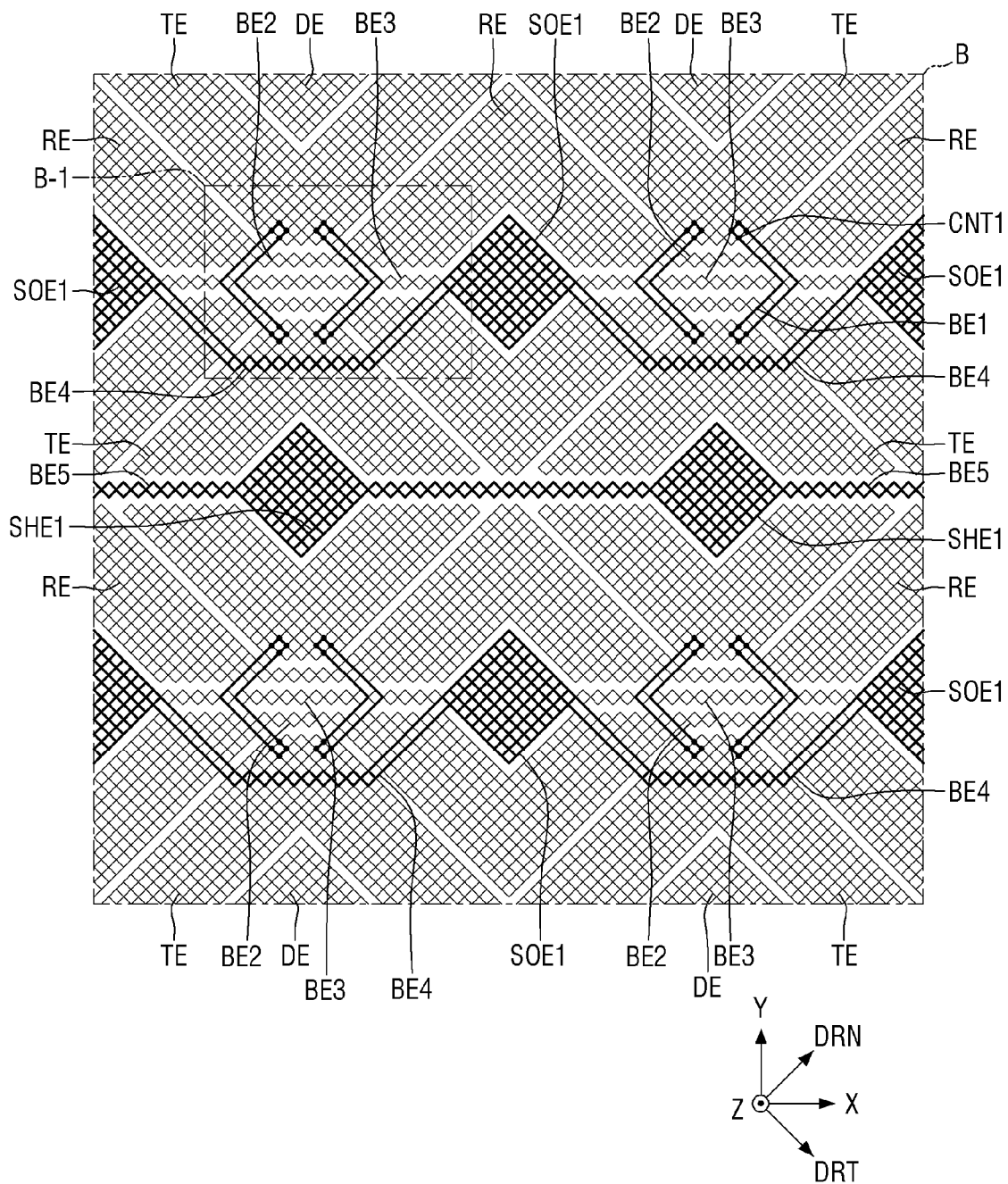
FIG. 21 is an enlarged plan view showing a part of the sensor area of FIG. 20.

FIG. 20 is a view showing a layout of a sensor electrode layer of a display panel according to an embodiment. FIG. 21 is an enlarged plan view showing a part of the sensor area of FIG. 20. FIG. 21 is an enlarged plan view of area B of FIG. 20.

An embodiment of FIGS. 20 and 21 may be different from an embodiment of FIGS. 7 and 8 in that first sound electrodes SOE1 and second sound electrodes SOE2 may overlap each other in the third direction (z-axis direction).

Referring to FIGS. 20 and 21, each of the sound units SU may include subsidiary sound units SSU1 and SSU2. Although each of the sound units SU may include a first subsidiary sound unit SSU1 and a second subsidiary sound unit SSU2 in the example shown in FIG. 20, the number of subsidiary sound units of each of the sound units SU is not limited to two.

Each of the subsidiary sound units SSU1 and SSU2 may include first sound electrodes SOE1, second sound electrodes SOE2, and a vibration layer. Referring to FIGS. 20 and 21, the second sound electrodes SOE2 and the vibration layer are not shown for convenience of illustration.

One of the first sound electrodes SOE1 and one of the second sound electrodes SOE2 of each of the subsidiary sound units SSU1 and SSU2 may overlap each other in the third direction (z-axis direction). A vibration layer may be disposed between the first sound electrode SOE1 and the second sound electrode SOE2 that overlap each other.

The first sound electrodes SOE1 of each of the subsidiary sound units SSU1 and SSU2 may be electrically connected to the first sound line SOL1. In each of the subsidiary sound units SSU1 and SSU2, the first sound electrodes SOE1 adjacent to each other in the first direction (x-axis direction) may be electrically connected to each other. For example, as shown in FIG. 21, in each of the subsidiary sound units SSU1 and SSU2, the first sound electrodes SOE1 adjacent to each other in the first direction (x-axis direction) may be electrically connected through third connection electrodes BE3.

The second sound electrodes SOE2 of each of the subsidiary sound units SSU1 and SSU2 may be electrically connected to the second sound line SOL2. In each of the subsidiary sound units SSU1 and SSU2, the second sound electrodes SOE2 adjacent to each other in the first direction (x-axis direction) may be electrically connected to each other. For example, in each of the subsidiary sound units SSU1 and SSU2, the second sound electrodes SOE2 adjacent to each other in the first direction (x-axis direction) may be electrically connected through fourth connection electrodes BE4. In FIG. 21, 'B-1' represents a predetermined area of the sensor area.

The first sound electrodes SOE1 and the third connection electrodes BE3 of the subsidiary sound units SSU1 and SSU2 may be made of the same or similar material on the same layer as the driving electrodes TE, the sensing electrodes RE and the dummy patterns DE. The first sound electrodes SOE1 and the third connection electrodes BE3 of each of the subsidiary sound units SSU1 and SSU2 may be electrically separated from the driving electrodes TE, the sensing electrodes RE and the dummy patterns DE. The first sound electrodes SOE1 and the third connection electrodes BE3 of the subsidiary sound units SSU1 and SSU2 may be spaced apart from the driving electrodes TE, the sensing electrodes RE and the dummy patterns DE.

The second sound electrodes SOE2 and the fourth connection electrodes BE4 of the subsidiary sound units SSU1 and SSU2 may be made of the same or similar material on the same layer as the first connection electrodes BE1. The second sound electrodes SOE2 and the fourth connection electrodes BE4 of each of the subsidiary sound units SSU1 and SSU2 may be electrically separated from the first connection electrodes BE1. The second sound electrodes SOE2 and the fourth connection electrodes BE4 of the subsidiary sound units SSU1 and SSU2 may be spaced apart from the first connection electrodes BE1.

The first sound electrodes SOE1 of the subsidiary sound units SSU1 and SSU2 may be disposed instead of some or a predetermined number of dummy patterns DE. As an example, some or a predetermined number of dummy patterns DE may be eliminated, and the first sound electrodes SOE1 of the subsidiary sound units SSU1 and SSU2 may be disposed in the places where the dummy patterns DE may be eliminated.

Each of the first sound electrodes SOE1 of the subsidiary sound units SSU1 and SSU2 may be surrounded by or may be adjacent to the sensing electrode RE as shown in FIGS. 20 and 21. It is, however, to be understood that the disclosure is not limited thereto. For example, each of the first sound electrodes SOE1 of the sub sound units SSU1 and SSU2 may be disposed to be surrounded by or may be adjacent to the driving electrode TE. In such case, in each of the sound units SU, the first sound electrodes SOE1 adjacent to each other in the second direction (y-axis direction) may be electrically connected, and the second sound electrodes SOE2 adjacent to each other in the second direction (y-axis direction) may be electrically connected.

As shown in FIGS. 20 and 21, in each of the subsidiary sound units SSU1 and SSU2, a first sound driving voltage may be applied to the first sound electrode SOE1 through the first sound line SOL1, and a second sound driving voltage may be applied to the second sound electrode SOE2 through the second sound line SOL2. Therefore, each of the subsidiary sound units SSU1 and SSU2 vibrates the vibration layer disposed between the first sound electrode SOE1 and the second sound electrode by the first sound driving voltage and the second sound driving voltage, thereby outputting sound. Sound may be output by using the sound units incorporated into the display panel 300.

On the other hand, first shielding electrodes SHE1 and second shielding electrodes SHE2 may be disposed between the subsidiary sound units SSU1 and SSU2. For example, the first shielding electrode SHE1 may be disposed between the first sound electrode SOE1 of the first subsidiary sound unit SSU1 and the second sound electrode SOE2 of the second subsidiary sound unit SSU2. In addition, the second shielding electrode SHE2 may be disposed between the second sound electrode SOE2 of the first subsidiary sound unit SSU1 and the second sound electrode SOE2 of the second subsidiary sound unit SSU2.

Each of the first shielding electrodes SHE1 may be surrounded by or may be adjacent to the driving electrode TE. The first shielding electrodes SHE1 adjacent to one another in the first direction (x-axis direction) may be electrically connected to one another through fifth connection electrodes BE5. The first shielding electrodes SHE1 electrically connected to each other in the first direction (x-axis direction) may be electrically connected to a first shielding line. The first shielding line may be electrically connected to one of the sound pads SP1 and SP2. Therefore, the first shielding electrodes SHE1 may be electrically connected to the sound driver 340.

The second shielding electrodes SHE2 adjacent to one another in the first direction (x-axis direction) may be electrically connected to one another through sixth connection electrodes BE6. The second shielding electrodes SHE2 electrically connected to each other in the first direction (x-axis direction) may be electrically connected to a second shielding line. The second shielding line may be electrically connected to another one of the sound pads SP1 and SP2. Therefore, the second shielding electrodes SHE2 may be electrically connected to the sound driver 340.

One of the first shielding electrodes SHE1 may overlap one of the second shielding electrodes SHE2 in the third direction (z-axis direction). The first shielding electrodes SHE1 may be made of the same or similar material on the same layer as the first sound electrodes SOE1. The second shielding electrodes SHE2 may be made of the same or similar material on the same layer as the second sound electrodes SOE2.

Figure 27:
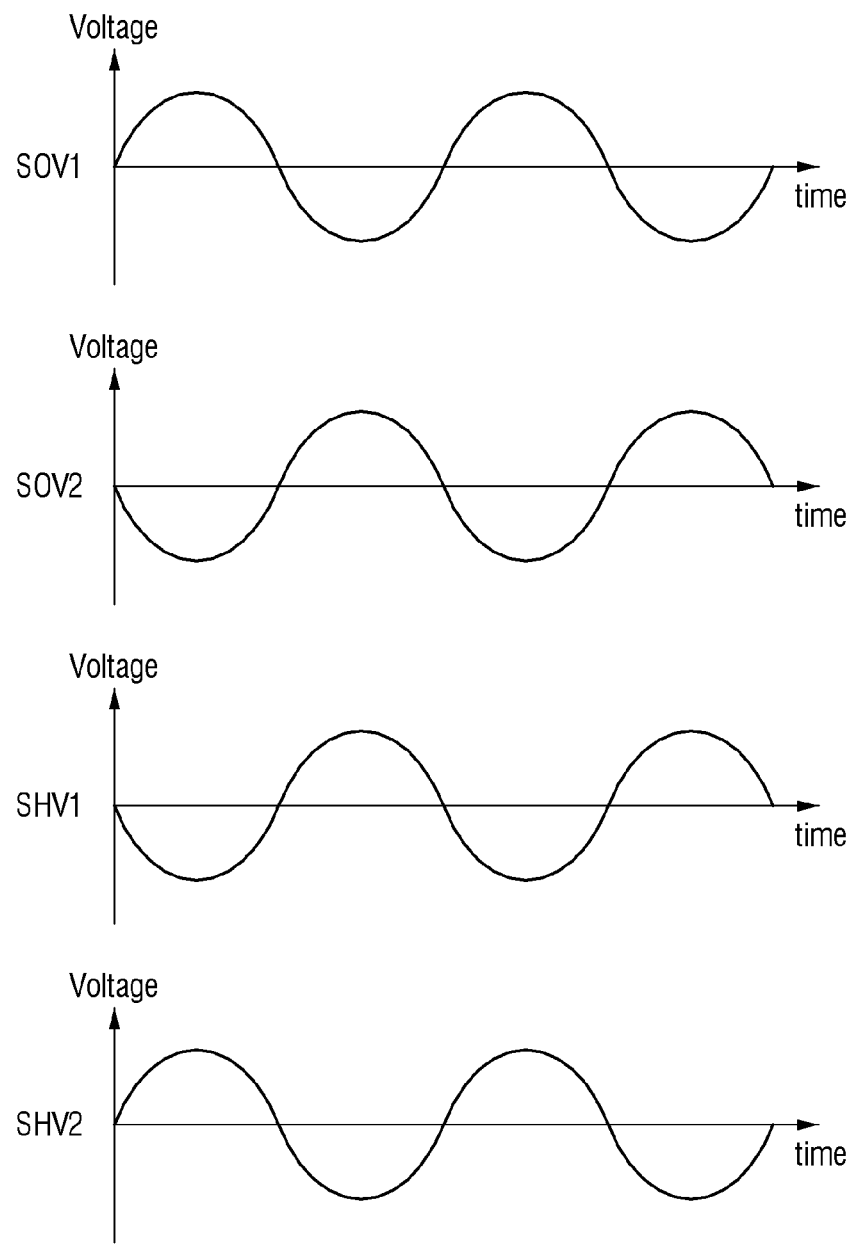
FIG. 27 is a waveform diagram showing a first sound driving voltage applied to the first sound electrode, a second sound driving voltage applied to the second sound electrode, a first shielding voltage applied to the first shielding electrode, and a second shielding voltage applied to the second shielding electrode.

The sound driver 340 may apply the first shielding driving voltage to the first shielding electrodes SHE1 and the second shielding driving voltage to the second shielding voltages SHE2. As shown in FIG. 27, the first shielding driving voltage SHV1 applied to the first shielding electrodes SHE1 may be substantially equal to the second sound driving voltage applied to the second sound electrodes SOE2 of the first subsidiary sound unit SSU1. The second shielding driving voltage SHV2 applied to the second shielding electrodes SHE2 may be substantially equal to the first sound driving voltage SOV1 applied to the first sound electrodes SOE1 of the first subsidiary sound unit SSU1. Since the vibration layer PEL is disposed between the first shielding electrodes SHE1 and the second shielding electrodes SHE2, the vibration layer PEL may be vibrated by the first shielding driving voltage SHV1 and the second shielding driving voltage SHV2 so that a shielded sound may be output. Therefore, by vibrating the vibration layer PEL with the first shielding electrode SHE1 and the second shielding electrode SHE2, it is possible to suppress the vibration or sound generated by the first subsidiary sound unit SSU1 from affecting the vibration or sound generated by the second substrate sound unit SSU2.

Figure 22:
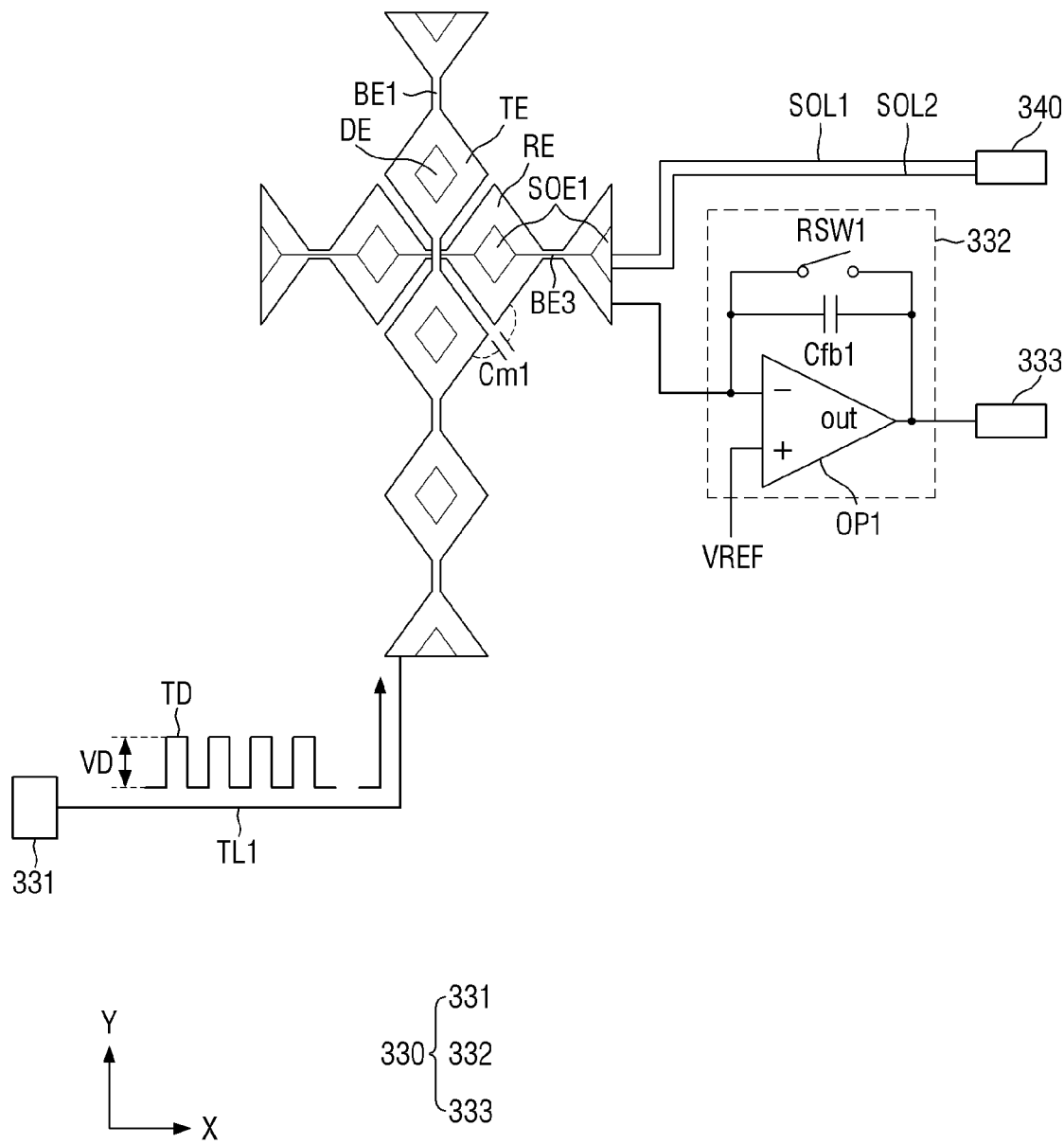
FIG. 22 is a view showing an example of a sensor driver electrically connected to the driving electrodes and the sensing electrodes, and a sound driver electrically connected to the first sound electrodes and the second sound electrodes of FIG. 20.

FIG. 22 is a view showing an example of a sensor driver electrically connected to the driving electrodes and the sensing electrodes, and a sound driver electrically connected to the first sound electrodes and the second sound electrodes of FIG. 20.

An embodiment of FIG. 22 may be different from an embodiment of FIG. 9 in that the first sound electrodes SOE1 may be electrically connected to the sound driver 340 through the first sound line SOL1, and the second sound electrodes may be electrically connected to the sound driver 340 through the second sound line SOL2. The second sound electrodes are not shown in FIG. 22 for convenience of illustration.

Referring to FIG. 22, the first sound electrodes SOE1 adjacent to each other in the first direction (x-axis direction) may be electrically connected through third connection electrodes BE3. Therefore, the first sound electrodes SOE1 electrically connected with one another in the first direction (x-axis direction) may be electrically connected to the sound driver 340 through the first sound line SOL1.

In addition, second sound electrodes adjacent to each other in the first direction (x-axis direction) may be electrically connected through fourth connection electrodes BE4. Therefore, the second sound electrodes electrically connected with one another in the first direction (x-axis direction) may be electrically connected to the sound driver 340 through the second sound line SOL2. The second sound electrodes may overlap the first sound electrodes SOE1 in the third direction (z-axis direction).

The sound driver 340 may apply the first sound driving voltage to the first sound electrodes SOE1 through the first sound line SOL1 and may apply the second sound driving voltage to the second sound electrodes through the second sound line SOL2. Therefore, each of the subsidiary sound units SSU1 and SSU2 vibrates the vibration layer disposed between the first sound electrode SOE1 and the second sound electrode by the first sound driving voltage and the second sound driving voltage, thereby outputting sound.

Figure 23:
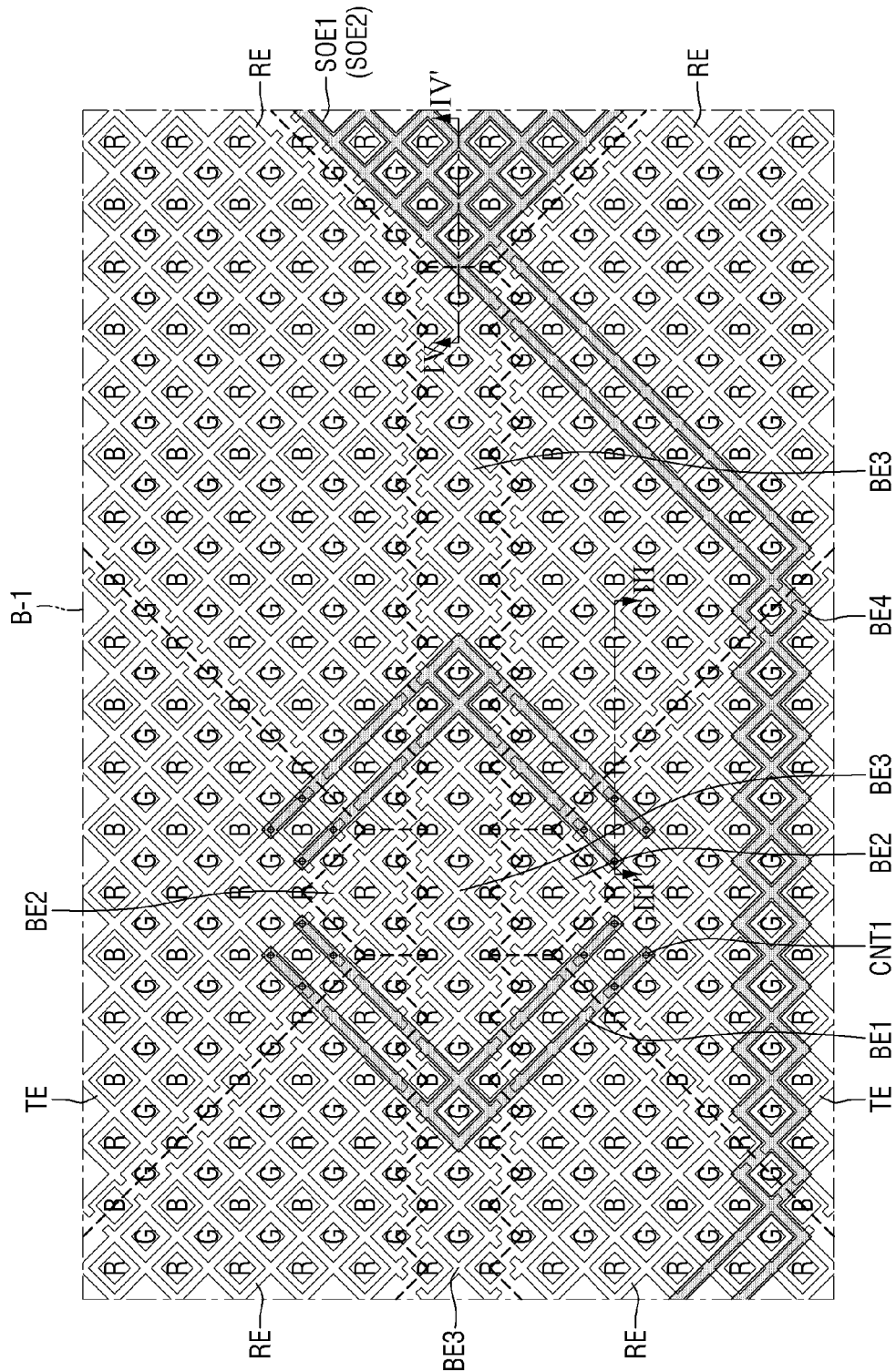
FIG. 23 is an enlarged plan view showing the driving electrodes, the sensing electrodes, the first sound electrode, the first connection electrodes, the second connection electrode and the third connection electrode of FIG. 22.

FIG. 23 is an enlarged plan view showing the driving electrodes, the sensing electrodes, the first sound electrode, the first connection electrodes, the second connection electrode and the third connection electrode of FIG. 22.

Referring to FIG. 23, the driving electrodes TE, the sensing electrodes RE, the first connection electrodes BEL the second connection electrode BE2, the third connection electrode BE3, the fourth connection electrode BE4, the first sound electrode SOE1 and the second sound electrode SOE2 may be formed in a mesh topology when viewed from the top.

The driving electrodes TE, the sensing electrodes RE, the first sound electrode SOE1, the second connection electrode BE2 and the third connection electrode BE3 may be formed or disposed in the same layer, and thus they may be spaced apart from each other. There may be a gap between the driving electrode TE and the sensing electrode RE, between the driving electrode TE and the second connection electrode BE2, between the sensing electrode RE and the first sound electrode SOE1, between the second connection electrode BE3 and the third connection electrode BE3 and between the sensing electrode RE and the third connection electrode BE3. For convenience of illustration, the boundary between the driving electrode TE and the sensing electrode RE, the boundary between the driving electrode TE and the second connection electrode BE2, the boundary between the sensing electrode RE and the first sound electrode SOE1, the boundary between the second connection electrode BE2 and the third connection electrode BE3, and the boundary between the sensing electrode RE and the third connection electrode BE3 are indicated by dashed lines in FIG. 23. Since the first connection electrodes BE1, the fourth connection electrode BE4 and the second sound electrode SOE2 may be formed or disposed on the same layer, they may be spaced apart from one another.

The first connection electrodes BE1 and the second connection electrodes BE2 may be substantially identical to those described above with reference to FIG. 10. The sub-pixels R, G and B may be substantially identical to those described above with reference to FIG. 10.

One end of the third connection electrode BE3 may be electrically connected to one of the first sound electrodes SOE1 adjacent to each other in the first direction (x-axis direction), and the other end thereof may be electrically connected to another one of them. The third connection electrode BE3 may overlap the first connection electrode BE1 in the third direction (z-axis direction). Since the third connection electrode BE3 is formed or disposed on a different layer from the first connection electrode BE1, no short-circuit is formed or disposed between the third connection electrode BE3 and the first connection electrode BE1 even though they overlap each other in the third direction (z-axis direction).

One end of the fourth connection electrode BE4 may be electrically connected to one of the second sound electrodes SOE1 adjacent to each other in the first direction (x-axis direction), and the other end thereof may be electrically connected to another one of them. The fourth connection electrode BE4 may be bent at least twice as shown in FIG. 23. The fourth connection electrode BE4 may overlap the driving electrode TE and the sensing electrode RE in the third direction (z-axis direction). Since the fourth connection electrode BE4 is formed or disposed on a different layer from the driving electrode TE and the sensing electrode RE, no short-circuit is formed or disposed between the driving electrode TE and the sensing electrode RE even though the fourth connection electrode BE4 overlaps the driving electrode TE and the sensing electrode RE in the third direction (z-axis direction).

Figure 24:
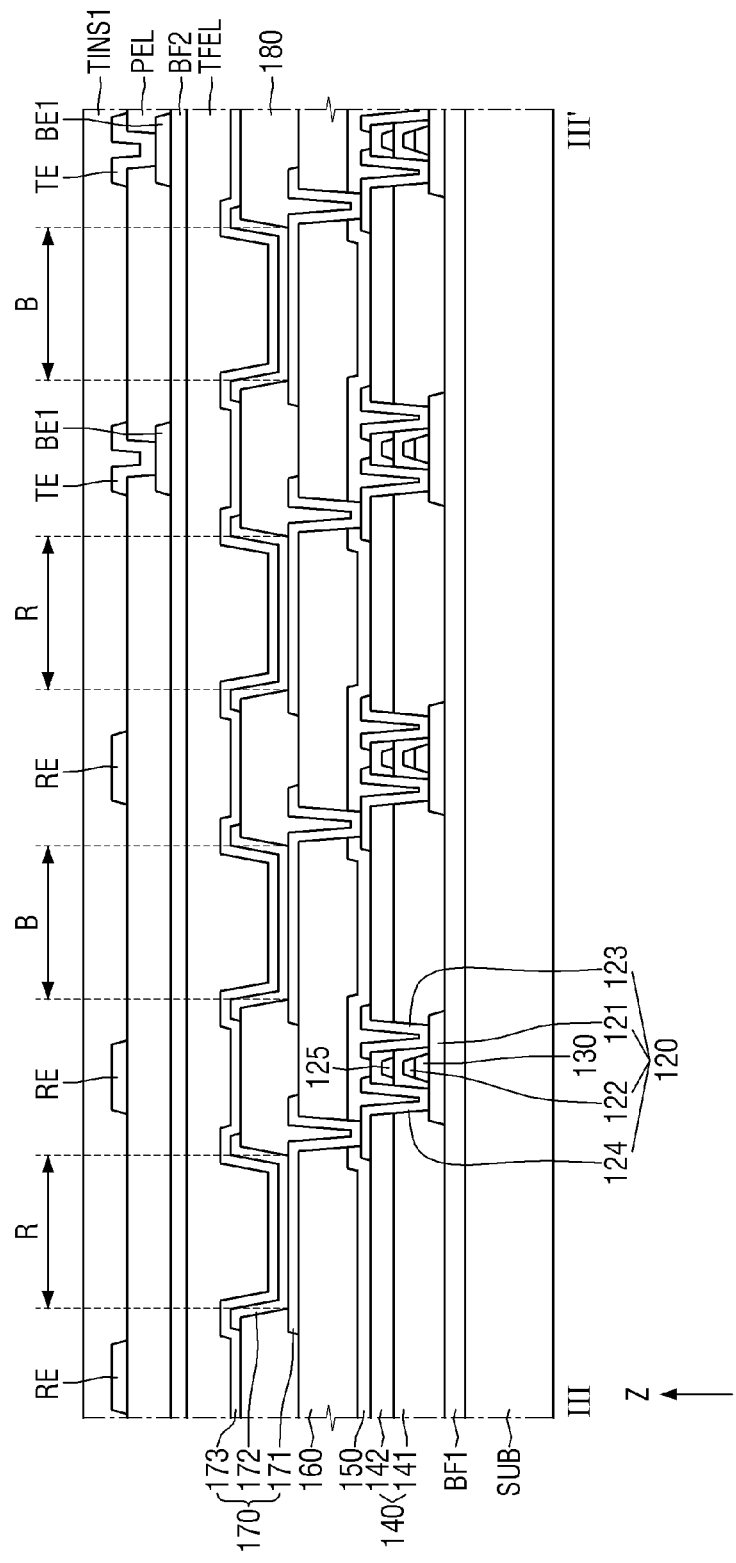
FIG. 24 is a schematic cross-sectional view taken along line III-III' of FIG. 23.
Figure 25:
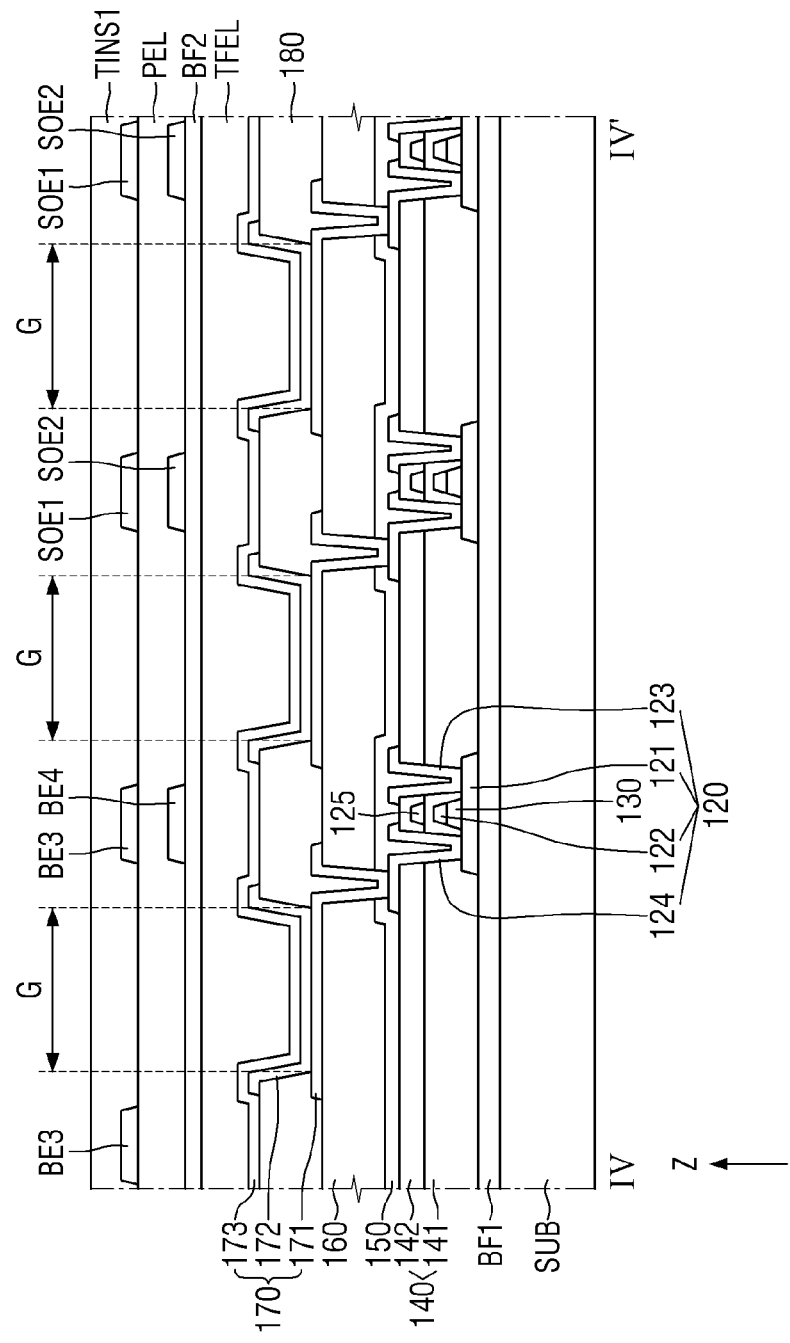
FIG. 25 is a schematic cross-sectional view of an example, taken along line IV-IV' of FIG. 23.

FIG. 24 is a schematic cross-sectional view taken along line III-III' of FIG. 23. FIG. 25 is a schematic cross-sectional view of an example, taken along line IV-IV' of FIG. 23.

An embodiment 24 and 25 may be different from an embodiment of FIGS. 11 and 12 in that a second sound electrode SOE2 may be disposed on a second buffer layer BF2, and a first sound electrode SOE1 may be disposed on a vibration layer PEL.

Referring to FIGS. 24 and 25, second sound electrodes SOE2 and first connection electrodes BE1 may be formed or disposed on the second buffer layer BF2. In addition, fourth connection electrodes BE4 may be formed or disposed on the second buffer layer BF2. The vibration layer PEL may be formed or disposed on the second sound electrodes SOE2, the first connection electrodes BE1, and the fourth connection electrodes BE4.

Figure 26:
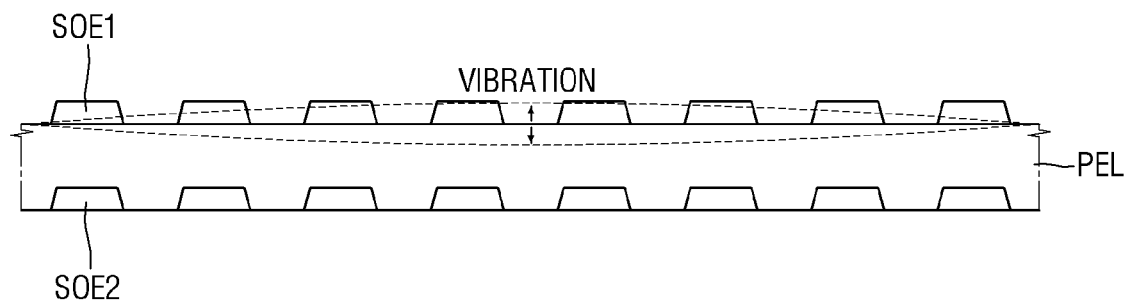
FIG. 26 is a view showing an example of a change of the vibration layer according to the voltage applied to the first sound electrode and the second sound electrode of FIG. 22.

The vibration layer PEL may be mechanically deformed by the inverse piezoelectric effect in a case that the first sound driving voltage is applied to the first sound electrode SOE1 and the second sound driving voltage is applied to the second sound electrode SOE2. For example, in a case that a positive first sound driving voltage is applied to the first sound electrode SOE1 and a negative second sound driving voltage is applied to the second sound electrode SOE2, and then a negative first driving voltage is applied to the first sound electrode SOE1 and a positive second sound driving voltage is applied the second sound electrode SOE2, the vibration layer PEL may repeat expansion and contraction. Accordingly, it may vibrate in the third direction (z-axis direction) as shown in FIG. 26. In addition, in a case that the vibration layer PEL is mechanically deformed, it may generate voltage on the first sound electrode SOE1 and the second sound electrode SOE2 by the piezoelectric effect. Each of the sound units SU may output sound by vibrating the vibration layer PEL by the inverse piezoelectric effect as shown in FIG. 26.

The driving electrodes TE, the sensing electrodes RE, the first sound electrodes SOE1, and the third connection electrodes BE3 may be formed or disposed on the vibration layer PEL. First contact holes CNT1 may be formed or disposed through the vibration layer PEL to expose the first connection electrodes BE1. The driving electrodes TE may be electrically connected to the first connection electrodes BE1 through the first contact holes CNT1. The first sensor insulating layer TINS1 may be formed or disposed on the driving electrodes TE, the sensing electrodes RE, the first sound electrodes SOE1, and the third connection electrodes BE3.

As shown in FIGS. 24 and 25, the first sound electrodes SOE1, the second sound electrodes SOE2 and the vibration layer PEL may be formed or disposed on the sensor electrode layer SENL for sensing a user's touch input. Accordingly, it is possible to sense a user's touch input by using the driving electrodes TE and the sensing electrodes RE of the sensor electrode layer SENL, and it is also possible to output sound by vibrating the vibration layer PEL by the first sound electrode SOE1 and the second sound electrode SOE2 of the sensor electrode layer SENL. Sound may be output by using the sound units incorporated into the display panel 300.

Figure 28:
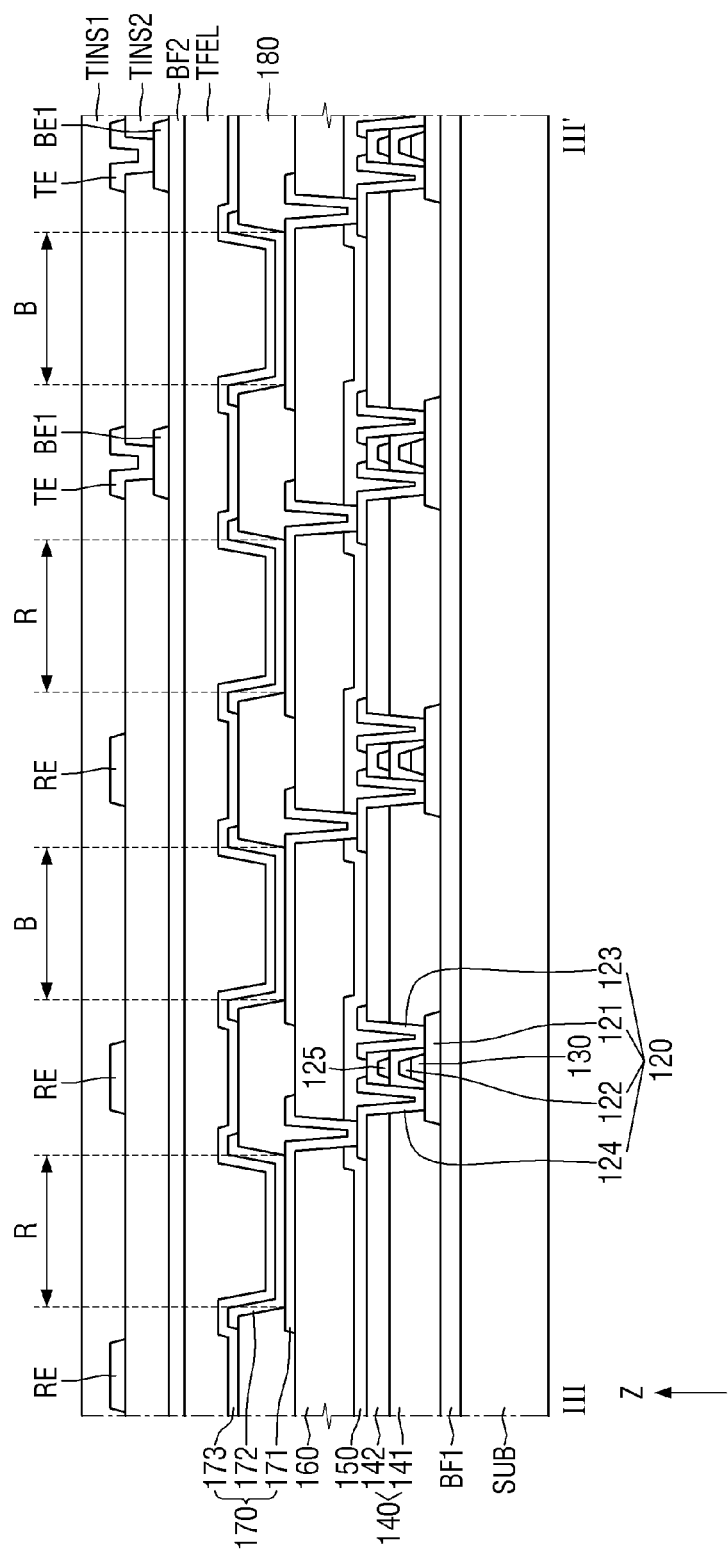
FIG. 28 is a schematic cross-sectional view taken along line III-III' of FIG. 23.

FIG. 28 is a schematic cross-sectional view taken along line III-III' of FIG. 23.

An embodiment of FIG. 28 may be different from an embodiment of FIG. 24 in that a vibration layer PEL may be formed or disposed in a part of a sensor area TSA.

Referring to FIG. 28, the vibration layer PEL may be formed or disposed in the portions of the sensor area TSA where the sound units SU is disposed. The vibration layer PEL may be formed or disposed in the area where the first sound electrode SOE1 and the second sound electrode SOE2 may be disposed. In addition, the vibration layer PEL may be formed or disposed in the areas where the first shielding electrode SHE1 and the second shielding electrode SHE2 may be disposed. A second sensor insulating layer TINS2 may be formed or disposed in the area where the first connection electrodes BE1 may be disposed, instead of the vibration layer PEL.

The second sensor insulating layer TINS2 may be formed or disposed on the first connection electrodes BE1. The second sensor insulating layer TINS2 may be formed of an organic layer, for example, an acryl resin, an epoxy resin, a phenolic resin, a polyamide resin or a polyimide resin. Alternatively, the second sensor insulating layer TINS2 may include both an inorganic layer and an organic layer.

First contact holes CNT1 may be formed or disposed through the second sensor insulating layer TINS2, via which the first connection electrodes BE1 may be exposed. The driving electrodes TE may be electrically connected to the first connection electrodes BE1 through the first contact holes CNT1. In such case, the first contact holes CNT1 need not be formed or disposed in the vibration layer PEL.

Figure 29:
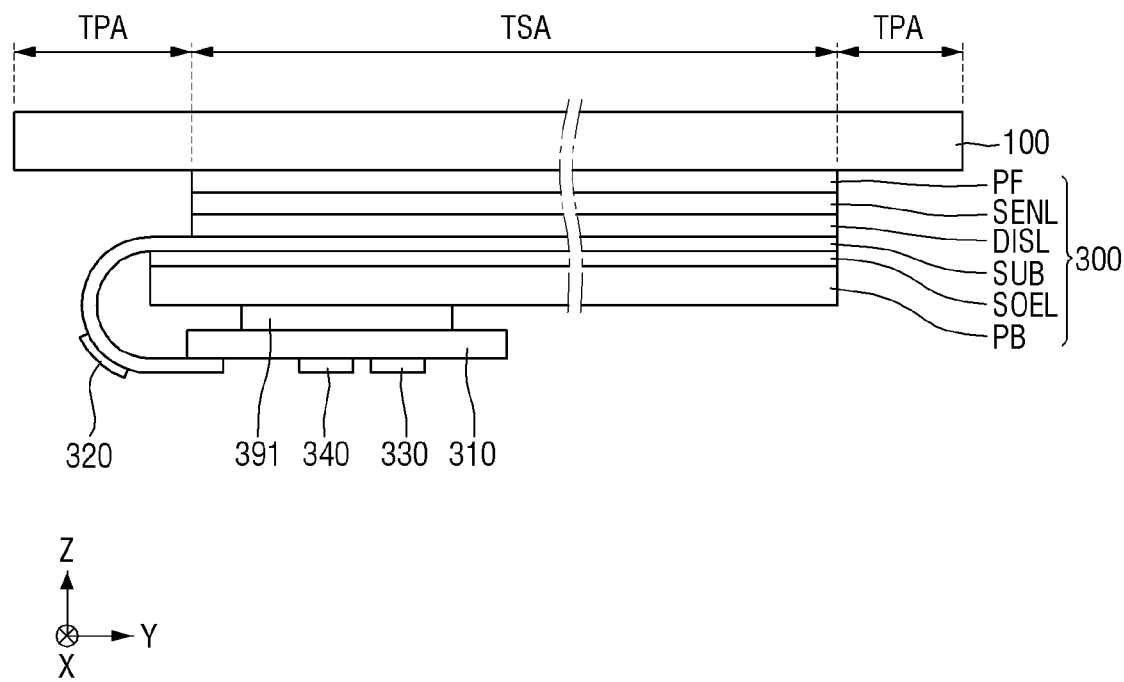
FIG. 29 is a side view showing an example of the display panel of FIG. 4.

FIG. 29 is a side view showing an example of the display panel of FIG. 4. FIG. 29 shows a side view of the display panel 300 with the subsidiary area SBA bent and disposed on the lower surface of the display panel 300.

An embodiment of FIG. 29 may be different from an embodiment of FIG. 5 in that a sound electrode layer SOEL including sound electrodes may be disposed between the substrate SUB and the bottom panel cover PB. According to an embodiment of FIG. 29, sound electrodes may not be included in the sensor electrode layer SENL.

Figure 30:
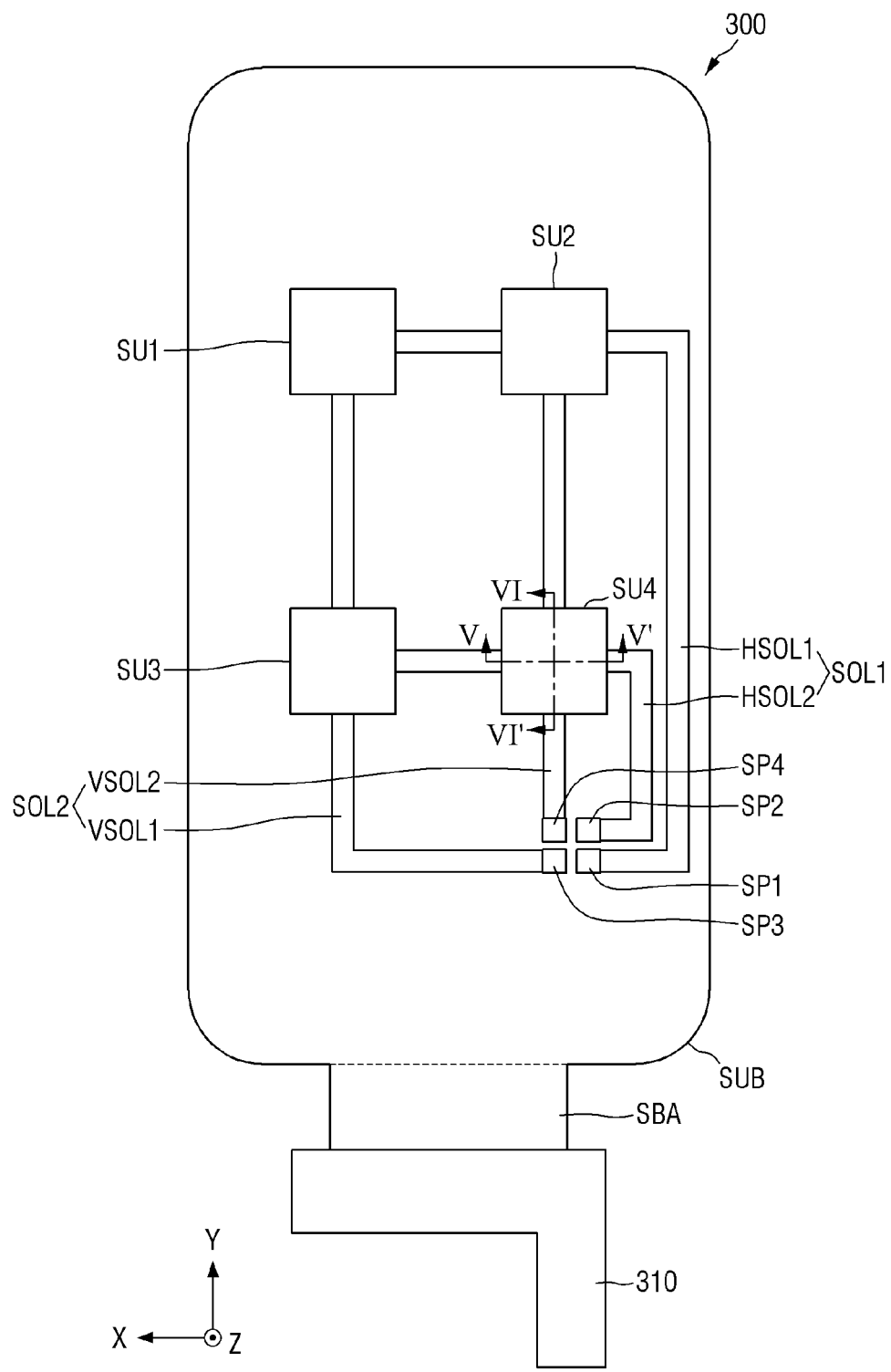
FIGS. 30 and 31 are views showing a layout of a sound electrode layer of a display panel according to an embodiment.
Figure 31:
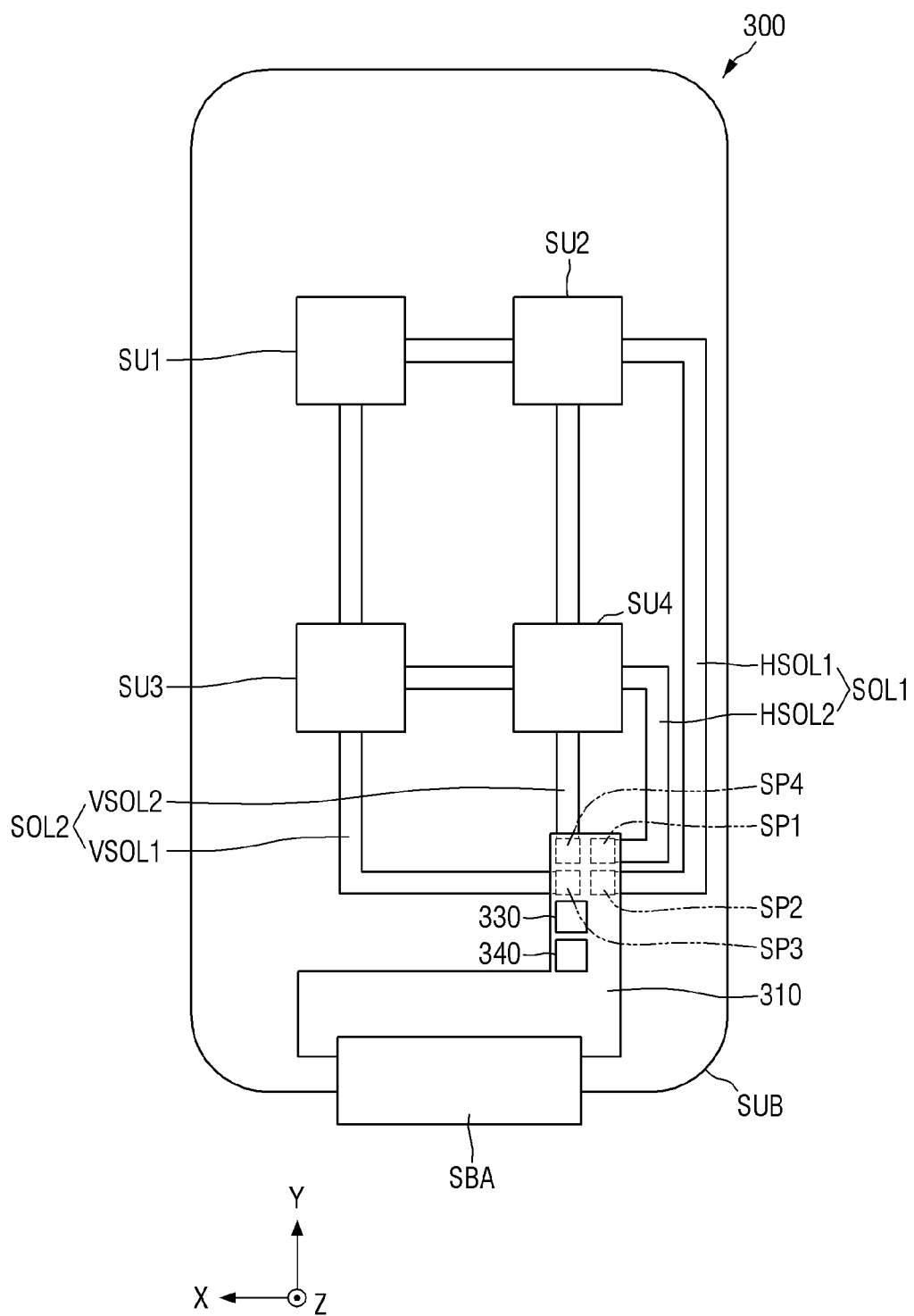
Figure 32:
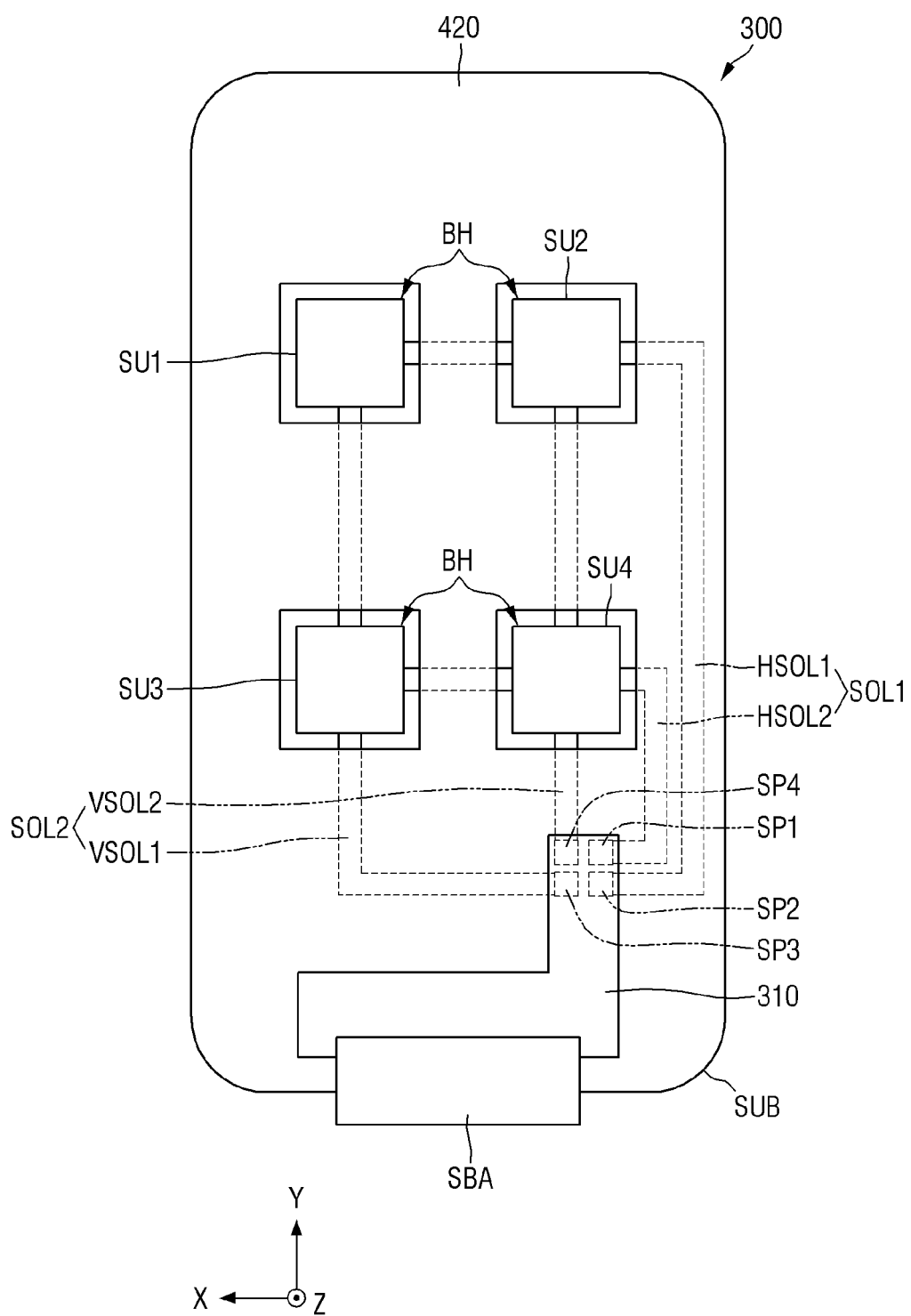
FIG. 32 is a view showing sound units of a sound electrode layer of a display panel and a buffer of a bottom panel cover according to an embodiment.

FIGS. 30 and 31 are views showing a layout of a sound electrode layer of a display panel according to an embodiment. FIG. 32 is a view showing sound units of a display panel and a buffer of a bottom panel cover according to an embodiment.

FIGS. 30 and 31 show sound electrodes disposed on the lower surface of the substrate SUB of a display panel according to an embodiment. FIG. 30 shows a layout of the lower surface of the display panel 300 with the subsidiary area SBA unfolded. FIG. 31 shows a layout of the lower surface of the display panel 300 with the subsidiary area SBA bent and disposed on the lower surface. FIG. 32 shows sound units SU1, SU2, SU3 and SU4 and the buffer 420 of the bottom panel cover PB disposed on the lower surface of the substrate SUB of the display panel 300.

Referring to FIGS. 30 and 31, the sound units SU1, SU2, SU3 and SU4 may be disposed on the lower surface of the substrate SUB of the display panel 300. Although the four sound units SU1, SU2, SU3 and SU4 may be disposed on the lower surface of the substrate SUB of the display panel 300 in the example shown in FIGS. 30 and 31, the number of the sound units SU1, SU2, SU3 and SU4 is not limed to four.

Each of the sound units SU1, SU2, SU3 and SU4 may include a first sound electrode, a second sound electrode, and a vibration layer. The first sound electrode, the second sound electrode and the vibration layer may overlap each other in the third direction (z-axis direction). The vibration layer may be disposed between the first sound electrode and the second sound electrode. The vibration layer may be mechanically deformed by the inverse piezoelectric effect in a case that the first sound driving voltage is applied to the first sound electrode and the second sound driving voltage is applied to the second sound electrode. In addition, in a case that the vibration layer is mechanically deformed, it may generate voltage on the first sound electrode and the second sound electrode by the piezoelectric effect. Each of the sound units SU may output sound by vibrating the vibration layer by the inverse piezoelectric effect.

The first sound electrode of the first sound unit SU1 and the first sound electrode of the second sound unit SU2 arranged or disposed in the first direction (x-axis direction) may be electrically connected to a first horizontal sound line HSOL1 of the first sound line SOL1. The first sound electrode of the third sound unit SU3 and the first sound electrode of the fourth sound unit SU4 arranged or disposed in the first direction (x-axis direction) may be electrically connected to a second horizontal sound line HSOL2 of the first sound line SOL1.

The second sound electrode of the first sound unit SU1 and the second sound electrode of the third sound unit SU3 arranged or disposed in the second direction (y-axis direction) may be electrically connected to a first vertical sound line VSOL1 of the second sound line SOL2. The second sound electrode of the second third sound unit SU2 and the second sound electrode of the fourth sound unit SU4 arranged or disposed in the second direction (y-axis direction) may be electrically connected to a second vertical sound line VSOL2 of the second sound line SOL2.

The first horizontal connection line HSOL1 may be electrically connected to a first sound pad SP1, the second horizontal connection line HSOL2 may be electrically connected to a second sound pad SP2, the first vertical connection line VSOL1 may be electrically connected to a third sound pad SP3, and the second vertical connection line VSOL2 may be electrically connected to a fourth sound pad SP4. In a case that the subsidiary area SBA is bent and disposed on the lower surface of the display panel 300, the first sound pad SP1, the second sound pad SP2, the third sound pad SP3 and the fourth sound pad SP4 may overlap the display circuit board 310 in the third direction (z-axis direction). Accordingly, the first sound pad SP1, the second sound pad SP2, the third sound pad SP3 and the fourth sound pad SP4 may be electrically connected to the display circuit board 310. Therefore, the first horizontal connection line HSOL1, the second horizontal connection line HSOL2, the first vertical connection line VSOL1 and the second vertical connection line VSOL2 may be electrically connected to the sound driver 340 disposed on the display circuit board 310.

In order to output sound by vibrating the vibration layer of the first sound unit SU1, the sound driver 340 may apply a first horizontal sound driving voltage to the first horizontal sound line HSOL1 and may apply a first vertical sound driving voltage to the first vertical sound line VSOL1. In order to output sound by vibrating the vibration layer of the second sound unit SU2, the sound driver 340 may apply the first horizontal sound driving voltage to the first horizontal sound line HSOL1 and may apply a second vertical sound driving voltage to the second vertical sound line VSOL2. In order to output sound by vibrating the vibration layer of the third sound unit SU3, the sound driver 340 may apply a second horizontal sound driving voltage to the second horizontal sound line HSOL2 and may apply the first vertical sound driving voltage to the first vertical sound line VSOL1. In order to output sound by vibrating the vibration layer of the fourth sound unit SU4, the sound driver 340 may apply the second horizontal sound driving voltage to the second horizontal sound line HSOL2 and may apply the second vertical sound driving voltage to the second vertical sound line VSOL2.

In order to output sound by the first sound unit SU1 and the second sound unit SU2, the sound driver 340 may apply the first horizontal sound driving voltage to the first horizontal sound line HSOL1, may apply the first vertical sound driving voltage to the first vertical sound line VSOL1, and may apply the second vertical sound driving voltage to the second vertical sound line VSOL2. In order to output sound by the first sound unit SU1 and the third sound unit SU3, the sound driver 340 may apply the first horizontal sound driving voltage to the first horizontal sound line HSOL1, may apply the second horizontal sound driving voltage to the second horizontal sound line HSOL2, and may apply the first vertical sound driving voltage to the first vertical sound line VSOL1. In order to output sound by the second sound unit SU2 and the fourth sound unit SU4, the sound driver 340 may apply the first horizontal sound driving voltage to the first horizontal sound line HSOL1, may apply the second horizontal sound driving voltage to the second horizontal sound line HSOL2, and may apply the first vertical sound driving voltage to the second vertical sound line VSOL2. In order to output sound by the third sound unit SU3 and the fourth sound unit SU4, the sound driver 340 may apply the second horizontal sound driving voltage to the second horizontal sound line HSOL2, may apply the first vertical sound driving voltage to the first vertical sound line VSOL1, and may apply the second vertical sound driving voltage to the second vertical sound line VSOL2. In order to output sound by all of the first sound unit SU1, the second sound unit SU2, the third sound unit SU3 and the fourth sound unit SU4, the sound driver 340 may apply the first horizontal sound driving voltage to the first horizontal sound line HSOL1, may apply the second horizontal sound driving voltage to the second horizontal sound line HSOL2, may apply the first vertical sound driving voltage to the first vertical sound line VSOL1, and may apply the second vertical sound driving voltage to the second vertical sound line VSOL2.

Each of the sound units SU1, SU2, SU3 and SU4 may not overlap the buffer 420. To this end, the buffer 420 may include buffer holes BH overlapping the sound units SU1, SU2, SU3 and SU4 in the third direction (z-axis direction), respectively. The buffer holes BH may penetrate through the buffer 420. Due to the buffer holes BH, a resonator (or a soundbox) may be formed or disposed under or below each of the sound units SU1, SU2, SU3 and SU4. Therefore, the sound pressure level of the sound output by each of the sound units SU1, SU2, SU3 and SU4 may be increased due to the resonator.

As shown in FIGS. 30 and 31, sound units SU1, SU2, SU3 and SU4 may be arranged or disposed in an m-by-n matrix, where m and n are positive integers. The first sound electrodes SOE1 of the sound units arranged or disposed in the same row may be electrically connected to the same horizontal sound line, while the second sound electrodes SOE2 of the sound units arranged or disposed in the same column may be electrically connected to the same vertical sound line. Therefore, it is possible to reduce the number of sound lines for driving the sound units SU1, SU2, SU3 and SU4, and to output sound by driving the sound units SU1, SU2, SU3 and SU4 individually or simultaneously. Therefore, the display device may output a single-channel sound as well as multi-channel sound, i.e., two-channel sound.

Figure 33:
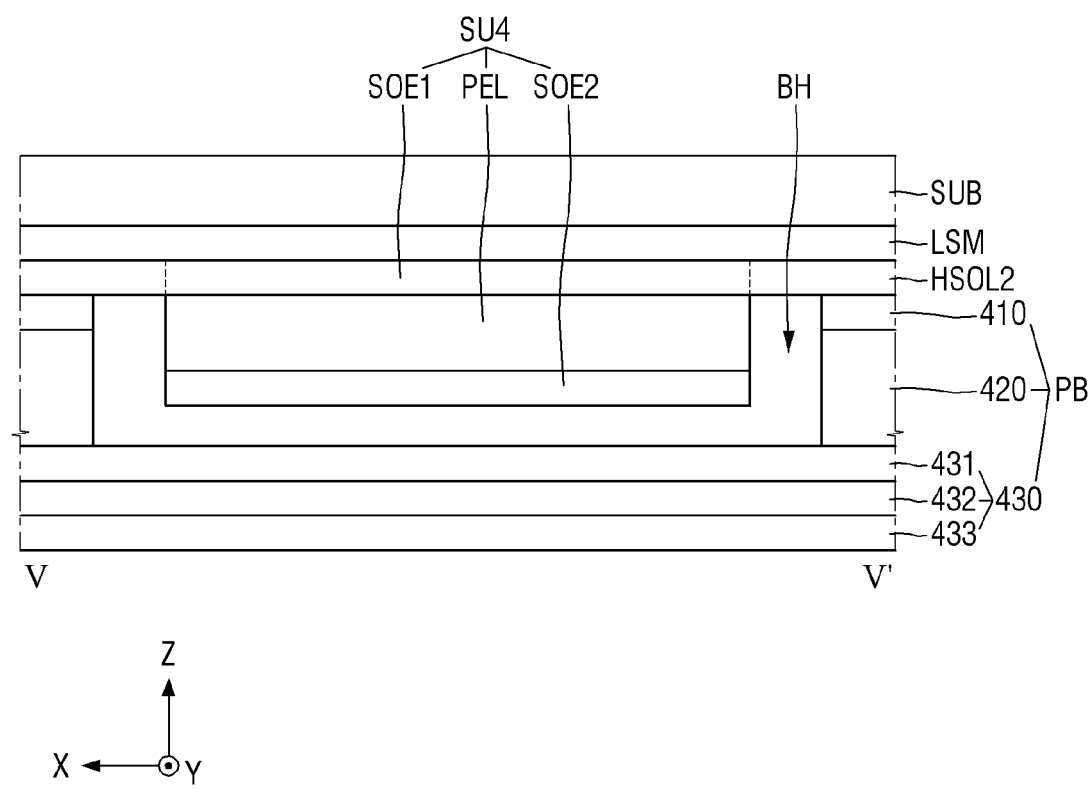
FIG. 33 is a schematic cross-sectional view showing an example, taken along line V-V' of FIGS. 30 and 31.
Figure 34:
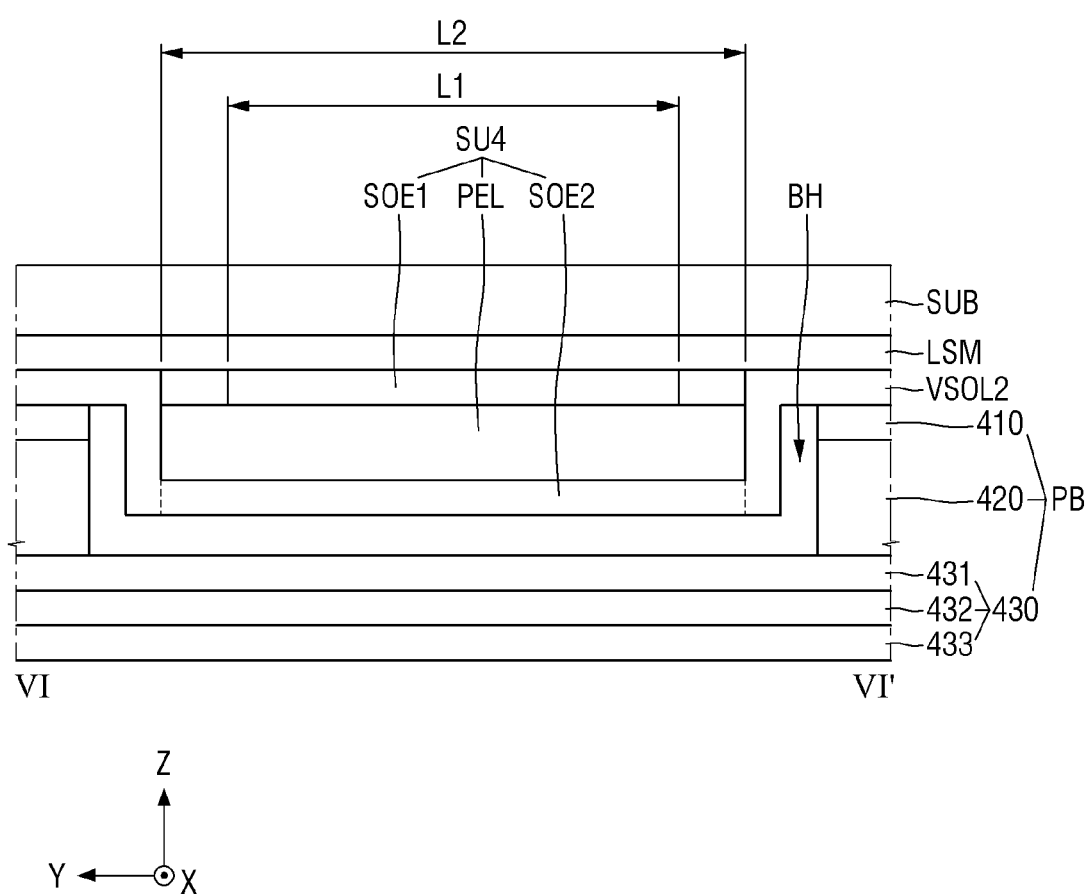
FIG. 34 is a schematic cross-sectional view showing an example, taken along line VI-VI' of FIGS. 30 and 31.

FIG. 33 is a schematic cross-sectional view showing an example, taken along line V-V' of FIGS. 30 and 31. FIG. 34 is a schematic cross-sectional view showing an example, taken along line VI-VI' of FIGS. 30 and 31. FIGS. 33 and 34 show a schematic cross section of the fourth sound unit SU4.

Referring to FIGS. 33 and 34, a light-shielding member LSM may be formed or disposed on the lower surface of the substrate SUB. As the light-shielding member LSM blocks light from being transmitted, it is possible to prevent the sound units SU1, SU2, SU3 and SU4 from being recognized by the user on the upper surface of the display panel 300. The light-shielding member LSM may include a light-absorbing material such as a black pigment and a black dye.

The first sound line SOL1 including the first horizontal sound line HSOL1 and the second horizontal sound line HSOL2, the second sound line SOL2 including the first vertical sound line VSOL1 and the second vertical sound line VSOL2, and the first sound electrode SOE1 may be formed or disposed on the light-shielding member LSM. The first sound line SOL1, the second sound line SOL2 and the first sound electrode SOE1 may be made of the same or similar material. The first sound line SOL1 and the first sound electrode SOE1 may be electrically connected to each other. The second sound line SOL2 and the first sound electrode SOE1 may be electrically separated from each other. The first sound line SOL1, the second sound line SOL2 and the first sound electrode SOE1 may include a conductive metal material.

The vibration layer PEL may be formed or disposed on the first sound electrode SOE1. The vibration layer PEL may be a piezoelectric material an electroactive polymer that may be deformed according to the first sound driving voltage applied to the first sound electrode SOE1 and the second sound driving voltage applied to the second sound electrode SOE2. The piezoelectric material may include plumbum zirconate titanate (PZT), and the electroactive polymer may include a ferroelectric polymer such as polyvinylidene fluoride (PVDF) and poly(vinylidenefluoride-co-trifluoroethylene) (P(VDF-TrFE)). The vibration layer PEL may be formed or disposed on the first sound electrode SOE1 by printing, spraying or spin coating. The vibration layer PEL may be similar to that described above with reference to FIG. 11.

The vibration layer PEL may be mechanically deformed by the inverse piezoelectric effect in a case that the first sound driving voltage is applied to the first sound electrode SOE1 and the second sound driving voltage is applied to the second sound electrode SOE2. In addition, in a case that the vibration layer PEL is mechanically deformed, it may generate voltage on the first sound electrode SOE1 and the second sound electrode SOE2 by the piezoelectric effect. Each of the sound units SU may output sound by vibrating the vibration layer PEL by the inverse piezoelectric effect.

The first vertical sound line VSOL1 or the second vertical sound line VSOL2 may be formed or disposed on side surfaces of the vibration layer PEL. For example, the first vertical sound line VSOL1 may be formed or disposed on side surfaces of the vibration layer PEL of each of the first sound unit SU1 and the third sound unit SU3. A second vertical sound line VSOL2 may be formed or disposed on side surfaces of the vibration layer PEL of each of the second sound unit SU2 and the fourth sound unit SU4.

The second sound electrode SOE2 may be formed or disposed on the vibration layer PEL. The vibration layer PEL may be disposed between the first sound electrode SOE1 and the second sound electrode SOE2 in the third direction (z-axis direction). The second sound electrode SOE2 may include a conductive metal material. In order to prevent a short-circuit between the first sound electrode SOE1 and the second vertical sound line VSOL2, the length L1 of the first sound electrode SOE1 in the second direction (y-axis direction) may be smaller than the length L2 of the vibration layer PEL in the second direction (y-axis direction) as shown in FIG. 34.

The first sound line SOL1 and the first sound electrode SOE1 may be formed by printing or spraying silver (Ag) paste, carbon paste, or conductive polymer onto the light-shielding member LSM. Alternatively, the first sound line SOL1 and the first sound electrode SOE1 may be formed by depositing conductive material such as copper (Cu), aluminum (Al), silver (Ag) and indium tin oxide (ITO) on the light-shielding member LSM.

The second sound electrode SOE2 and the second sound line SOL2 may be formed by printing or spraying silver (Ag) paste, carbon paste, or conductive polymer onto the vibration layer PEL. Alternatively, the second sound electrode SOE2 and the second sound line SOL2 may be formed by depositing conductive material such as copper (Cu), aluminum (Al), silver (Ag) and indium tin oxide (ITO) on the vibration layer PEL.

An adhesive member 410 may be disposed on the first sound line SOL1 and the second sound line SOL2. The adhesive member 410 may be a pressure-sensitive adhesive. The upper surface of the adhesive member 410 may be embossed to obtain buffer effect.

The buffer 420 may be disposed on the adhesive member 410. The buffer 420 absorbs an external impact to prevent the display panel 300 from being damaged. The buffer 420 may be formed of a polymer resin such as polyurethane, polycarbonate, polypropylene and polyethylene, or may be formed of a material having elasticity such as a rubber and a sponge obtained by foaming a urethane-based material or an acrylic-based material.

Buffer holes BH may be formed or disposed in the adhesive member 410 and the buffer 420 to form a resonator under or below each of the sound units SU1, SU2, SU3 and SU4. The buffer holes BH may penetrate through the adhesive member 410 and the buffer 420. The sound units SU1, SU2, SU3 and SU4 may overlap the buffer holes BH in the third direction (z-axis direction), respectively. Accordingly, the sound units SU1, SU2, SU3 and SU4 may be disposed in the buffer holes BH, respectively.

A heat dissipation member 430 may be disposed on the buffer 420. The heat dissipation member 430 may include a base film 431, a first heat-dissipating layer 432 and a second heat-dissipating layer 433. The base film 431 may be a polyimide film or polyethylene terephthalate film. The first heat-dissipating layer 432 may include graphite, carbon nanotubes, or the like within the spirit and the scope of the disclosure. The second heat-dissipating layer 433 may be implemented as a metal thin film, such as copper, nickel, ferrite and silver, which may block electromagnetic waves and have excellent thermal conductivity.

As shown in FIGS. 33 and 34, the sound electrode layer SOEL including the first sound electrodes SOE1, the second sound electrodes SOE2 and the vibration layer PEL may be disposed between the substrate SUB of the display panel 300 and the bottom panel cover PB. Therefore, the vibration layer PEL is vibrated by the first sound electrodes SOE1 and the second sound electrodes SOE2 of the sound electrode layer SOEL, and sound may be output. Sound may be output by using the sound units incorporated into the display panel.

Figure 35:
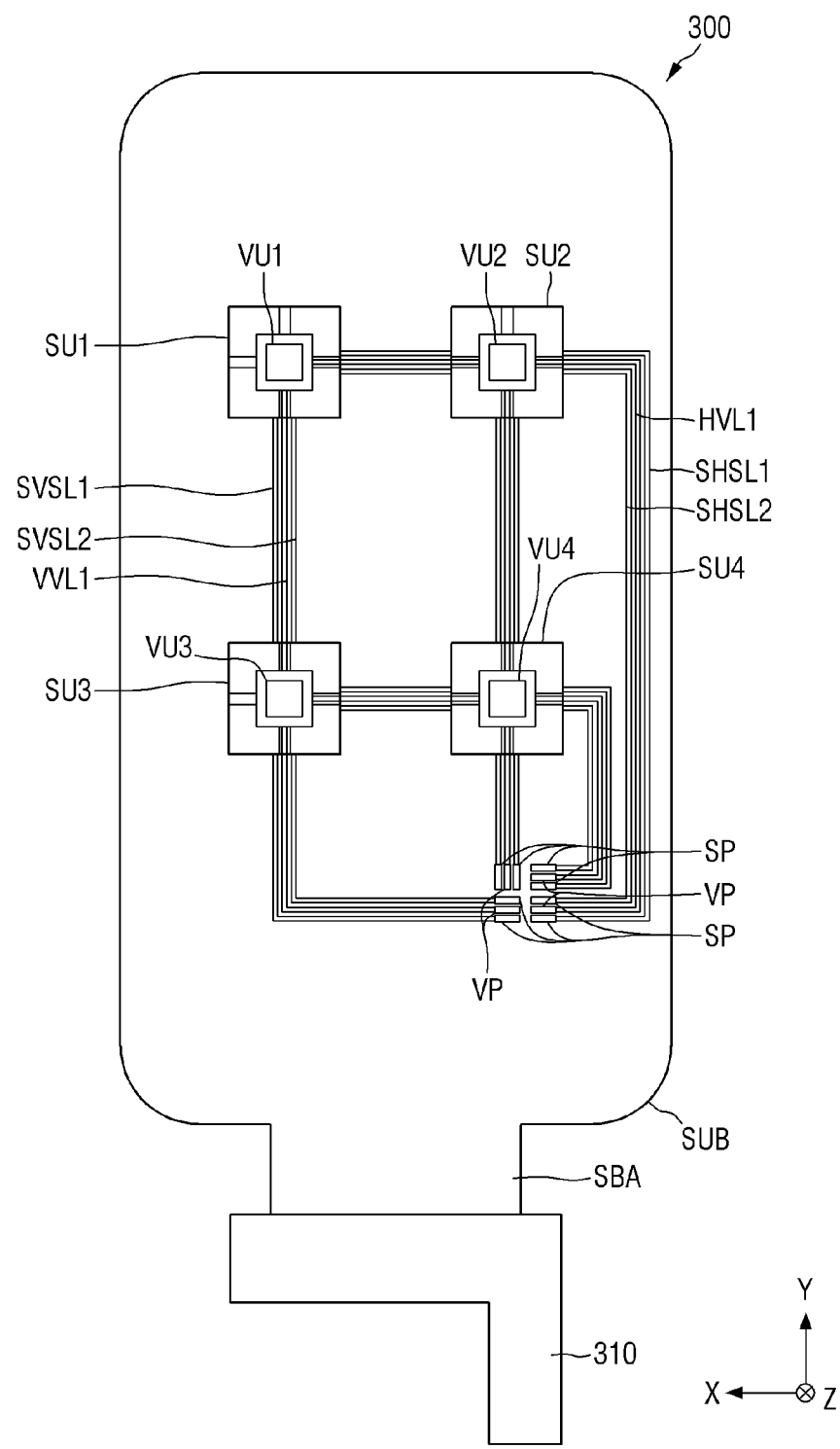
FIG. 35 is a view showing a layout of a sound electrode layer of a display panel according to an embodiment.
Figure 36:
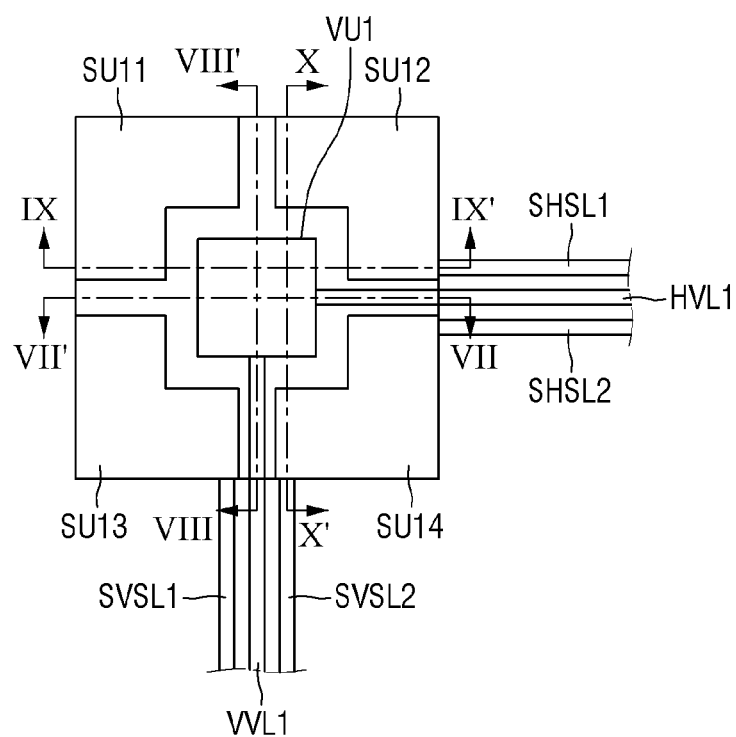
FIG. 36 is a view showing a layout of subsidiary sound units and a vibration unit of the first sound unit of FIG. 35 in detail.

FIG. 35 is a view showing a layout of a sound electrode layer of a display panel according to an embodiment. FIG. 36 is a view showing a layout of subsidiary sound units and a vibration unit of the first sound unit of FIG. 35 in detail.

FIG. 35 shows a layout of the lower surface of the display panel 300 with the subsidiary area SBA unfolded. FIG. 36 shows the first sound unit SU1 of FIG. 35 in detail.

An embodiment of FIGS. 35 and 36 may be different from an embodiment of FIGS. 30 and 31 in that each of sound units SU1, SU2, SU3 and SU4 may include a vibration unit and subsidiary sound units.

Referring to FIGS. 35 and 36, each of the sound units SU may include a vibration unit and subsidiary sound units. For example, the first sound unit SU1 may include a first vibration unit VU1 and (1-1) to (1-4) subsidiary sound units SU11, SU12, SU13 and SU14. The first vibration unit VU1 may be electrically separated from the (1-1) to (1-4) subsidiary sound units SU11, SU12, SU13 and SU14. The first vibration unit VU1 may be spaced apart from the (1-1) to (1-4) subsidiary sound units SU11, SU12, SU13 and SU14.

The first vibration unit VU1 may include a first vibration electrode, a second vibration electrode, and a second vibration layer disposed between the first vibration electrode and the second vibration electrode in the third direction (z-axis direction). Each of the (1-1) to (1-4) subsidiary sound units SU11, SU12, SU13 and SU14 may include a first sound electrode, a second sound electrode, and a first vibration layer disposed between the first sound electrode and the second sound electrode in the third direction (z-axis direction).

The first sound electrode of the (1-1) subsidiary sound unit SU11 and the first sound electrode of the (1-2) subsidiary sound unit SU12 may be electrically connected to a first subsidiary horizontal sound line SHSL1, and the first sound electrode of the (1-3) subsidiary sound unit SU13 and the first sound electrode of the (1-4) subsidiary sound unit SU14 may be electrically connected to a second subsidiary horizontal sound line SHSL2. The second sound electrode of the (1-1) subsidiary sound unit SU11 and the second sound electrode of the (1-3) subsidiary sound unit SU13 may be electrically connected to a first subsidiary vertical sound line SVSL1, and the second sound electrode of the (1-2) subsidiary sound unit SU12 and the second sound electrode of the (1-4) subsidiary sound unit SU14 may be electrically connected to a second subsidiary vertical sound line SVSL2. The first vibration electrode of the first vibration unit VU1 may be electrically connected to the first horizontal vibration line HVL1, and the second vibration electrode may be electrically connected to the first vertical vibration line VVL1.

The first horizontal vibration line HVL1 may be electrically separated from the first subsidiary horizontal sound line SHSL1 and the second subsidiary horizontal sound line SHSL2. The first horizontal vibration line HVL1 may be spaced apart from the first subsidiary horizontal sound line SHSL1 and the second subsidiary horizontal sound line SHSL2. The first horizontal vibration line HVL1 may be disposed between the first subsidiary horizontal sound line SHSL1 and the second subsidiary horizontal sound line SHSL2.

The first vertical vibration line VVL1 may be electrically separated from the first subsidiary vertical sound line SVSL1 and the second subsidiary vertical sound line SVSL2. The first vertical vibration line VVL1 may be spaced apart from the first subsidiary vertical sound line SVSL1 and the second subsidiary vertical sound line SVSL2. The first vertical vibration line VVL1 may be disposed between the first subsidiary vertical sound line SVSL1 and the second subsidiary vertical sound line SVSL2.

The first subsidiary horizontal sound line SHSL1, the second subsidiary horizontal sound line SHSL2, the first subsidiary vertical sound line SVSL1 and the second subsidiary vertical sound line SVSL2 may be electrically connected to sound pads SP. The first horizontal vibration line HVL1 and the first vertical vibration line VVL1 may be electrically connected to vibration pads VP. The sound pads SP and the vibration pads VP may be electrically connected to the display circuit board 310 in a case that the subsidiary area SBA is bent and disposed on the lower surface of the display panel 300.

In order to output sound by vibrating the vibration layers of the first to fourth subsidiary sound units SU11, SU12, SU13 and SU14 of the first sound unit SU1, the sound driver 340 may apply the first horizontal sound driving voltage to the first subsidiary horizontal sound line SHSL1 and the second subsidiary horizontal sound line SHSL2 and may apply the first vertical sound driving voltage to the first subsidiary vertical sound line SVSL1 and the second subsidiary vertical sound line SVSL2. In addition, in order to provide a user with a haptic feedback by vibrating the vibration layers of the first vibration unit VU1, the sound driver 340 may apply a first horizontal vibration driving voltage to a first horizontal vibration line HVL1 and may apply a first vertical vibration driving voltage to a first vertical vibration line VVL1.

Figure 58:
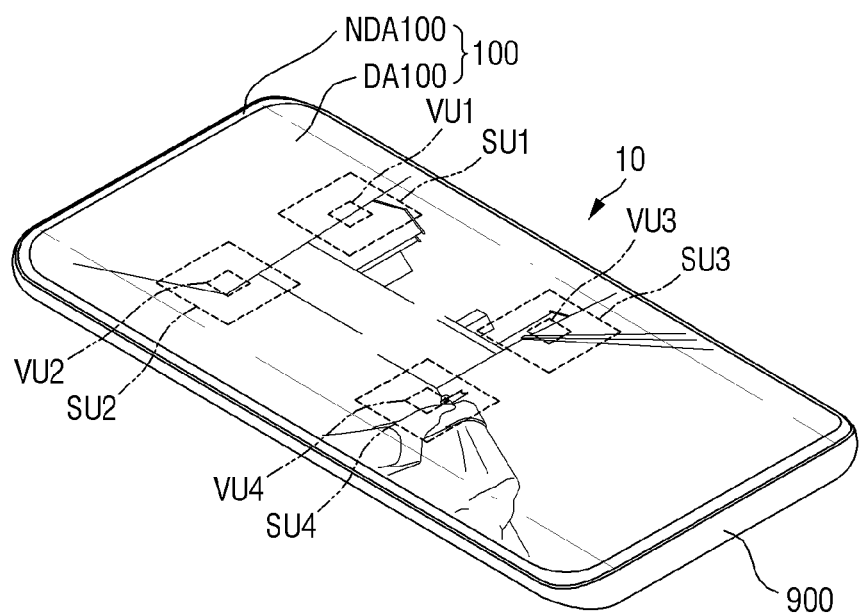
FIG. 58 is a view showing an example where sound is output by sound units and haptic feedback is provided by vibration units according to an image displayed by the display device.

For example, in a case that a user's touch is made or an object of an image exists in an area adjacent to the fourth sound unit SU4 as shown in FIG. 58, the sound driver 340 may vibrate the first vibration layer of the fourth sound unit SU4 to output a sound associated with the image, for example, a gunshot sound and may also vibrate the second vibration layer of the fourth vibration unit VU4 to provide a haptic feedback. Therefore, a user may feel the vibration at the position where the sound is generated, and thus the user may experience more realistic sound effect.

The second sound unit SU2 may include a second vibration unit and (2-1) to (2-4) subsidiary sound units as similar to the first sound unit SU1 in FIG. 36. For example, the second sound unit SU2 may be substantially identical to the first sound unit SU1 except that the second sound unit SU2 may be electrically connected to a third subsidiary vertical sound line, a fourth subsidiary vertical sound line and a second vertical vibration line, instead of the first subsidiary vertical sound line SVSL1, the second subsidiary vertical sound line SVSL2, and the first vertical vibration line VVL1; and, therefore, the redundant description will be omitted.

The third sound unit SU3 may include a third vibration unit and (3-1) to (3-4) subsidiary sound units as similar to the first sound unit SU1 in FIG. 36. For example, the third sound unit SU3 may be substantially identical to the first sound unit SU1 except that the third sound unit SU3 may be electrically connected to a third subsidiary horizontal sound line, a fourth subsidiary horizontal sound line and a second horizontal vibration line, instead of the first subsidiary horizontal sound line SHSL1, the second subsidiary horizontal sound line SHSL2 and the first horizontal vibration line HVL1; and, therefore, the redundant description will be omitted.

The fourth sound unit SU4 may include a fourth vibration unit and (4-1) to (4-4) subsidiary sound units as similar to the first sound unit SU1 in FIG. 36. For example, the fourth sound unit SU4 may be substantially identical to the first sound unit SU1 except that the fourth sound unit SU4 may be electrically connected to a third subsidiary horizontal sound line, a fourth subsidiary horizontal sound line, a third subsidiary vertical sound line, a fourth subsidiary vertical sound line, a second horizontal vibration line and a second vertical vibration line, instead of the first subsidiary horizontal sound line SHSL1, the second subsidiary horizontal sound line SHSL2, the first subsidiary vertical sound line SVSL1, the second subsidiary vertical sound line SVSL2, the first horizontal vibration line HVL1 and the first vertical vibration line VVL1; and, therefore, the redundant description will be omitted.

As shown in FIGS. 35 and 36, sound units SU1, SU2, SU3 and SU4 is arranged or disposed in an m-by-n matrix, where m and n are positive integers. The first vibration electrodes VE1 of the sound units arranged or disposed in the same row may be electrically connected to the same horizontal vibration line, the first sound electrodes SOE1 of the sound units arranged or disposed in the same row may be electrically connected to the same horizontal sound line, the second vibration electrodes VE2 of the sound units arranged or disposed in the same column may be electrically connected to the same vertical vibration line, and the second sound electrodes SOE2 of the sound units arranged or disposed in the same column may be electrically connected to the same vertical sound line. Therefore, it is possible to reduce the number of vibration lines and sound lines for driving the sound units SU1, SU2, SU3 and SU4, and to output sound and/or vibration by driving the sound units SU1, SU2, SU3 and SU4 individually or simultaneously. Therefore, the display device may output a single-channel sound as well as multi-channel sound, i.e., two-channel sound. In addition, the display device may provide a haptic feedback by generating vibration at the location where sound is generated.

Figure 37:
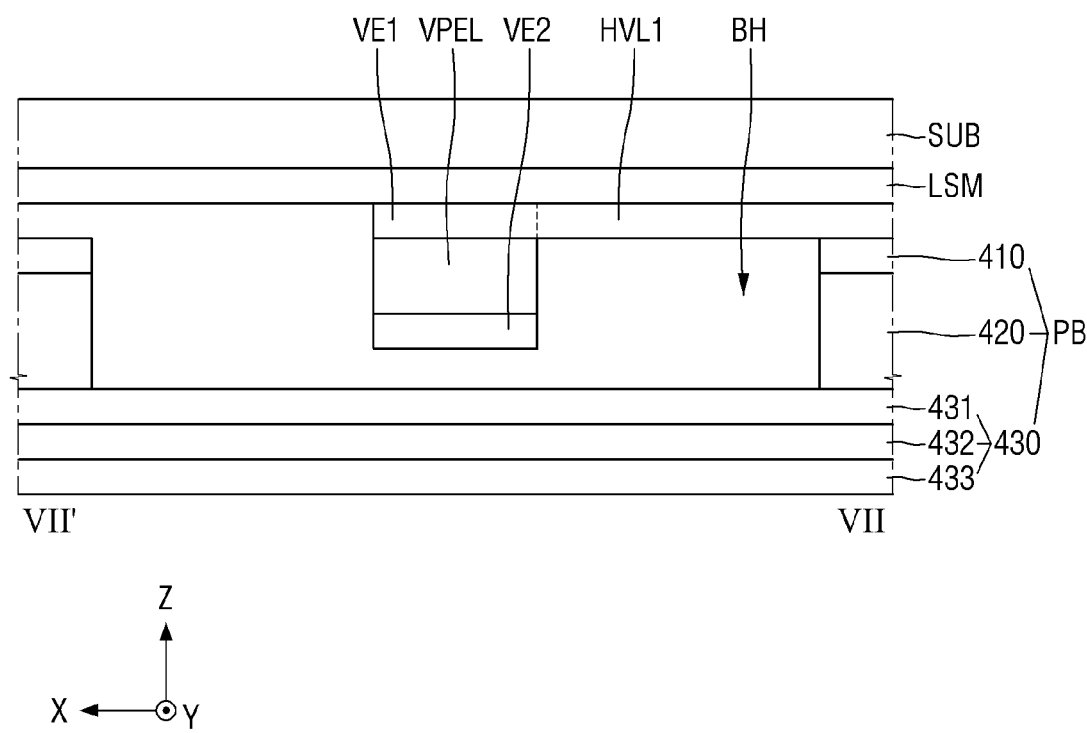
FIG. 37 is a schematic cross-sectional view taken along line VII-VII' of FIG. 36.
Figure 38:
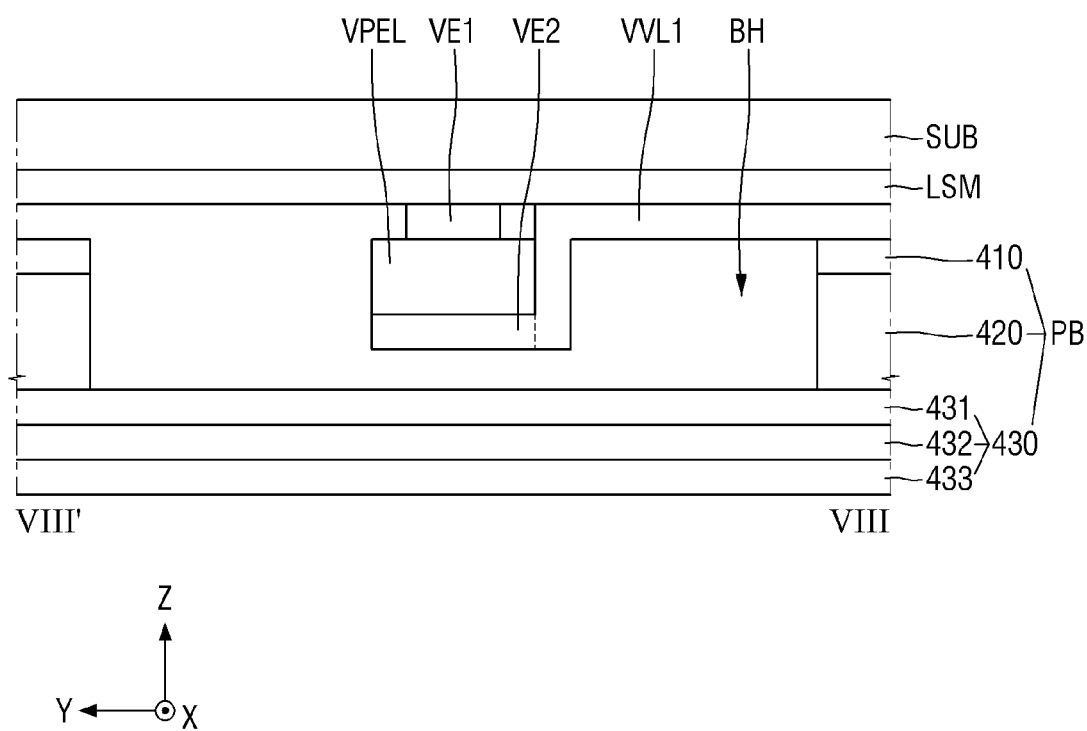
FIG. 38 is a schematic cross-sectional view taken along line VIII-VIII' of FIG. 36.
Figure 39:
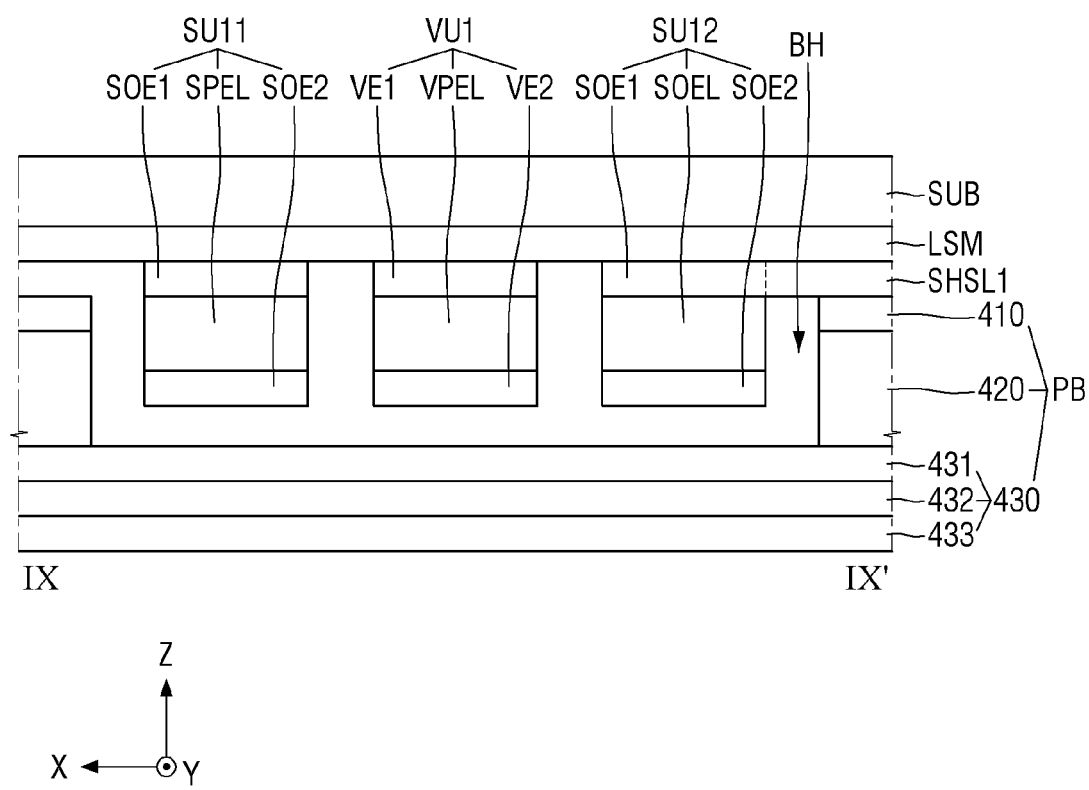
FIG. 39 is a schematic cross-sectional view taken along line IX-IX' of FIG. 36.
Figure 40:
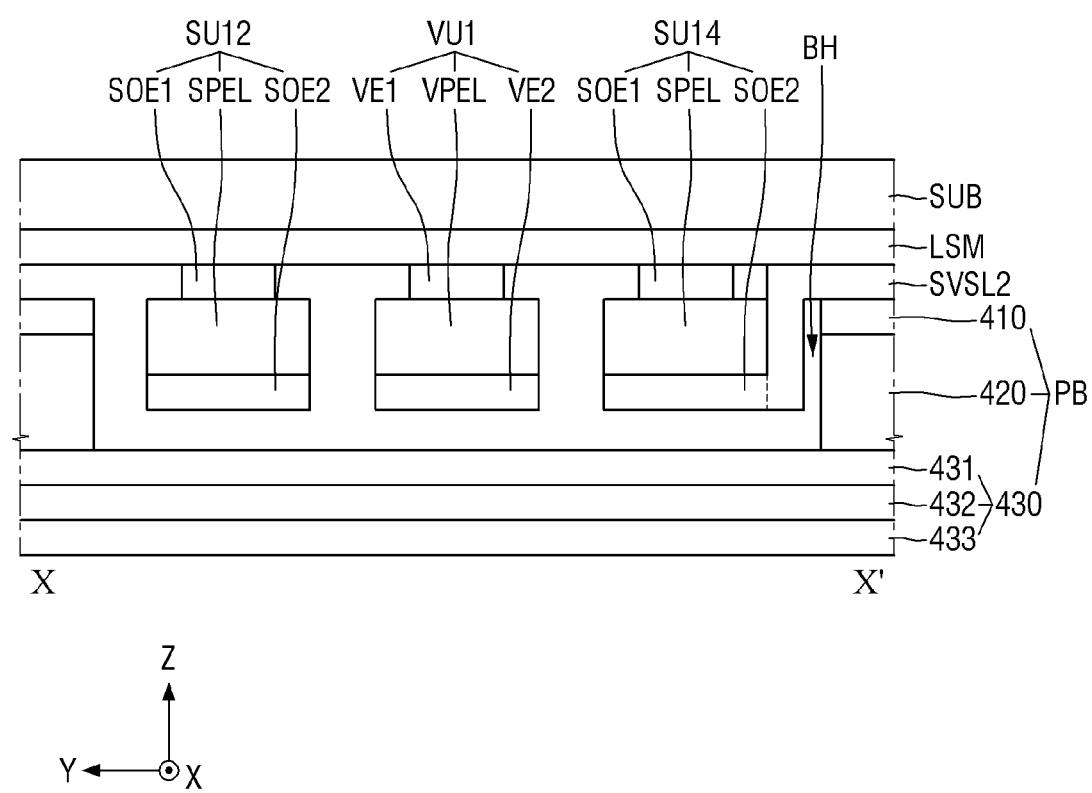
FIG. 40 is a schematic cross-sectional view taken along line X-X' of FIG. 36.

FIG. 37 is a schematic cross-sectional view taken along line VII-VII' of FIG. 36. FIG. 38 is a schematic cross-sectional view taken along line VIII-VIII' of FIG. 36. FIG. 39 is a schematic cross-sectional view taken along line IX-IX' of FIG. 36. FIG. 40 is a schematic cross-sectional view taken along line X-X' of FIG. 36.

An embodiment of FIGS. 37 to 40 may be different from an embodiment of FIGS. 33 and 34 in that a first sound unit SU1 may include a vibration unit and subsidiary sound units.

Referring to FIGS. 37 to 40, a first horizontal vibration line HVL1, a first vertical vibration line VVL1, a first vibration electrode VE1, a first subsidiary horizontal sound line SHSL1, a second subsidiary horizontal sound line SHSL2, and a first sound electrodes SOE1 may be formed or disposed on a light-shielding member LSM. The first horizontal vibration line HVL1, the first vertical vibration line VVL1, the first vibration electrode VE1, the first subsidiary horizontal sound line SHSL1, the second subsidiary horizontal sound line SHSL2 and the first sound electrodes SOE1 may be made of the same or similar material. The first horizontal vibration line HVL1 may be electrically connected to the first vibration electrode VE1. The first vertical vibration line VVL1 may be electrically separated from the first vibration electrode VE1. The first horizontal vibration line HVL1, the first vertical vibration line VVL1, the first vibration electrode VE1, the first subsidiary horizontal sound line SHSL1, the second subsidiary horizontal sound line SHSL2 and the first sound electrodes SOE1 may include a conductive metal material.

The second vibration layer VPEL may be formed or disposed on the first vibration electrode VE1. The second vibration layer VPEL may be a piezoelectric material or an electroactive polymer that may be deformed according to the first vibration driving voltage applied to the first vibration electrode VE1 and the second vibration driving voltage applied to the second vibration electrode VE2. The piezoelectric material may include plumbum zirconate titanate (PZT), and the electroactive polymer may include a ferroelectric polymer such as polyvinylidene fluoride (PVDF) and poly(vinylidenefluoride-co-trifluoroethylene) (P(VDF-TrFE)). The electroactive polymer may include piezoelectric particles such as ZnO and $BaTiO_3$ to increase the piezoelectric effect. In a case that the first vibration driving voltage is applied to the first vibration electrode VE1 and the second vibration driving voltage is applied to the second vibration electrode VE2, the second vibration layer VPEL may be deformed by the inverse piezoelectric effect. In addition, in a case that the second vibration layer VPEL is mechanically deformed, it may generate voltage on the first vibration electrode VE1 and the second sound vibration VE2 by the piezoelectric effect. The first vibration unit VU1 may provide a user with a haptic feedback by vibrating the second vibration layer VPEL by the inverse piezoelectric effect.

The first vibration layer SPEL may be formed or disposed on the first sound electrode SOE1 of each of the (1-1) to (1-4) subsidiary sound units SU11, SU12, SU13 and SU14. The first vibration layer SPEL may be a piezoelectric material an electroactive polymer that may be deformed according to the first sound driving voltage applied to the first sound electrode SOE1 and the second sound driving voltage applied to the second sound electrode SOE2. The first vibration layer SPEL may be mechanically deformed by the inverse piezoelectric effect in a case that the first sound driving voltage is applied to the first sound electrode SOE1 and the second sound driving voltage is applied to the second sound electrode SOE2. In addition, in a case that the first vibration layer SPEL is mechanically deformed, it may generate voltage on the first sound electrode SOE1 and the second sound electrode SOE2 by the piezoelectric effect. Each of the (1-1) to (1-4) subsidiary sound units SU11, SU12, SU13 and SU14 may output sound by vibrating the first vibration layer SPEL by the inverse piezoelectric effect.

A first vertical vibration line VVL1 may be formed or disposed on side surfaces of the second vibration layer VPEL of the first vibration unit VP1. The second vibration electrode VE2 may be formed or disposed on the second vibration layer VPEL of the first vibration unit VP1. The second vibration layer VPEL may be disposed between the first vibration electrode VE1 and the second vibration electrode VE2 in the third direction (z-axis direction). The second vibration electrode VE2 may include a conductive metal material. In order to prevent a short-circuit between the first vibration electrode VE1 and the first vertical vibration line VVL1, the length L1 of the first vibration electrode VE1 in the second direction (y-axis direction) may be smaller than the length L2 of the second vibration layer VPEL in the second direction (y-axis direction) as shown in FIG. 37.

The first subsidiary vertical sound line SVSL1 may be formed or disposed on side surfaces of the first vibration layer SPEL of each of the first subsidiary sound unit SU11 and the third subsidiary sound unit SU13. The second subsidiary vertical sound line SVSL2 may be formed or disposed on side surfaces of the first vibration layer SPEL of each of the second subsidiary sound unit SU12 and the fourth subsidiary sound unit SU14. The second sound electrode SOE2 may be formed or disposed on the second sound electrode SOE2 of each of the (1-1) to (1-4) subsidiary sound units SU11, SU12, SU13 and SU14. The first vibration layer SPEL may be disposed between the first sound electrode SOE1 and the second sound electrode SOE2 in the third direction (z-axis direction). The second sound electrode SOE2 may include a conductive metal material. In order to prevent a short-circuit between the first sound electrode SOE1 and the first subsidiary vertical sound line SVSL1 in the first subsidiary sound unit SU11 and the third subsidiary sound unit SU13, the length of the first sound electrode SOE1 in the second direction (y-axis direction) may be smaller than the length of the first vibration layer SPEL in the second direction (y-axis direction) as shown in FIG. 40.

As shown in FIGS. 37 to 40, the sound electrode layer SOEL including the first sound electrodes SOE1, the second sound electrodes SOE2, the first vibration electrode VE1, the second vibration electrode VE2, the first vibration layers SPEL and the second vibration layers VPEL may be disposed between the substrate SUB of the display panel 300 and the bottom panel cover PB. Therefore, sound may be output by vibrating the first vibration layers SPEL by the first sound electrodes SOEL and the second sound electrodes SOE2 of the sound electrode layer SOEL, and a haptic feedback may be provided by vibrating the second vibration layers VPEL by the first vibration electrodes VE1 and the second vibration electrodes VE2. Sound may be output and haptic feedback may be provided by using the sound units incorporated into the display panel 300.

Figure 41:
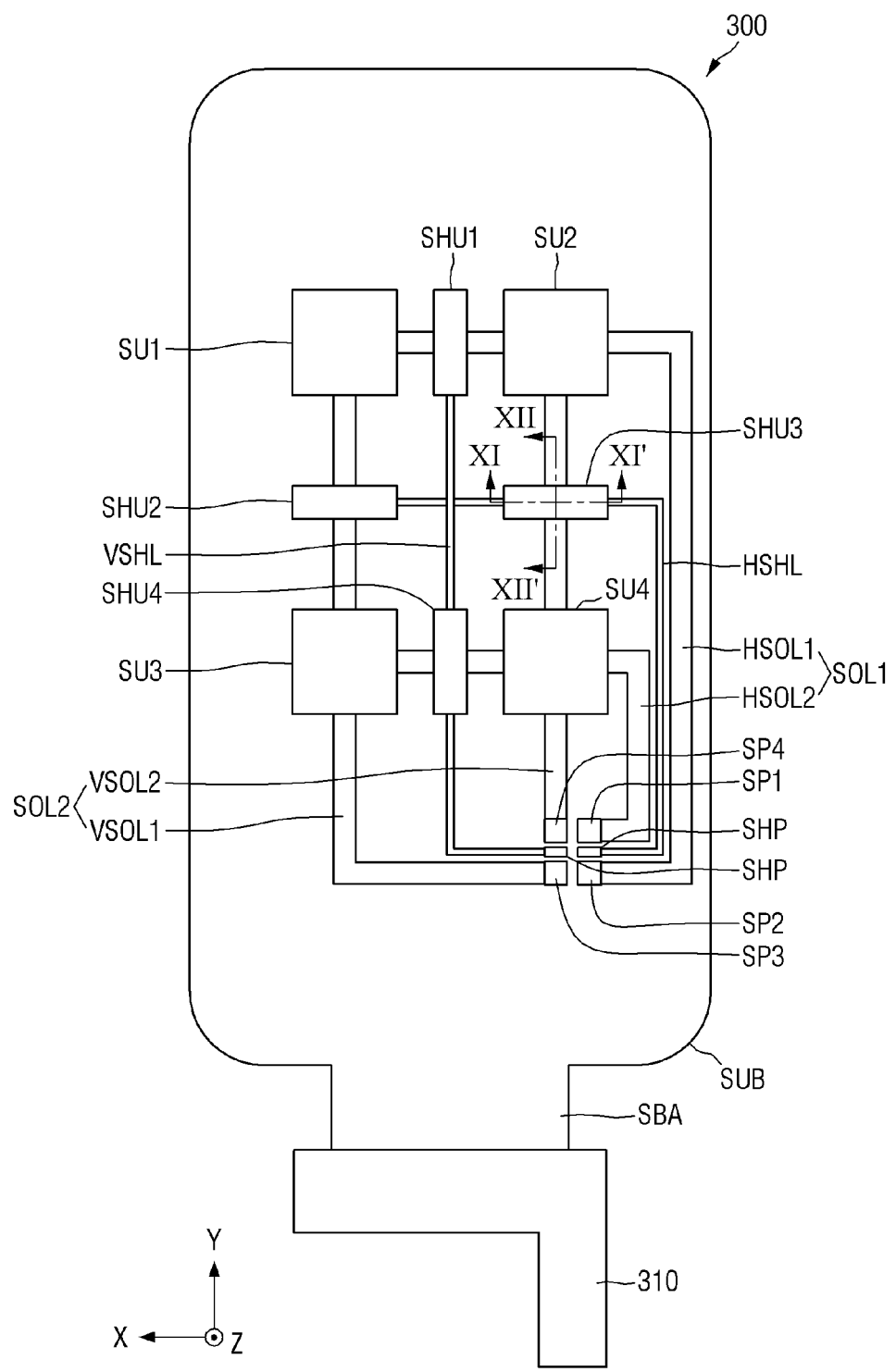
FIG. 41 is a view showing a layout of a display panel according to an embodiment.

FIG. 41 is a view showing a layout of a display panel according to an embodiment.

An embodiment of FIG. 41 may be different from an embodiment of FIGS. 30 and 31 in that shielding units SHU1, SHU2, SHU3 and SHU4 may be disposed between sound units SU1, SU2, SU3 and SU4.

Referring to FIG. 41, in order to avoid the sound or vibration by the first sound unit SU1 and the sound or vibration by the second sound unit SU2 from affecting each other, the first shielding unit SHU1 may be disposed between the first sound unit SU1 and the second sound unit SU2. The first sound unit SU1, the first shielding unit SHU1 and the second sound unit SU2 may be arranged or disposed in the first direction (x-axis direction). The length of the first shielding unit SHU1 in the first direction (x-axis direction) may be smaller than the length of the first sound unit SU1 in the first direction (x-axis direction), and the length of the second sound unit SU2 in the first direction (x-axis direction). The length of the first shielding unit SHU1 in the second direction (y-axis direction) may be substantially equal to the length of the first sound unit SU1 in the second direction (y-axis direction) and the length of the second sound unit SU2 in the second direction (y-axis direction).

In order to avoid the sound or vibration by the first sound unit SU1 and the sound or vibration by the third sound unit SU3 from affecting each other, the second shielding unit SHU2 may be disposed between the first sound unit SU1 and the third sound unit SU3. The first sound unit SU1, the second shielding unit SHU2 and the third sound unit SU3 may be arranged or disposed in the second direction (y-axis direction). The length of the second shielding unit SHU2 in the first direction (x-axis direction) may be substantially equal to the length of the first sound unit SU1 in the first direction (x-axis direction) and the length of the third sound unit SU3 in the first direction (x-axis direction). The length of the second shielding unit SHU2 in the second direction (y-axis direction) may be substantially smaller than the length of the first sound unit SU1 in the second direction (y-axis direction) and the length of the third sound unit SU3 in the second direction (y-axis direction).

In order to avoid the sound or vibration by the second sound unit SU2 and the sound or vibration by the fourth sound unit SU4 from affecting each other, the third shielding unit SHU3 may be disposed between the second sound unit SU2 and the fourth sound unit SU4. The second sound unit SU2, the third shielding unit SHU3 and the fourth sound unit SU4 may be arranged or disposed in the second direction (y-axis direction). The length of the third shielding unit SHU3 in the first direction (x-axis direction) may be substantially equal to the length of the second sound unit SU2 in the first direction (x-axis direction) and the length of the fourth sound unit SU4 in the first direction (x-axis direction). The length of the third shielding unit SHU3 in the second direction (y-axis direction) may be substantially smaller than the length of the second sound unit SU2 in the second direction (y-axis direction) and the length of the fourth sound unit SU4 in the second direction (y-axis direction).

In order to avoid the sound or vibration by the third sound unit SU3 and the sound or vibration by the fourth sound unit SU4 from affecting each other, the fourth shielding unit SHU4 may be disposed between the third sound unit SU3 and the fourth sound unit SU4. The third sound unit SU3, the fourth shielding unit SHU4 and the fourth sound unit SU4 may be arranged or disposed in the first direction (x-axis direction). The length of the fourth shielding unit SHU4 in the first direction (x-axis direction) may be smaller than the length of the third sound unit SU3 in the first direction (x-axis direction) and the length of the fourth sound unit SU4 in the first direction (x-axis direction). The length of the fourth shielding unit SHU4 in the second direction (y-axis direction) may be substantially equal to the length of the third sound unit SU3 in the second direction (y-axis direction) and the length of the fourth sound unit SU4 in the second direction (y-axis direction).

Each of the shielding units SHU1, SHU2, SHU3 and SHU4 may include a first shielding electrode, a second shielding electrode, and a shielding vibration layer disposed between the first shielding electrode and the second shielding electrode in the third direction (z-axis direction). The shielding vibration layer may be mechanically deformed by the inverse piezoelectric effect in a case that the first shielding driving voltage is applied to the first shielding electrode and the second shielding driving voltage is applied to the second shielding electrode. In addition, in a case that the vibration layer is mechanically deformed, it may generate voltage on the first shielding electrode and the second shielding electrode by the piezoelectric effect. Each of the shielding units SHU1, SHU2, SHU3 and SHU4 may vibrate the shielding vibration layer by the inverse piezoelectric effect.

The first sound electrode of the first sound unit SU1, the second shielding electrode of the first shielding unit SHU1 and the first sound electrode of the second sound unit SU2 may be electrically connected to the first horizontal sound line HSOL1. The first sound electrode of the third sound unit SU3, the second shielding electrode of the fourth shielding unit SHU4 and the first sound electrode of the fourth sound unit SU2 may be electrically connected to the second horizontal sound line HSOL2.

The second sound electrode of the first sound unit SU1, the first shielding electrode of the second shielding unit SHU2 and the second sound electrode of the third sound unit SU3 may be electrically connected to the first vertical sound line VSOL1. The second sound electrode of the second sound unit SU2, the first shielding electrode of the fourth shielding unit SHU4 and the second sound electrode of the fourth sound unit SU4 may be electrically connected to the second vertical sound line VSOL2.

The second shielding electrode of the second shielding unit SHU2 and the first shielding electrode of the third shielding unit SHU3 may be electrically connected to the horizontal shielding line HSHL. The first shielding electrode of the first shielding unit SHU1 and the second shielding electrode of the fourth shielding unit SHU4 may be electrically connected to the vertical shielding line VSHL.

The first horizontal connection line HSOL1, the second horizontal connection line HSOL2, the first vertical connection line VSOL1 and the second vertical connection line VSOL2 may be electrically connected to the sound pads SP, while the horizontal shielding line HSHL and the vertical shielding line VSHL may be electrically connected to the shielding pads SHP. The sound pads SP and the shielding pads SHP may be electrically connected to the display circuit board 310 in a case that the subsidiary area SBA is bent and disposed on the lower surface of the display panel 300.

The sound driver 340 may apply the first shielding driving voltage to the vertical shielding line VSHL. The first shielding driving voltage may be substantially equal to the first vertical sound driving voltage applied to the first vertical sound driving line VSOL1 or the second vertical sound driving voltage applied to the second vertical sound driving line VSOL2. Accordingly, the sound waves or vibration waves by the first shielding unit SHU1 may be in anti-phase with the sound waves or vibration waves by the first sound unit SU1 or by the second sound unit SU2. Therefore, it is possible to prevent the sound or vibration by the first sound unit SU1 and the sound or vibration by the second sound unit SU2 from affecting each other. In addition, the sound waves or vibration waves by the fourth shielding unit SHU4 may be in anti-phase with the sound waves or vibration waves by the third sound unit SU3 or by the fourth sound unit SU4. Therefore, it is possible to avoid the sound or vibration by the third sound unit SU3 and the sound or vibration by the fourth sound unit SU4 from affecting each other.

The sound driver 340 may apply the second shielding driving voltage to the horizontal shielding line HSHL. The second shielding driving voltage may be substantially equal to the first horizontal sound driving voltage applied to the first horizontal sound driving line HSOL1 or the second horizontal sound driving voltage applied to the second horizontal sound driving line HSOL2. Accordingly, the sound waves or vibration waves by the second shielding unit SHU2 may be in anti-phase with the sound waves or vibration waves by the first sound unit SU1 or by the third sound unit SU4. Therefore, it is possible to avoid the sound or vibration by the second sound unit SU2 and the sound or vibration by the third sound unit SU3 from affecting each other. In addition, the sound waves or vibration waves by the third shielding unit SHU3 may be in anti-phase with the sound waves or vibration waves by the second sound unit SU2 or by the fourth sound unit SU4. Therefore, it is possible to avoid the sound or vibration by the second sound unit SU2 and the sound or vibration by the fourth sound unit SU4 from affecting each other.

As shown in FIG. 41, the sound units SU1, SU2, SU3 and SU4 is arranged or disposed in an m-by-n matrix, where m and n are positive integers, and the shielding units SHU1, SHU2, SHU3 and SHU4 may be disposed between the sound units SU1, SU2, SU3 and SU4. Accordingly, it is possible to suppress the sound units SU1, SU2, SU3 and SU4 from affecting each other.

In addition, the first sound electrodes of the sound units and the second shielding electrodes of the shielding unit arranged or disposed in the same row may be electrically connected to the same horizontal sound line, and the second sound electrodes of the sound units and the first shielding electrode of the shielding unit arranged or disposed in the same column may be electrically connected to the same vertical sound line. Therefore, it is possible to reduce the number of shielding lines for driving the shielding units SHU1, SHU2, SHU3 and SHU4, and to shield sound by driving the shielding units SHU1, SHU2, SHU3 and SU4 individually or simultaneously.

Figure 42:
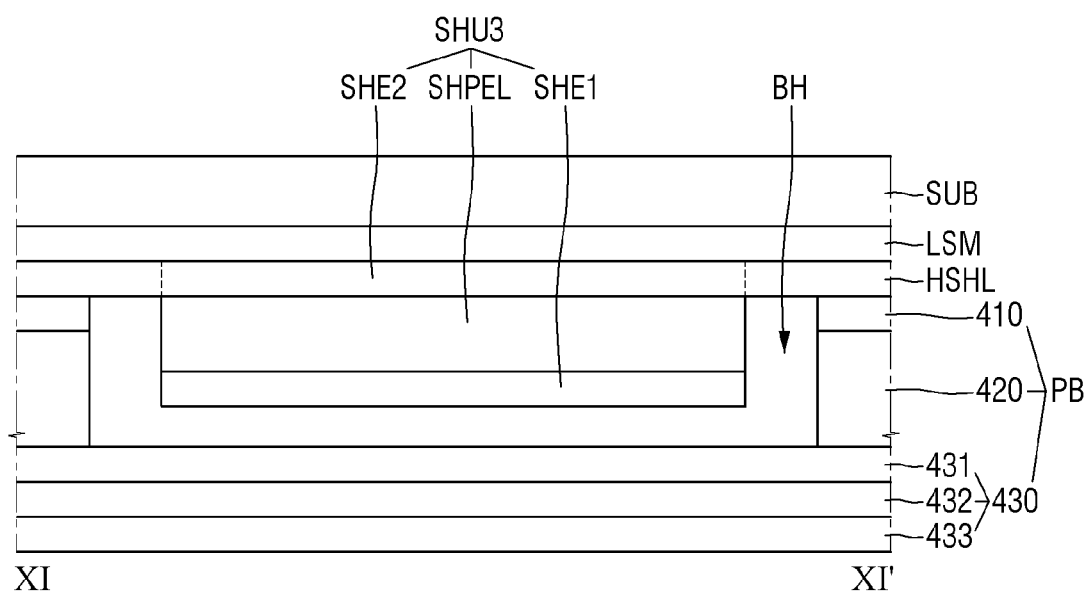
FIG. 42 is a schematic cross-sectional view taken along line XI-XI' of FIG. 41.
Figure 43:
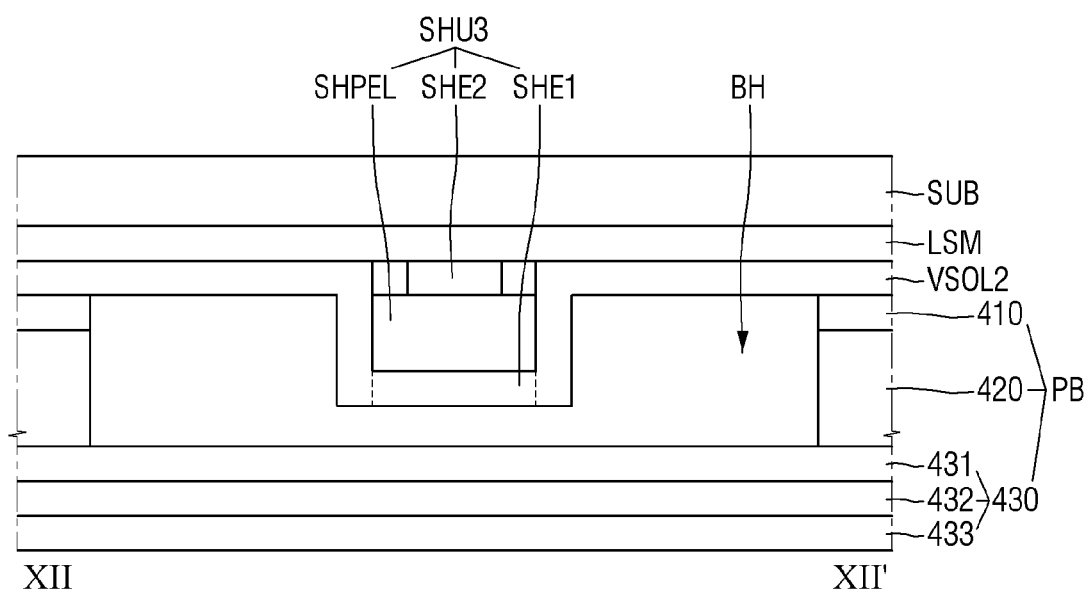
FIG. 43 is a schematic cross-sectional view taken along line XII-XII' of FIG. 41.

FIG. 42 is a schematic cross-sectional view taken along line XI-XI' of FIG. 41. FIG. 43 is a schematic cross-sectional view taken along line XII-XII' of FIG. 41. FIGS. 42 and 43 show a schematic cross section of the third shielding unit SHU3.

Referring to FIGS. 42 and 43, the second vertical sound line VSOL2, the horizontal shielding line HSHL, the vertical shielding line VSHL, the first sound electrodes SOE1, and the second shielding electrode SHE2 may be formed or disposed on the light-shielding member LSM. The first horizontal sound line HSOL1, the second horizontal sound line HSOL2 and the first vertical sound line VSOL1 may also be formed or disposed on the light-shielding member LSM. The first horizontal sound line HSOL1, the second horizontal sound line HSOL2, the first vertical sound line VSOL1, the second vertical sound line VSOL2, the horizontal shielding line HSHL, the vertical shielding line VSHL, the first sound electrodes SOE1 and the second shielding electrodes SHE2 may be made of the same or similar material. The horizontal shielding line HSHL may be electrically connected to the second shielding electrode SHE2. The second vertical sound line VSOL2 may be electrically separated from the second shielding electrode SHE2. The first horizontal sound line HSOL1, the second horizontal sound line HSOL2, the first vertical sound line VSOL1, the second vertical sound line VSOL2, the horizontal shielding line HSHL, the vertical shielding line VSHL, the first sound electrodes SOE1 and the second shielding electrodes SHE2 may include a conductive metal material.

A shielding vibration layer SHPEL may be formed or disposed on the second shielding electrode SHE2. The shielding vibration layer SHPEL may be a piezoelectric material or an electroactive polymer that may be deformed according to a voltage applied to the first shielding electrode SHE1 and a voltage applied to the second shielding electrode SHE2. The piezoelectric material may include plumbum zirconate titanate (PZT), and the electroactive polymer may include a ferroelectric polymer such as polyvinylidene fluoride (PVDF) and poly(vinylidenefluoride-co-trifluoroethylene) (P(VDF-TrFE)). The electroactive polymer may include piezoelectric particles such as ZnO and $BaTiO_3$ to increase the piezoelectric effect. The third shielding unit SHU3 may provide a user with a haptic feedback by vibrating the shielding vibration layer SHPEL by the inverse piezoelectric effect.

The second vertical sound line VSOL2 may be formed or disposed on side surfaces of the shielding vibration layer SPEL of the third shielding unit SHU3. The first shielding electrode SHE1 may be formed or disposed on the shielding vibration layer SHPEL of the third shielding unit SHU3. The shielding vibration layer SHPEL may be disposed between the first shielding electrode SHE1 and the second shielding electrode SHE2 in the third direction (z-axis direction). The first shielding electrode SHE1 may include a conductive metal material. In order to prevent a short-circuit between the second shielding electrode SHE2 and the second vertical sound line VSOL2, the length of the second shielding electrode SHE2 in the second direction (y-axis direction) may be smaller than the length L2 of the shielding vibration layer SHPEL in the second direction (y-axis direction) as shown in FIG. 43.

As shown in FIG. 41, the sound electrode layer SOEL including the first sound electrodes SOE1, the second sound electrodes SOE2, the first shielding electrodes SHE1, the second shielding electrode SHE2, the first vibration layers SPEL and the shielding vibration layers SHPEL may be disposed between the substrate SUB of the display panel 300 and the bottom panel cover PB. Therefore, sound may be output by vibrating the first vibration layers SPEL by the first sound electrodes SOE1 and the second sound electrodes SOE2 of the sound electrode layer SOEL, and it is possible to avoid the sounds by the sound units SU1, SU2, SU3 and SU4 from affecting each other by vibrating the second vibration layer VPEL by the first vibration electrodes VE1 and the second vibration electrodes VE2. Sound may be output using the sound units incorporated into the display panel, and it is possible to suppress the sounds by the sound units SU1, SU2, SU3 and SU4 from interfering each other.

Figure 44:
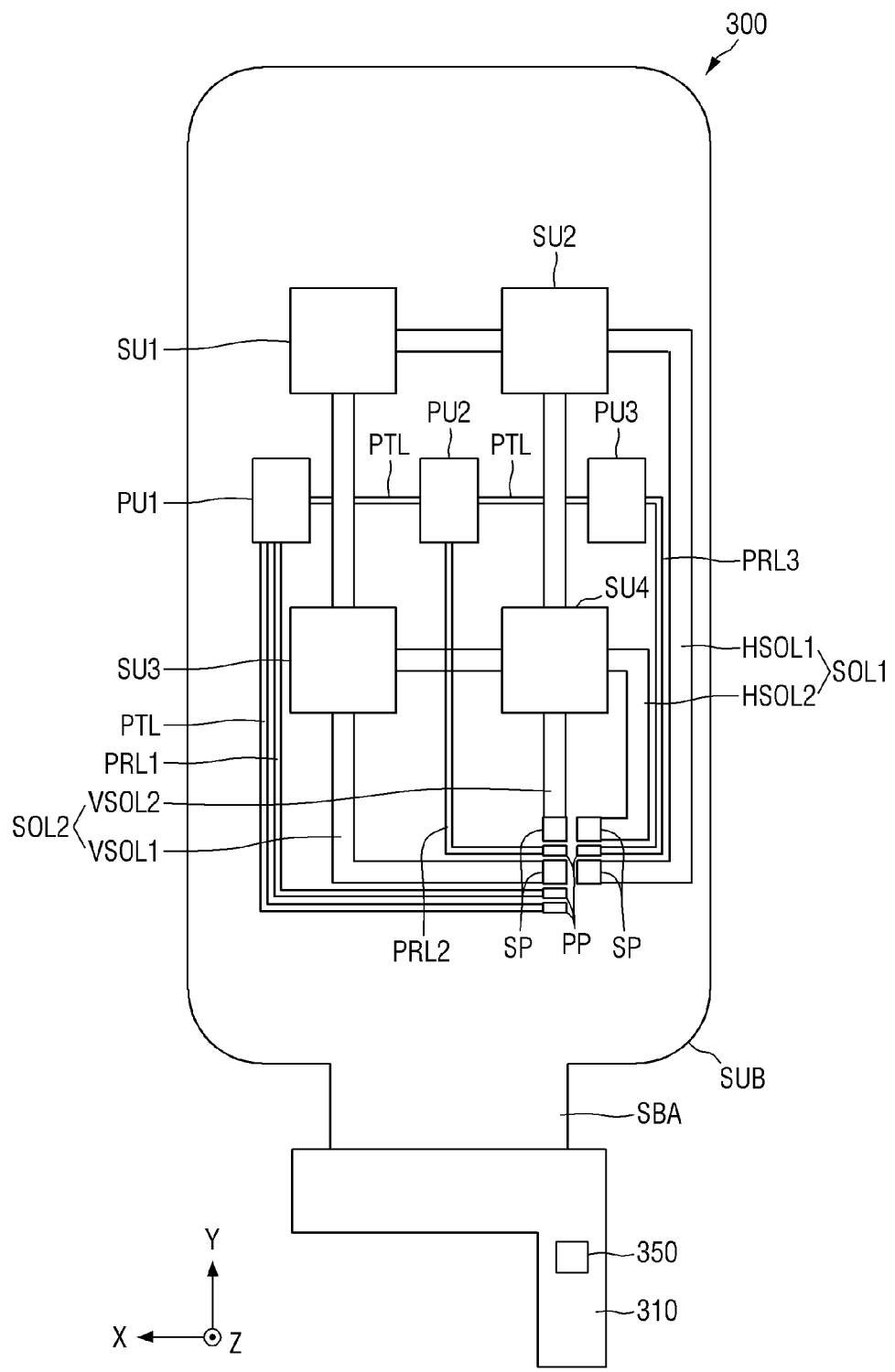
FIG. 44 is a view showing a layout of a display panel according to an embodiment.

FIG. 44 is a view showing a layout of a display panel according to an embodiment.

An embodiment of FIG. 44 may be different from an embodiment of FIGS. 30 and 31 in that a sound electrode layer SOEL may include force sensing units PU1, PU2 and PU3.

Referring to FIG. 44, the force sensing units PU1, PU2 and PU3 may be disposed on the lower surface of the substrate SUB of the display panel 300. The first force sensing unit PU1 may be disposed on the right side of the display panel 300, the second force sensing unit PU2 may be disposed at the center of the display panel 300, and the third force sensing unit PU3 may be disposed on the left side of the display panel 300. It is, however, to be understood that the disclosure is not limited thereto. For example, the first force sensing unit PU1 may be disposed on the upper side of the display panel 300, the second force sensing unit PU2 may be disposed at the center of the display panel 300, and the third force sensing unit PU3 may be disposed on the lower side of the display panel 300.

Each of the force sensing units PU1, PU2 and PU3 may be electrically connected to one force driving line PTL and one force sensing line PRL. The first force sensing unit PU1 may be electrically connected to the force driving line PTL and the first force sensing line PRL1. The second force sensing unit PU2 may be electrically connected to the force driving line PTL and the second force sensing line PRL2. The third force sensing unit PU3 may be electrically connected to the force driving line PTL and the third force sensing line PRL3. The force sensing units PU1, PU2 and PU3 may be commonly connected to the force driving line PTL.

The force driving line PTL, the first force sensing line PRL1, the second force sensing line PRL2 and the third force sensing line PRL3 may be electrically connected to the force pads PP. The force pads PP may be electrically connected to the display circuit board 310 in a case that the subsidiary area SBA is bent and disposed on the lower surface of the display panel 300.

A force driver 350 may be disposed on the display circuit board 310 and may be implemented as an integrated circuit. The force driver 350 may be implemented as a single integrated circuit with the sensor driver 330 and/or the sound driver 340. The force driver 350 outputs a force driving signal to the force driving line PTL and senses current values or voltage values through the first force sensing line PRL1, the second force sensing line PRL2 and the third force sensing line PRL3. Accordingly, it is possible to determine whether a force is applied to the force sensing units PU1, PU2 and PU3.

As shown in FIG. 44, the sound electrode layer SOEL may include the force sensing units PU1, PU2 and PU3, and thus the display device 10 may determine whether a force is applied by the user.

Figure 45:
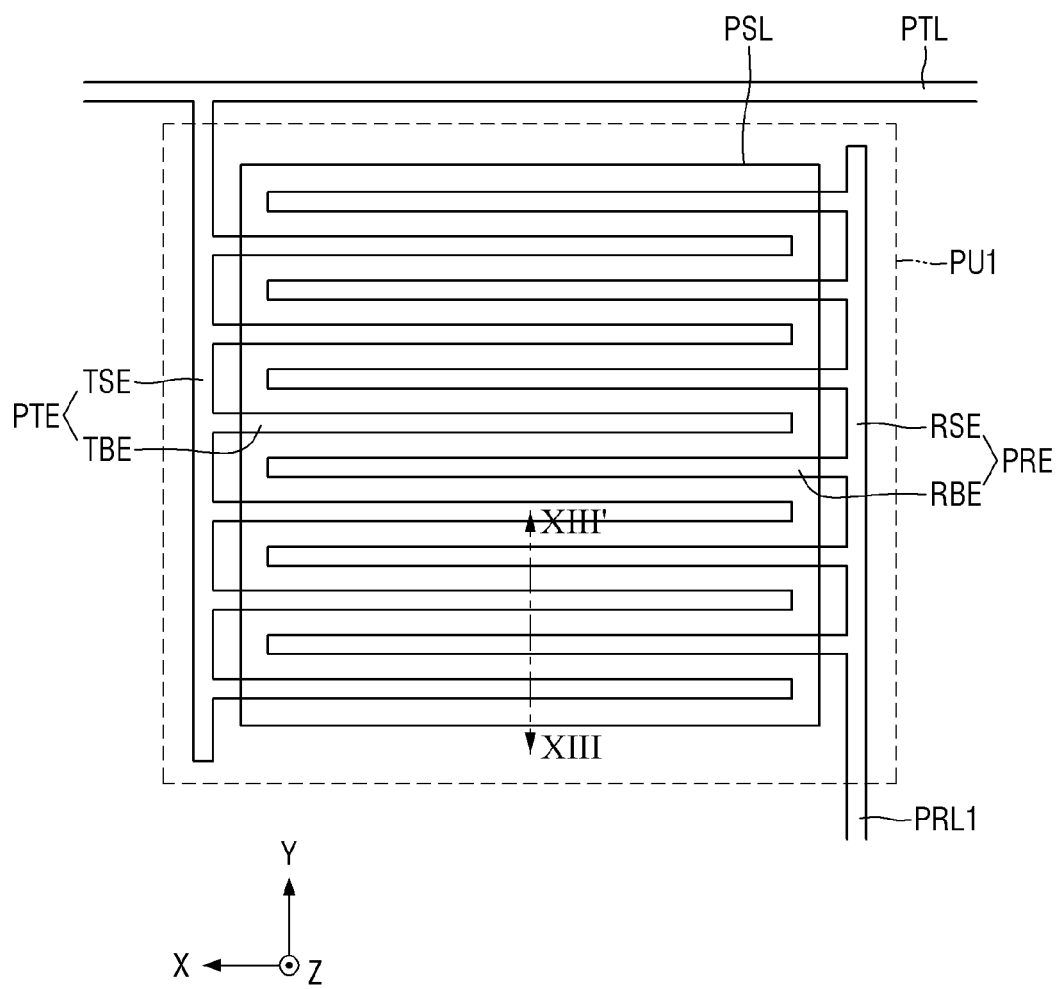
FIG. 45 is a view showing a layout of the force driving electrode, the force sensing electrode, the force driving line and the force sensing line of the first force sensing unit of FIG. 44.
Figure 46:
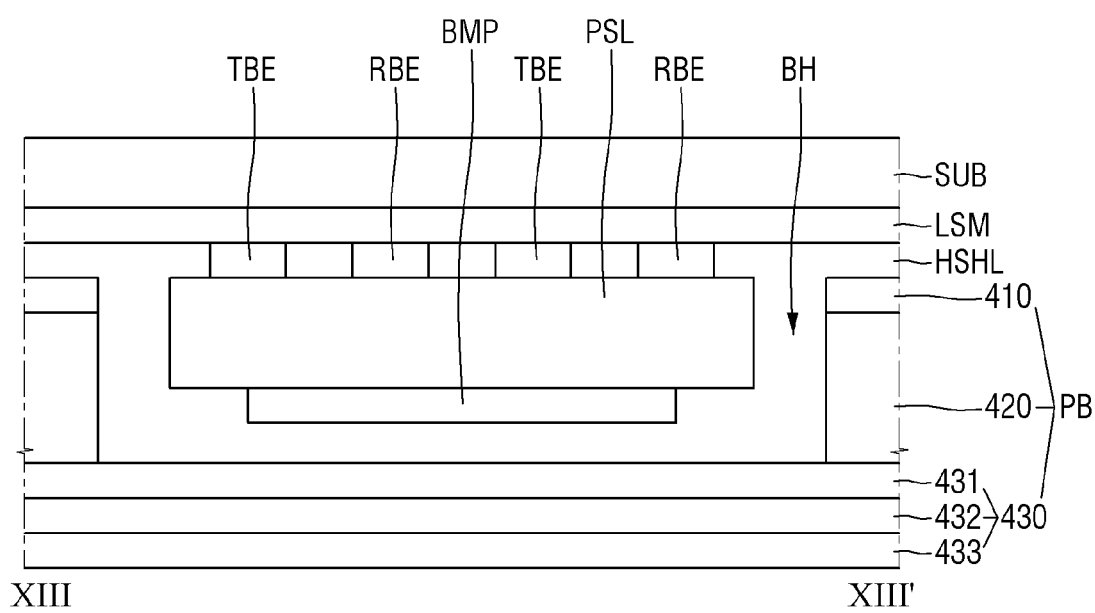
FIG. 46 is a schematic cross-sectional view taken along line XIII-XIII' of FIG. 45.

FIG. 45 is a view showing a layout of the force driving electrode, the force sensing electrode, the force driving line and the first force sensing line of the first force sensing unit of FIG. 44. FIG. 46 is a schematic cross-sectional view taken along line XIII-XIII' of FIG. 45.

Referring to FIGS. 45 and 46, the first force sensing unit PU1 may include a force driving electrode PTE, a force sensing electrode PRE, and a force sensitive layer PSL. The force driving electrode PTE may include a driving stem electrode TSE and driving branch electrodes TBE, and the force sensing electrode PRE may include a sensing stem electrode RSE and sensing branch electrodes RBE.

An end of the driving stem electrode TSE in the second direction (y-axis direction) may be electrically connected to the force driving line PTL. Each of the driving branch electrodes TBE branches off from the driving stem electrode TSE in the first direction (x-axis direction).

An end of the sensing stem electrode RSE in the second direction (y-axis direction) may be electrically connected to the first force sensing line PRL1. Each of the sensing branch electrodes RBE branches off from the sensing stem electrode RSE in the first direction (x-axis direction).

The driving branch electrodes TBE and the sensing branch electrodes RBE may be electrically separated from each other. The driving branch electrodes TBE and the sensing branch electrodes RBE may be arranged or disposed in parallel with each other. The driving branch electrodes TBE and the sensing branch electrodes RBE may be arranged or disposed alternately in the second direction (y-axis direction). They may be arranged or disposed repeatedly in the second direction (y-axis direction) in the order of the driving branch electrode TBE, the sensing branch electrode RBE, the driving branch electrode TBE, the sensing branch electrode RBE, and so on.

The force driving line PTL, the first force sensing line PRL1, the force driving electrode PTE and the force sensing electrode PRE may be disposed on the light-shielding member LSM. The force driving line PTL, the first force sensing line PRL1, the force driving electrode PTE and the force sensing electrode PRE may be made of the same or similar material. The force driving line PTL, the first force sensing line PRL1, the force driving electrode PTE and the force sensing electrode PRE may include a conductive material.

The force sensitive layer PSL may be disposed on the driving branch electrodes TBE and the sensing branch electrodes RBE. The force sensitive layer PSL may include a polymer resin having a force sensitive material. The force sensitive material may be metal microparticles (or metal nanoparticles) such as nickel, aluminum, titanium, tin and copper. For example, the force sensitive layer PSL may be a quantum tunneling composite (QTC). In a case that a force is applied in the third direction (z-axis direction), the resistance of the force sensitive layer PSL may be reduced. Since the resistance of the force sensitive layer PSL changes according to the force applied to the first force sensing unit PU1, the current value or the voltage value detected by the force sensing electrode PRE may change. The force driver 350 may determine whether the force is applied by the user based on the current value or the voltage value detected by the force sensing electrode PRE. Therefore, the first force sensing unit PU1 may be used as an input device for detecting a user's input.

On the force sensitive layer PSL, a bump BMP may be disposed to press the force sensitive layer PSL according to the user's force. The bump BMP may be made of the same or similar material as the second sound electrode SOE2 of each of the sound units SU1, SU2, SU3 and SU4.

Figure 47:
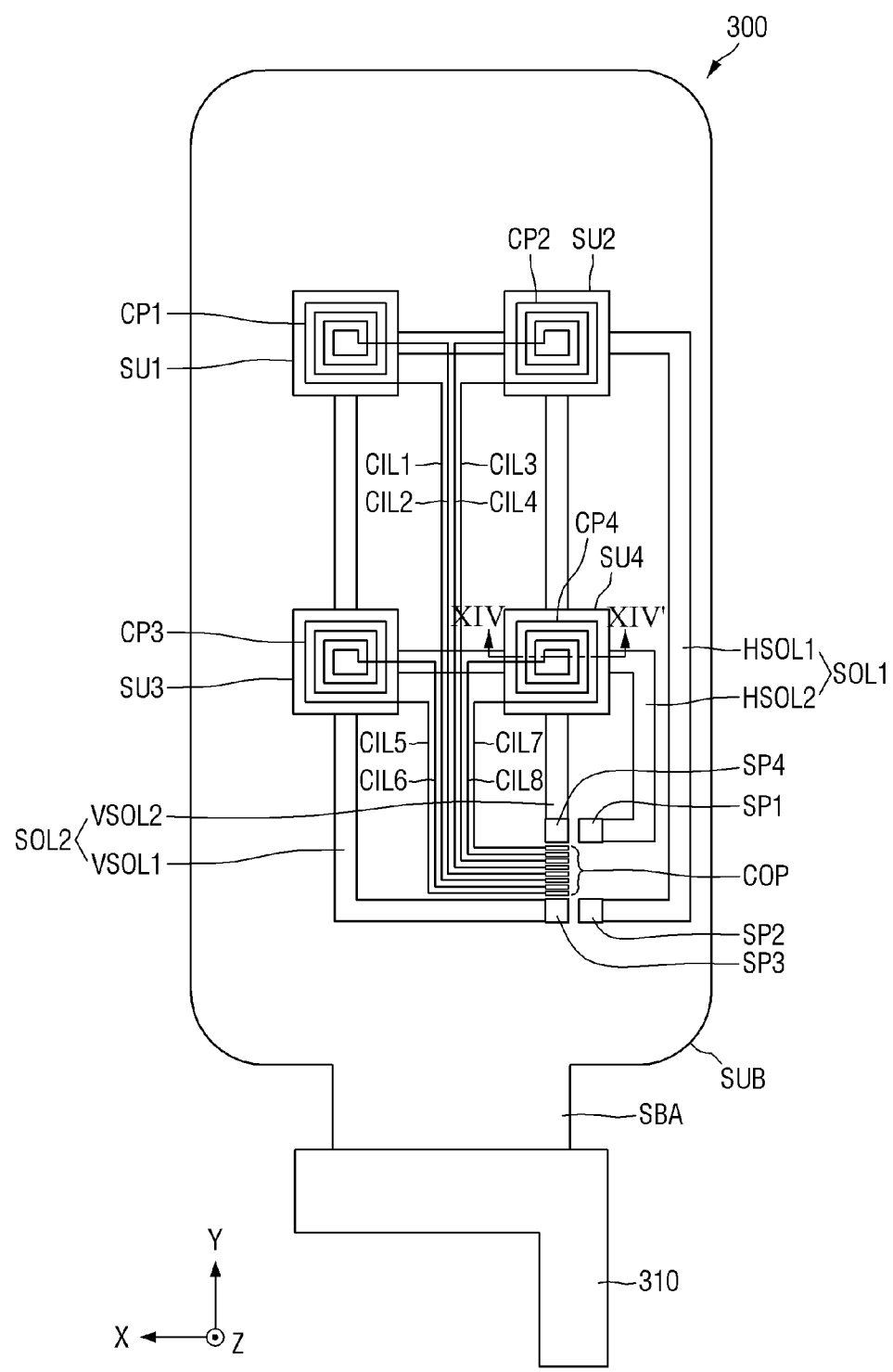
FIG. 47 is a view showing a layout of a display panel according to an embodiment.
Figure 48:
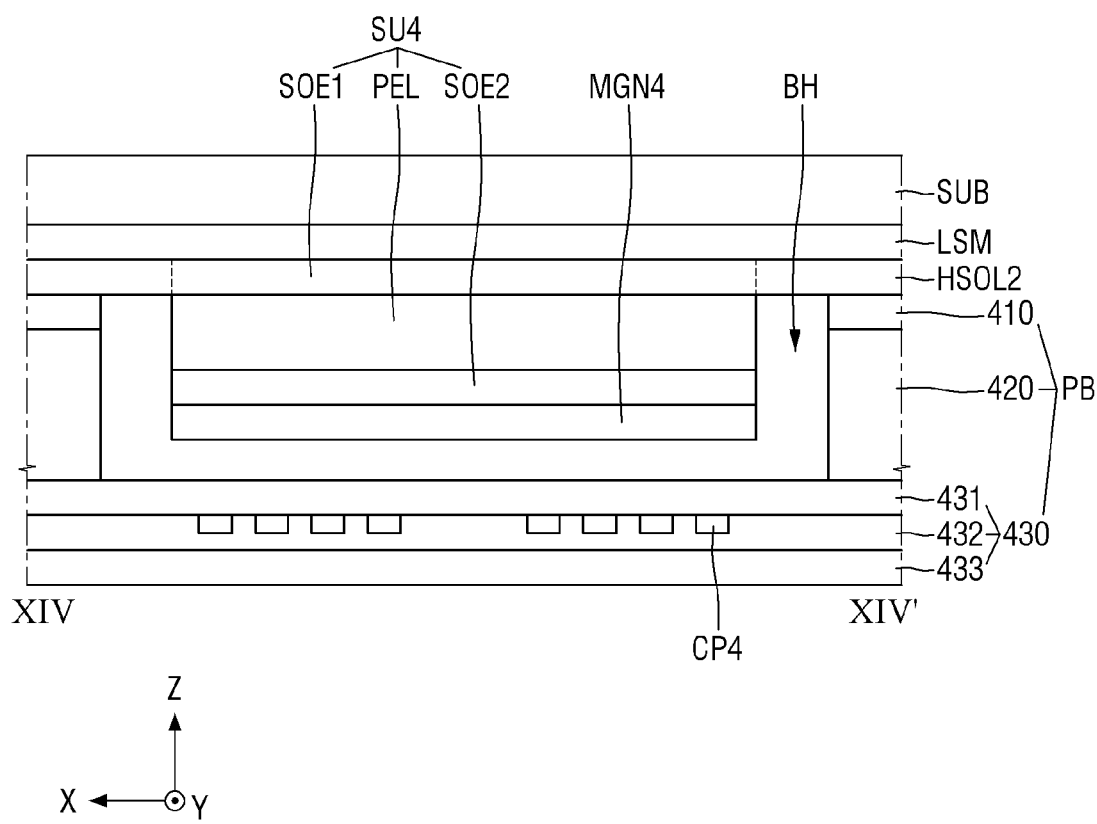
FIG. 48 is a schematic cross-sectional view taken along line XIV-XIV' of FIG. 47.
Figure 49:
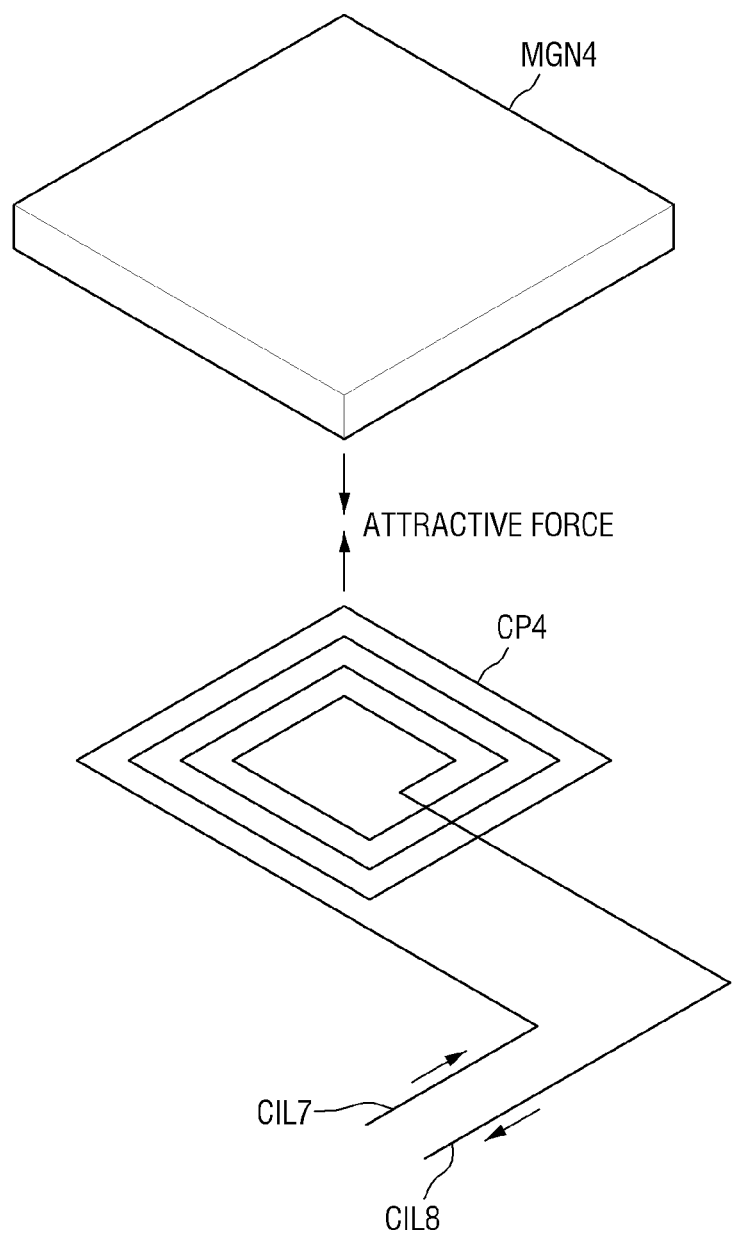
FIGS. 49 and 50 are views showing a change in the vibration layer according to the fixed magnetic field of the magnet of FIG. 47, the induced magnetic field of a coil, and the voltage applied to the first sound electrode and the second sound electrode.
Figure 50:
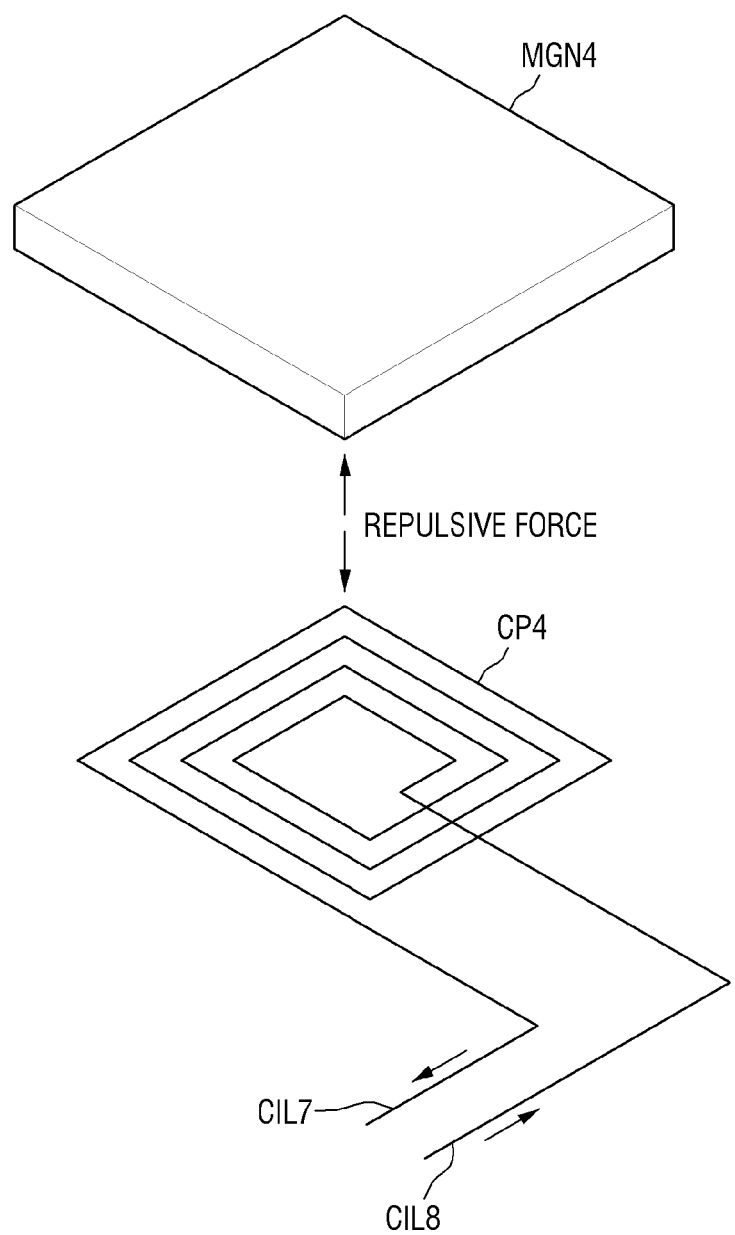

FIG. 47 is a view showing a layout of a display panel according to an embodiment. FIG. 48 is a schematic cross-sectional view taken along line XIV-XIV' of FIG. 47. FIGS. 49 and 50 are views showing a change in the vibration layer according to the fixed magnetic field of the magnet of FIG. 47, the induced magnetic field of a coil, and the voltage applied to the first sound electrode and the second sound electrode.

An embodiment of FIGS. 47 to 50 may be different from an embodiment of FIGS. 31 to 34 in that a sound electrode layer SOEL may include planar coils CP1, CP2, CP3 and CP4.

Referring to FIG. 47, a first planar coil CP1, a first fixed magnet and a first sound unit SU1 may be disposed to overlap one another in the third direction (z-axis direction), and a second planar coil CP2, a second fixed magnet and a second sound unit SU2 may be disposed to overlap one another in the third direction (z-axis direction). A third planar coil CP3, a third fixed magnet and a third sound unit SU3 may be disposed to overlap one another in the third direction (z-axis direction), and a fourth planar coil CP4, a fourth fixed magnet MGN4 and a fourth sound unit SU4 may be disposed to overlap a fourth sound unit PU4 in the third direction (z-axis direction).

The first fixed magnet may be disposed on the second sound electrode SOE2 of the first sound unit PU1. The second fixed magnet may be disposed on the second sound electrode SOE2 of the second sound unit PU2. The third fixed magnet may be disposed on the second sound electrode SOE2 of the third sound unit PU3. The fourth fixed magnet MGN4 may be disposed on the second sound electrode SOE2 of the fourth sound unit PU4 as shown in FIG. 48.

The planar coils CP1, CP2, CP3 and CP4 may be disposed on one surface of the base film 431 of a heat dissipation member 430. The surface of the base film 431 of the heat dissipation member 430 may face the substrate SUB. Alternatively, the surface of the base film 431 of the heat dissipation member 430 may be the opposite surface of the surface facing the substrate SUB as shown in FIG. 48.

One end of the first planar coil CP1 may be electrically connected to a first coil line CIL1, and the other end thereof may be electrically connected to a second coil line CIL2. One end of the second planar coil CP2 may be electrically connected to a third coil line CIL3, and the other end thereof may be electrically connected to a third coil line CIL4. One end of the third planar coil CP3 may be electrically connected to a fifth coil line CIL5, and the other end thereof may be electrically connected to a sixth coil line CIL6. One end of the fourth planar coil CP4 may be electrically connected to a seventh coil line CIL7, and the other end thereof may be electrically connected to an eighth coil line CIL8.

The coil lines CIL1 to CIL8 may be electrically connected to coil pads COP. The coil pads may be electrically connected to the display circuit board 310 in a case that the subsidiary area SBA is bent and disposed on the lower surface of the display panel 300.

The sound driver 340 may apply a current so that an induced magnetic field may be formed by each of the planar coils CP1, CP2, CP3 and CP4. For example, the sound driver 340 may repeat applying a current so that the current flows from the seventh coil line CIL7 to the eighth coil line CIL8 as shown in FIG. 49, and applying a current so that the current flows from the eighth coil line CIL8 to the seventh coil line CIL7 as shown in FIG. 50. In a case that a current flows from the seventh coil line CIL7 to the eighth coil line CIL8 as shown in FIG. 49, an attractive force (or repulsive force) may occur between the fixed magnet MGN and the fourth planar coil CP4. In a case that a current flows from the seventh coil line CIL7 to the eighth coil line CIL8 as shown in FIG. 50, an attractive force (or repulsive force) may occur between the fixed magnet MGN and the fourth planar coil CP4.

The sound driver 340 may apply current to the coil lines CIL1 to CIL8 in synchronization with sound driving voltages for outputting sound by the sound units SU1, SU2, SU3 and SU4. For example, the sound driver 340 may apply a current to the first planar coil CP1 so that the current flows from the seventh coil line CIL7 to the eighth coil line CIL8 while the positive first horizontal sound driving voltage and the negative first vertical sound driving voltage may be applied for driving the first sound unit SU1. In addition, the sound driver 340 may apply a current to the first planar coil CP1 so that the current flows from the eighth coil line CIL8 to the seventh coil line CIL7 while the negative first horizontal sound driving voltage and the positive first vertical sound driving voltage may be applied for driving the first sound unit SU1.

As shown in FIGS. 47 to 50, the fixed magnets MGN4 may be disposed on the second sound electrodes SOE2 of the sound units SU1, SU2, SU3 and SU4, respectively, such that the planar coils CP1, CP2, CP3 and CP4 overlap the fixed magnets MGN4, respectively. In such case, by controlling the direction of current flowing through each of the planar coils CP1, CP2, CP3 and CP4, it is possible to generate an attractive force and a repulsive force between the fixed magnets and the planar coils CP1, CP2, CP3 and CP4. It is possible to increase the vibration displacement of the sound units SU1, SU2, SU3 and SU4 by synchronizing the vibrations of the vibration layer PEL of the sound units SU1, SU2, SU3 and SU4 with the vibrations by the attractive force and repulsive force between the fixed magnets and the planar coils CP1, CP2, CP3 and CP4. Therefore, it is possible to increase the sound pressure level of the low tone of the sound generated by each of the sound units SU1, SU2, SU3 and SU4.

Figure 51:
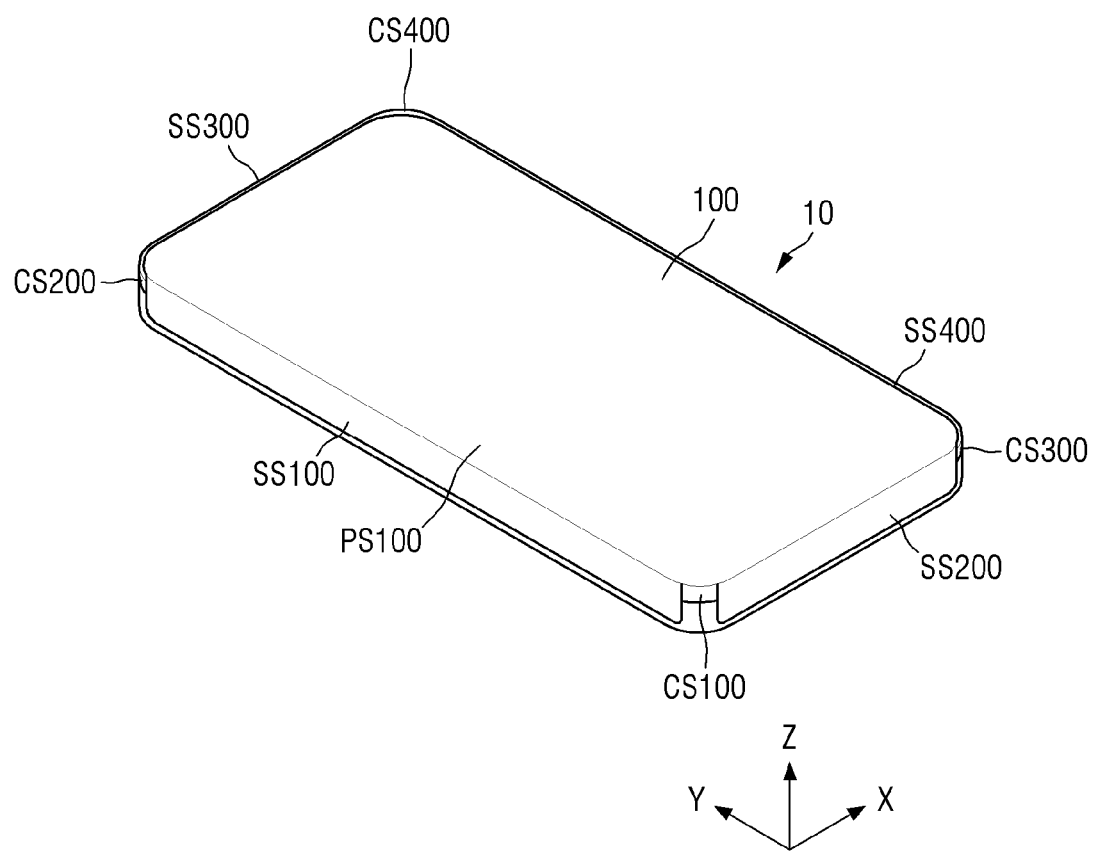
FIG. 51 is a perspective view of a display device according to an embodiment.
Figure 52:
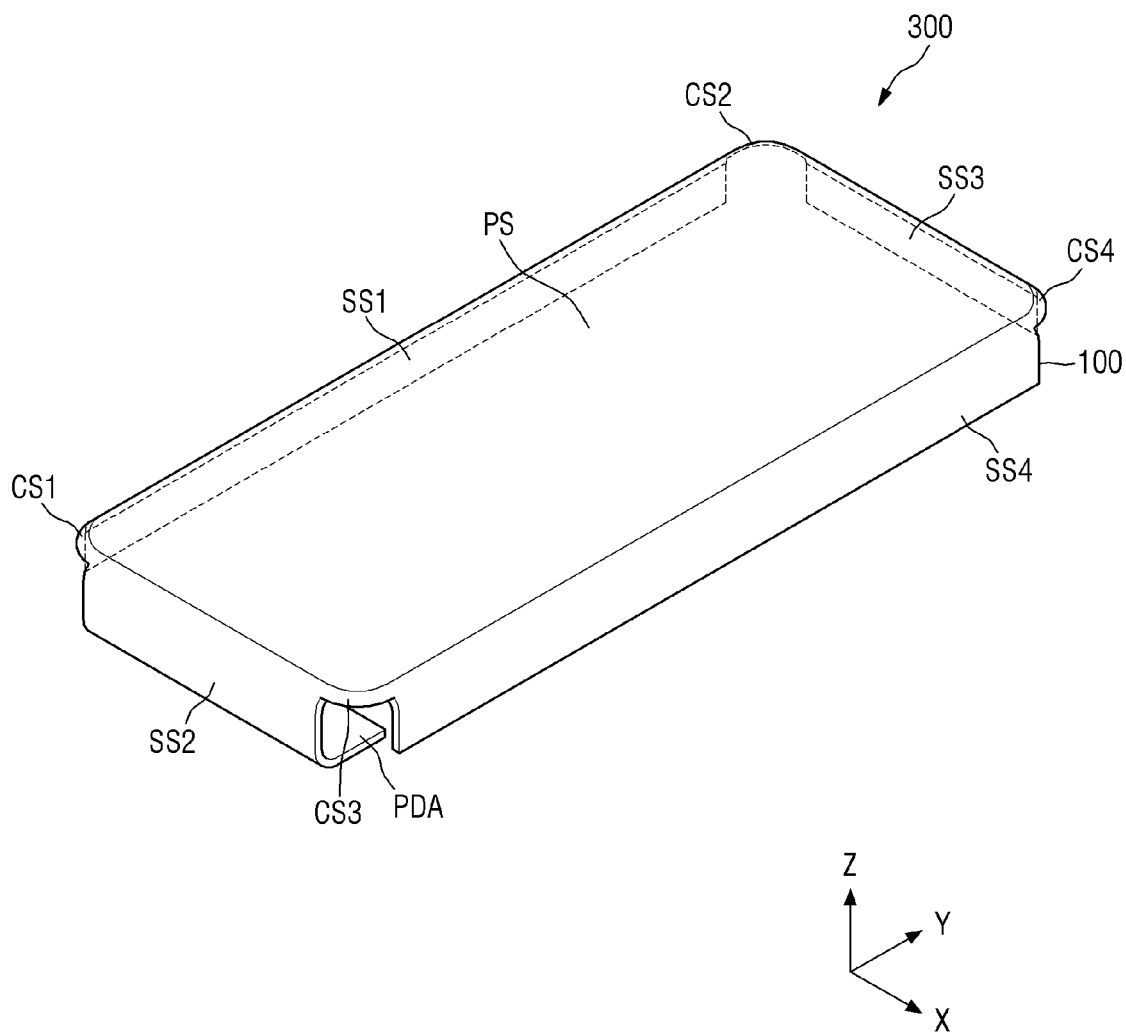
FIG. 52 is a perspective view showing a display panel according to an embodiment.
Figure 53:
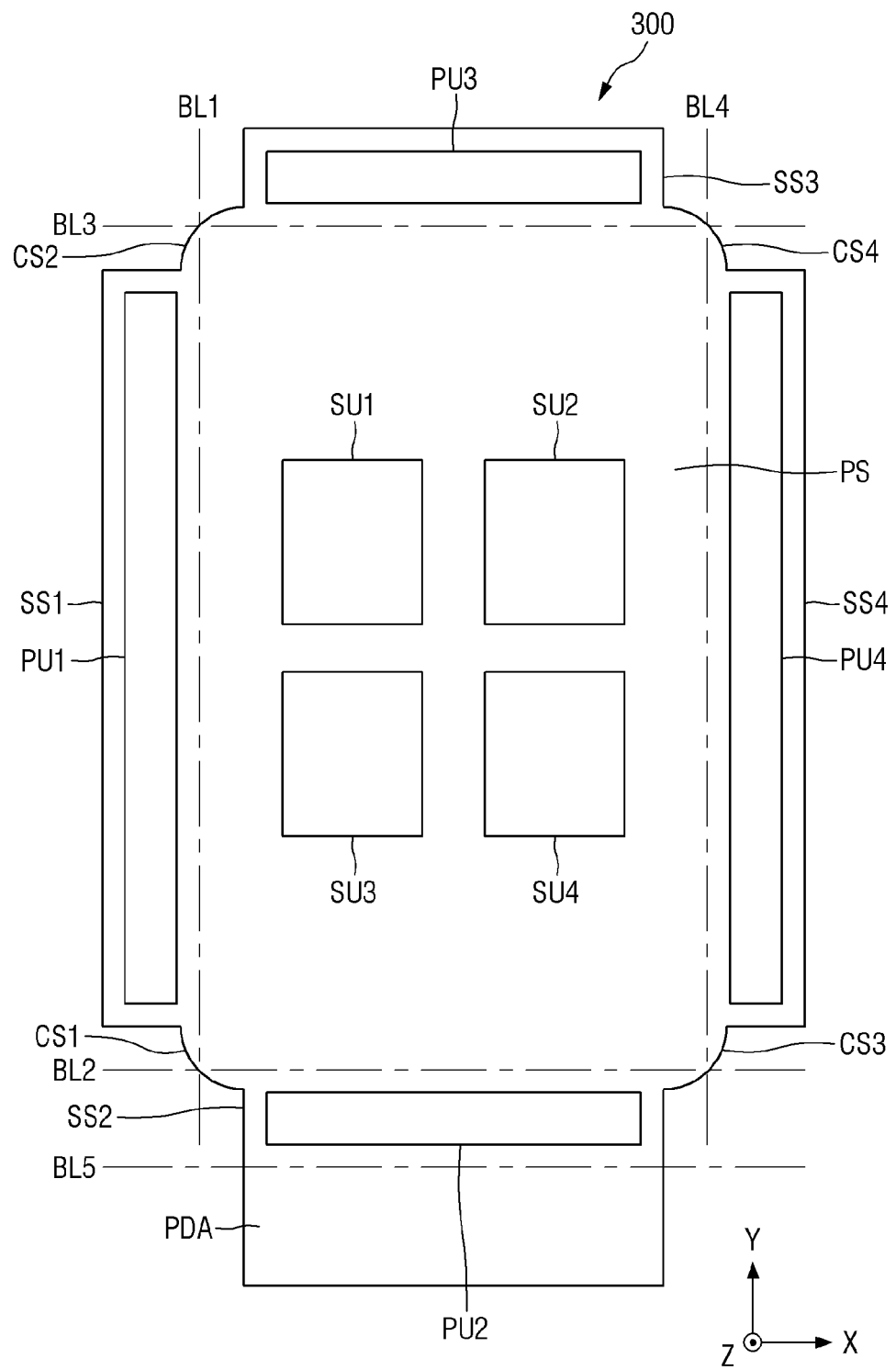
FIG. 53 is a development view showing a display panel according to an embodiment.

FIG. 51 is a perspective view of a display device according to an embodiment. FIG. 52 is a perspective view showing a display panel according to an embodiment. FIG. 53 is a development view showing a display panel according to an embodiment.

An embodiment of FIGS. 51 to 53 may be different from an embodiment of FIGS. 1 and 2 in that images may be displayed on side surfaces of a display device.

Referring to FIGS. 51 to 53, a cover window 100 may include an upper surface PS100, a first side surface SS100, a second side surface SS200, a third side surface SS300, a fourth side surface SS400, a first corner portion CS100, a second corner portion CS200, a third corner portion CS300, and a fourth corner portion CS400.

The upper surface PS100 of the cover window 100 may have, but is not limited to, a substantially rectangular shape having shorter sides in the first direction (x-axis direction) and longer sides in the second direction (y-axis direction) in a case that the cover window 100 is viewed from the top. The upper surface PS100 may have other substantially polygonal shape, a circular shape or an oval shape in a case that the upper surface PS100 is viewed from the top. The corners where the shorter sides and the longer side meet on the upper surface PS100 may be bent with a certain or predetermined curvature. Although the upper surface PS100 is flat in the example shown in FIG. 51, the disclosure is not limited thereto. The upper surface PS100 may include a curved surface.

The first side surface SS100 of the cover window 100 may be extended from a first side of the upper surface PS100. For example, as shown in FIG. 51, the first side surface SS100 may be extended from the left side of the upper surface PS100 and may be the left side surface of the cover window 100.

The second side surface SS200 of the cover window 100 may be extended from a second side of the upper surface PS100. For example, as shown in FIG. 51, the second side surface SS200 may be extended from the lower side of the upper surface PS100 and may be the lower side surface of the cover window 100.

The first side surface SS100 of the cover window 100 may be extended from a third side of the upper surface PS100. For example, as shown in FIG. 51, the third side surface SS300 may be extended from the upper side of the upper surface PS100 and may be the upper side surface of the cover window 100.

The first side surface SS100 of the cover window 100 may be extended from a fourth side of the upper surface PS100. For example, as shown in FIG. 51, the fourth side surface SS400 may be extended from the right side of the upper surface PS100 and may be the right side surface of the cover window 100.

The first corner portion CS100 of the cover window 100 may be extended from the first corner where the first side and the second side of the upper surface PS100 meet. The first corner portion CS1 may be located or disposed between the first side surface SS100 and the second side surface SS200.

The second corner portion CS200 of the cover window 100 may be extended from the second corner where the first side and the third side of the upper surface PS100 meet. The second corner portion CS200 may be located or disposed between the first side surface SS100 and the third side surface SS300.

The third corner portion CS300 of the cover window 100 may be extended from the third corner where the second side and the fourth side of the upper surface PS100 meet. The third corner portion CS300 may be located or disposed between the second side surface SS200 and the fourth side surface SS400.

The fourth corner portion CS400 of the cover window 100 may be extended from the fourth corner where the third side and the fourth side of the upper surface PS100 meet. The fourth corner portion CS400 may be located or disposed between the third side surface SS300 and the fourth side surface SS400.

The upper surface PS100, the first side surface SS100, the second side surface SS200, the third side surface SS300 and the fourth side surface SS400 of the cover window 100 may be formed as transmissive portions that transmit light. The first corner portion CS100, the second corner portion CS200, the third corner portion CS300 and the fourth corner portion CS400 may be, but is not limited to, light-blocking portions that do not transmit light. The first corner portion CS100, the second corner portion CS200, the third corner portion CS300 and the fourth corner portion CS400 of the cover window 100 may also be formed as transmissive portions.

As shown in FIG. 52, the display panel 300 may include a substrate having an upper surface PS, a first side surface SS1, a second side surface SS2, a third side surface SS3, a fourth side surface SS4, a first corner portion CS1, a second corner portion CS2, a third corner portion CS3, and a fourth corner portion CS4.

The upper surface PS of the display panel 300 may have, but is not limited to, a substantially rectangular shape having shorter sides in the first direction (x-axis direction) and longer sides in the second direction (y-axis direction) in a case that the upper surface PS of the display panel 300 is viewed from the top. The upper surface PS may have other substantially polygonal shapes, a substantially circular shape or a substantially oval shape in a case that the upper surface PS of the display panel 300 is viewed from the top. The corners where the shorter sides and the longer side meet on the upper surface PS may be bent with a certain or predetermined curvature. Although the upper surface PS is flat in the example shown in FIGS. 52 and 53, the disclosure is not limited thereto. The upper surface PS may include a curved surface.

The first side surface SS1 of the display panel 300 may be extended from the first side of the upper surface PS. For example, as shown in FIGS. 52 and 53, the first side surface SS1 may be extended from the left side of the upper surface PS. The first side surface SS1 may be bent over a first bending line BL1. The first bending line BL1 may be the boundary between the upper surface PS and the first side surface SS1. The first side surface SS1 may be the left side surface of the display panel 300.

The second side surface SS2 of the display panel 300 may be extended from the second side of the upper surface PS. For example, as shown in FIGS. 52 and 53, the second side surface SS2 may be extended from the lower side of the upper surface PS. The second side surface SS2 may be bent over a second bending line BL2. The second bending line BL2 may be the boundary between the upper surface PS and the second side surface SS2. The second side surface SS2 may be the lower side surface of the display panel 300.

The third side surface SS3 of the display panel 300 may be extended from the third side of the upper surface PS. For example, as shown in FIGS. 52 and 53, the third side surface SS3 may be extended from the upper side of the upper surface PS. The third side surface SS3 may be bent over a third bending line BL3. The third bending line BL3 may be the boundary between the upper surface PS and the third side surface SS2. The third side surface SS3 may be the upper side surface of the display panel 300.

The fourth side surface SS4 of the display panel 300 may be extended from the fourth side of the upper surface PS. For example, as shown in FIGS. 52 and 53, the fourth side surface SS4 may be extended from the right side of the upper surface PS. The fourth side surface SS4 may be bent over a fourth bending line BL4. The fourth bending line BL4 may be the boundary between the upper surface PS and the fourth side surface SS4. The fourth side surface SS4 may be the right side surface of the display panel 300.

The first corner portion CS1 of the display panel 300 may be extended from the first corner where the first side and the second side of the upper surface PS meet. The first corner portion CS1 may be located or disposed between the first side surface SS1 and the second side surface SS2.

The second corner portion CS2 of the display panel 300 may be extended from the second corner where the first side and the third side of the upper surface PS meet. The second corner portion CS2 may be located or disposed between the first side surface SS1 and the third side surface SS3.

The third corner portion CS3 of the display panel 300 may be extended from the third corner where the second side and the fourth side of the upper surface PS meet. The third corner portion CS3 may be located or disposed between the second side surface SS2 and the fourth side surface SS4.

The fourth corner portion CS4 of the display panel 300 may be extended from the fourth corner where the third side and the fourth side of the upper surface PS meet. The fourth corner portion CS4 may be located or disposed between the third side surface SS3 and the fourth side surface SS4.

A pad area PDA of the display panel 300 may be extended from one side of the second side surface SS2. For example, the pad area PDA may be extended from the lower side of the second side surface SS2. The pad area PDA may be bent over a fifth bending line BL5. The fifth bending line BL5 may be the boundary between the second side surface SS2 and the pad area PDA. The pad area PDA of the display panel 300 may be bent over the fifth bending line BL5 to face the upper surface PS of the display panel 300.

The upper surface PS, the first side surface SS1, the second side surface SS2, the third side surface SS3 and the fourth side surface SS4 of the display panel 300 may be display areas where images may be displayed. For example, the upper surface PS of the display panel 300 may be a main display area for displaying a main image, while the first to fourth side surfaces SS1, SS2, SS3 and SS4 may be subsidiary display areas for displaying subsidiary images.

The upper surface PS of the display panel 300 may overlap the upper surface PS100 of the cover window 100 in the third direction (z-axis direction), and may be disposed, for example, under or below the upper surface PS100 of the cover window 100. The first side surface SS1 of the display panel 300 may overlap the first side surface SS100 of the cover window 100 in the first direction (x-axis direction), and may be disposed, for example, under or below the first side surface SS100 of the cover window 100. The second side surface SS2 of the display panel 300 may overlap the second side surface SS200 of the cover window 100 in the second direction (y-axis direction), and may be disposed, for example, under or below the second side surface SS200 of the cover window 100. The third side surface SS3 of the display panel 300 may overlap the third side surface SS3 of the cover window 100 in the second direction (y-axis direction), and may be disposed, for example, under or below the third side surface SS300 of the cover window 100. The fourth side surface SS4 of the display panel 300 may overlap the fourth side surface SS4 of the cover window 100 in the first direction (x-axis direction), and may be disposed, for example, under or below the fourth side surface SS400 of the cover window 100.

The first corner portion CS1 of the display panel 300 may overlap the first corner portion CS100 of the cover window 100 in the third direction (z-axis direction). The second corner portion CS2 of the display panel 300 may overlap the second corner portion CS200 of the cover window 100 in the third direction (z-axis direction). The third corner portion CS3 of the display panel 300 may overlap the third corner portion CS300 of the cover window 100 in the third direction (z-axis direction). The fourth corner portion CS4 of the display panel 300 may overlap the fourth corner portion CS400 of the cover window 100 in the third direction (z-axis direction).

The sound units SU1, SU2, SU3 and SU4 may be disposed under or below the upper surface PS of the display panel 300. The sound units SU1, SU2, SU3 and SU4 may be electrically connected to sound pads through sound lines as shown in FIGS. 30 and 31. The sound lines and the sound pads are not shown in FIG. 53 for convenience of illustration.

The force sensing units PU1, PU2, PU3 and PU4 may overlap the side surfaces SS1, SS2, SS3 and SS4 of the display panel 300, respectively. For example, the first force sensing unit PU1 may be disposed under or below the first side surface SS1 of the display panel 300, and the second force sensing unit PU2 may be disposed under or below the fourth side surface SS4 of the display panel 300. The third force sensing unit PU3 may be disposed under or below the third side surface SS3 of the display panel 300, and the fourth force sensing unit PU4 may be disposed under or below the fourth side surface SS4 of the display panel 300. Each of the force sensing units PU1, PU2, PU3 and PU4 may be electrically connected to the force driving line and the force sensing line as shown in FIG. 44. The force driving line and the force sensing line are not shown in FIG. 53 for convenience of illustration. In addition, each of the force sensing units PU1, PU2, PU3 and PU4 may be formed as shown in FIGS. 45 and 46 to sense a user's force.

Figure 54:
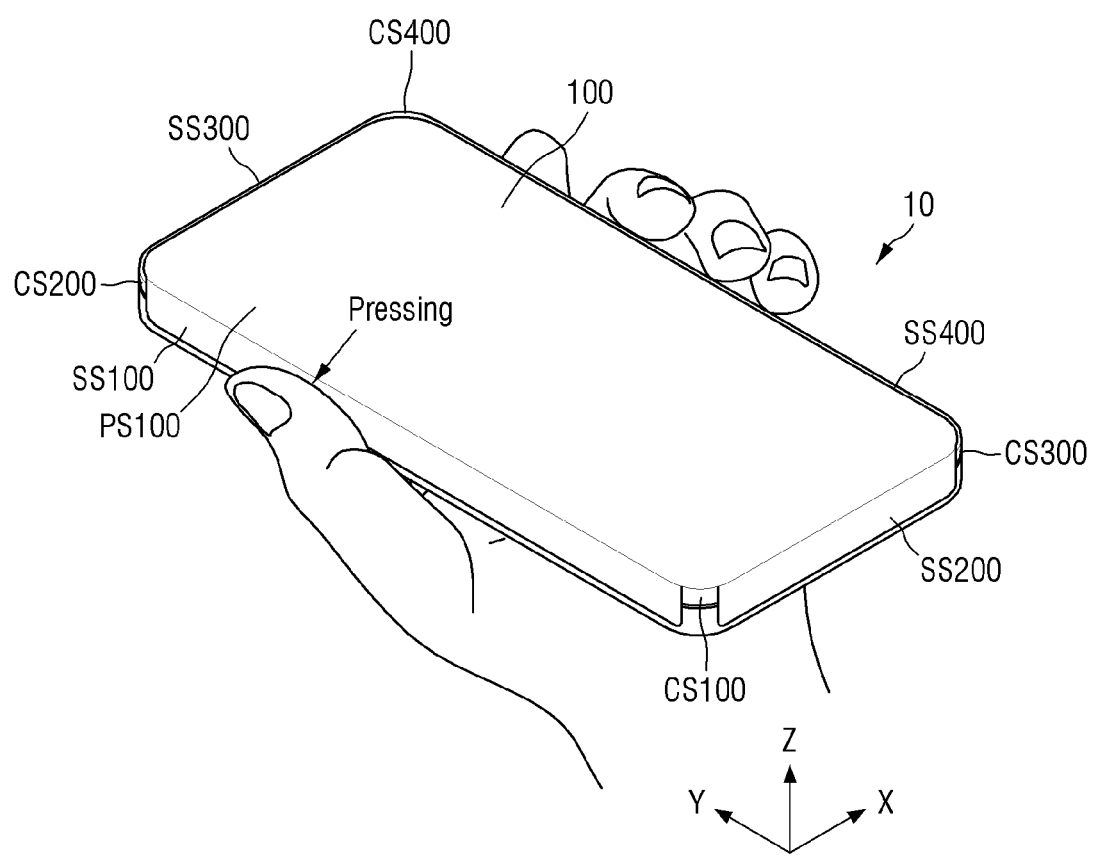
FIG. 54 is a view showing an example where a user makes an input using force sensing units disposed on the side surfaces of the display device.

As shown in FIG. 53, the force sensing units PU1, PU2, PU3 and PU4 may overlap the side surfaces SS1, SS2, SS3 and SS4 of the display panel 300, respectively. In such case, as shown in FIG. 54, in a case that the user applies a force to the first side surface PS100 of the cover window 100 of the display device 10, the display device 10 may sense a user's force by the first force sensing unit PU1 disposed under or below the first side surface PS100.

Figure 55:
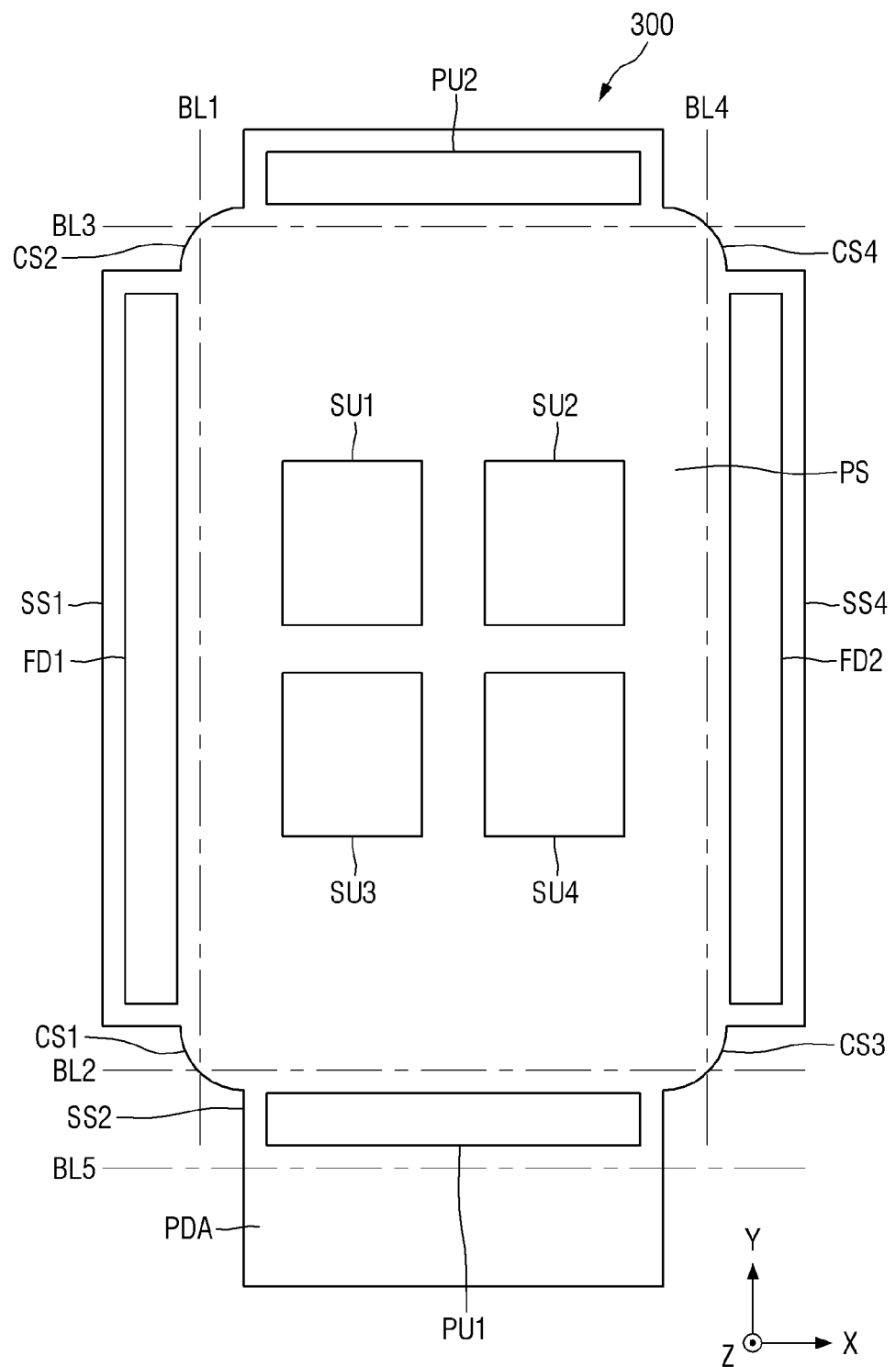
FIG. 55 is a development view showing a display panel according to an embodiment.

FIG. 55 is a development view showing a display panel according to an embodiment.

An embodiment of FIG. 55 may be different from an embodiment of FIG. 53 in that a first fingerprint recognition unit FD1 may overlap the first side surface SS1 of the display panel 300, and a second fingerprint recognition unit FD2 may overlap the fourth side surface SS4.

Referring to FIG. 55, the first fingerprint recognition unit FD1 may be disposed under or below the first side surface SS1 of the display panel 300, and the second fingerprint recognition unit FD2 may be disposed under or below the fourth side surface SS4 of the display panel 300.

Each of the first fingerprint recognition unit FD1 and the second fingerprint recognition unit FD2 may be a fingerprint recognition module that recognizes a user's fingerprint by optical scanning or ultrasonic scanning. The first fingerprint recognition unit FD1 may be disposed under or below the first side surface SS1 of the display panel 300, and the second fingerprint recognition unit FD2 may be disposed under or below the fourth side surface SS4 of the display panel 300.

If each of the first fingerprint recognition unit FD1 and the second fingerprint recognition unit FD2 acquires images by optical scanning, it may include an optical sensor that receives light reflected off a fingerprint of a finger and converts the light into an electrical signal. The optical sensor may be a complementary metal oxide semiconductor (CMOS) image sensor or a charge coupled device (CCD) image sensor. As light is reflected off valleys and absorbed by ridges of a fingerprint of a finger, the fingerprint pattern of the finger may be sensed by the optical sensor.

If each of the first fingerprint recognizing unit FD1 and the second fingerprint recognizing unit FD2 acquires images by ultrasonic scanning, it may include an ultrasonic transmitter for generating ultrasonic waves and an ultrasonic receiver for receiving ultrasonic waves. The display device 10 may obtain the pattern of a fingerprint based on the amplitude of the ultrasonic waves reflected off the fingerprint of the finger. A user's fingerprint has valleys and ridges, and the amplitude of an ultrasound wave may vary depending on whether the ultrasonic wave is reflected off valleys or ridges of the fingerprint. Therefore, the pattern of the fingerprint may be obtained based on the amplitude of the reflected ultrasonic waves.

Although the fingerprint recognition units FD1 and FD2 may be disposed on the first side surface SS1 and the fourth side surface SS4, respectively, in the example shown in FIG. 55, the positions of the fingerprint recognition units are not limited thereto. The fingerprint recognition unit may be disposed on the second side surface SS2 instead of the first force sensing unit PU1 or may be disposed on the third side surface SS3 instead of the second force sensing unit PU2. Alternatively, the fingerprint recognition units may be disposed in the flat portion.

As shown in FIG. 55, at least one fingerprint recognition sensor may overlap at least one of the side surfaces SS1, SS2, SS3 and SS4 of the display panel 300. In such case, the display device 10 may recognize a user's fingerprint by the first fingerprint recognition unit FD1 disposed under or below the first side surface PS100.

Figure 56:
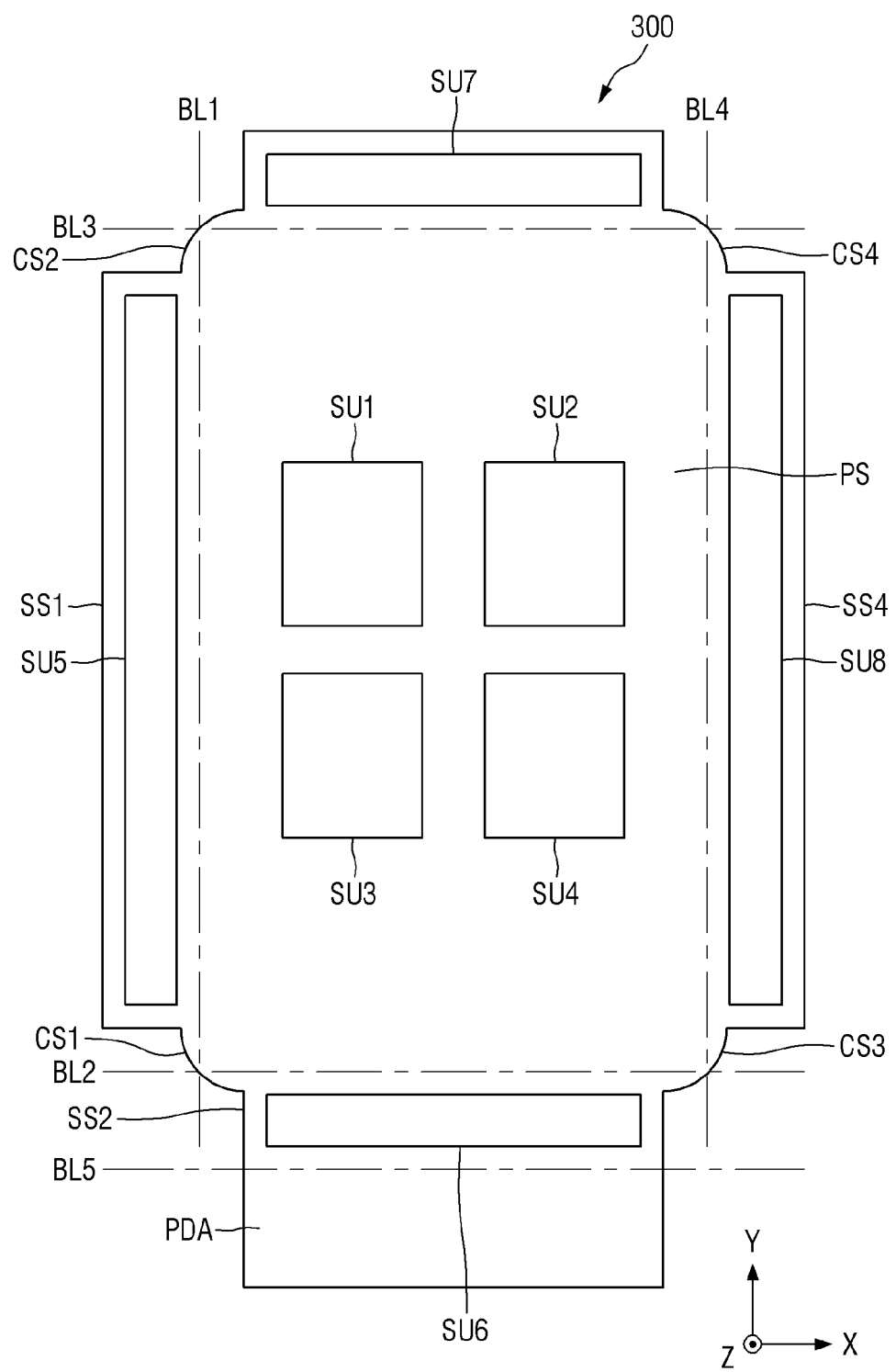
FIG. 56 is a development view showing a display panel according to an embodiment.

FIG. 56 is a development view showing a display panel according to an embodiment.

An embodiment of FIG. 56 may be different from an embodiment of FIG. 53 in that fifth to eighth sound units SU5, SU6, SU7 and SU8 may overlap the side surfaces SS1, SS2, SS3 and SS4 of the display panel 300, respectively.

Referring to FIG. 56, the fifth sound unit SU5 may be disposed under or below the first side surface SS1 of the display panel 300, and the sixth sound unit SU6 may be disposed under or below the second side surface SS2 of the display panel 300. The seventh sound unit SU7 may be disposed under or below the third side surface SS3 of the display panel 300, and the eighth sound unit SU8 may be disposed under or below the fourth side surface SS4 of the display panel 300. The fifth to eighth sound units SU5, SU6, SU7 and SU8 may be electrically connected to sound pads through sound lines as shown in FIGS. 30 and 31. The sound lines and the sound pads are not shown in FIG. 56 for convenience of illustration.

Although the fifth to eighth sound units SU5, SU6, SU7 and SU8 may be disposed in the side surfaces SS1, SS2, SS3 and SS4 of the display panel 300, respectively, in the example shown in FIG. 56, the disclosure is not limited thereto. At least one sound unit may be disposed on at least one of the side surfaces SS1, SS2, SS3, and SS4 of the display panel.

Figure 57:
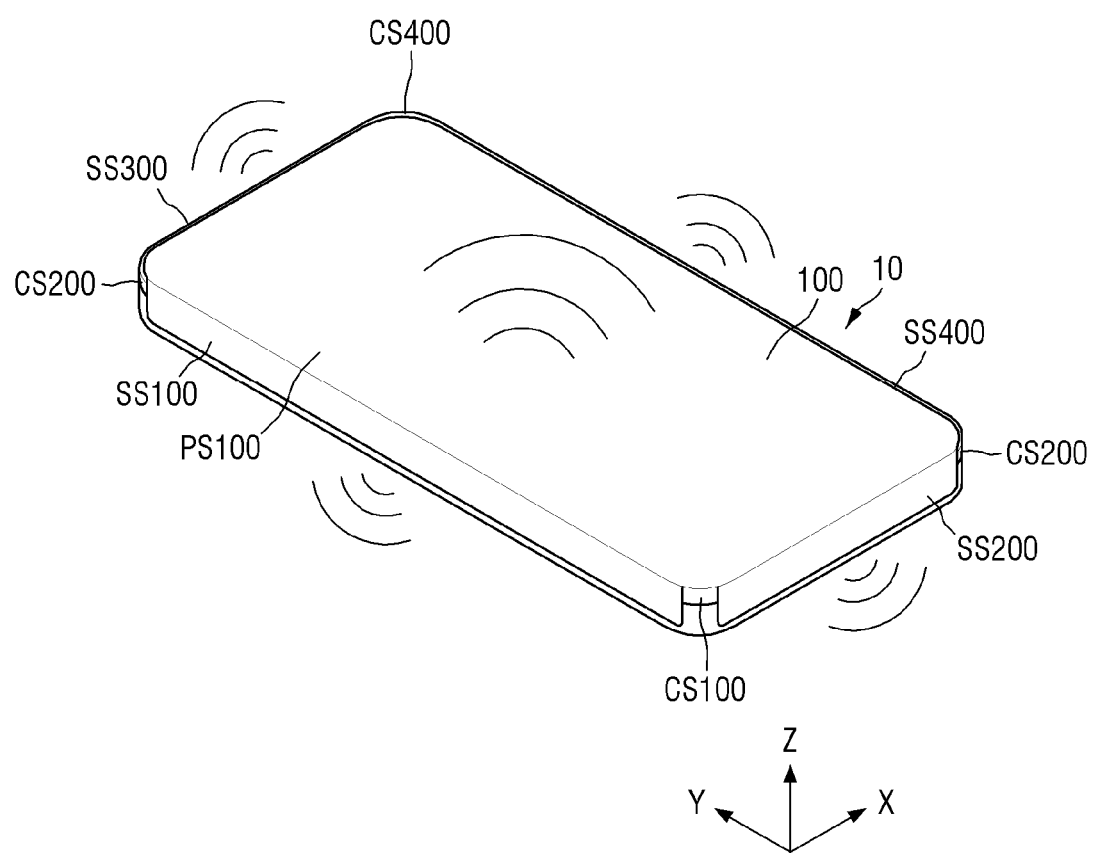
FIG. 57 is a view showing an example where sound is output through sound generating units disposed on the flat portion and the side surfaces of the display device.

Although the fifth to eighth sound units SU5, SU6, SU7 and SU8 may be disposed in the side surfaces SS1, SS2, SS3 and SS4 of the display panel 300, respectively, as shown in FIG. 56. As shown in FIG. 57, the user may feel as if sound is output from the upper surface PS100 as well as the side surfaces SS100, SS200, SS300 and SS400 of the cover window 100 of the display device 10. Sound may be output from all or some or a predetermined number of the side surfaces SS100, SS200, SS300, and SS400 of the cover window 100 of the display device 10.

Figure 59:
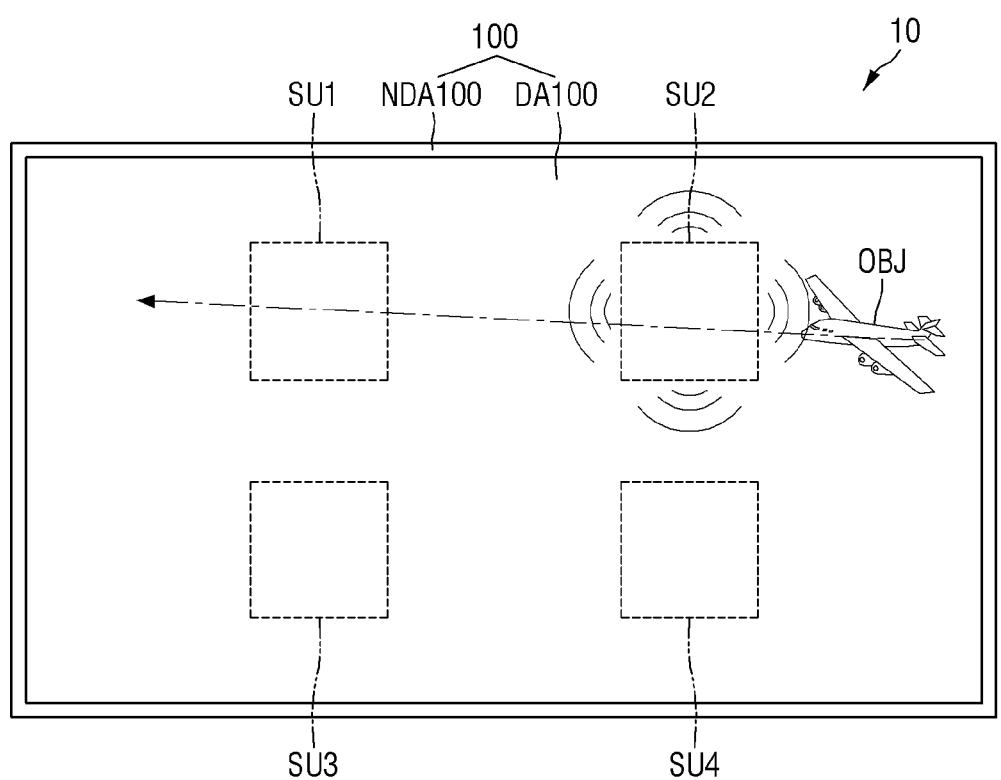
FIGS. 59 to 61 are views showing sound output by sound units according to an image displayed by the display device.
Figure 60:
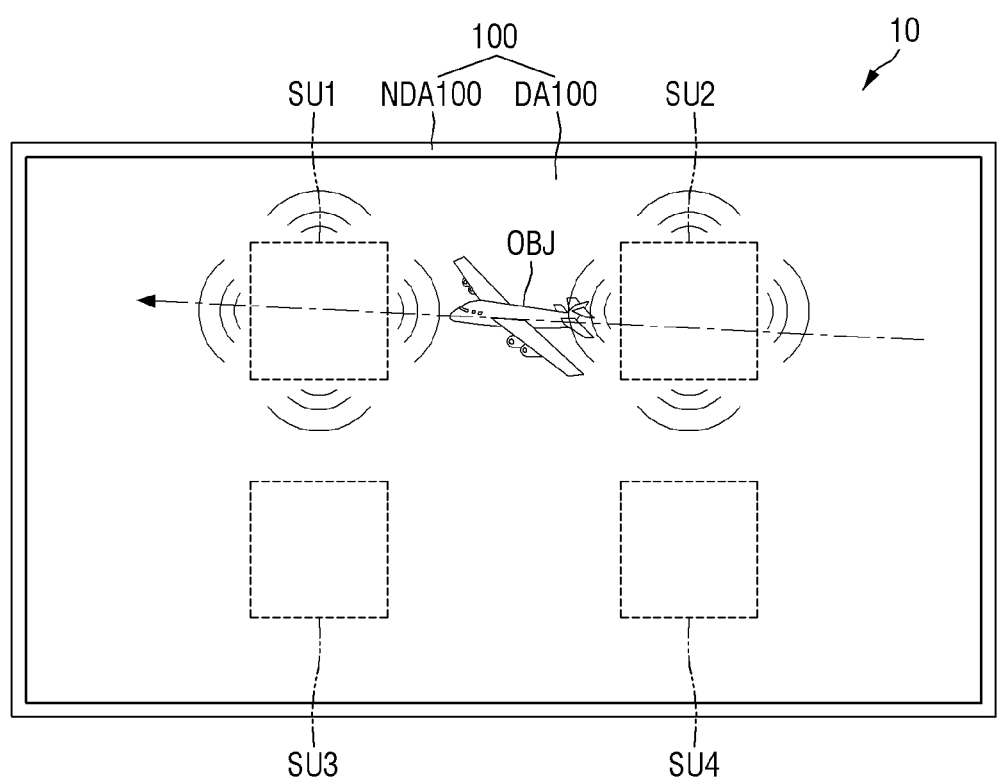
Figure 61:
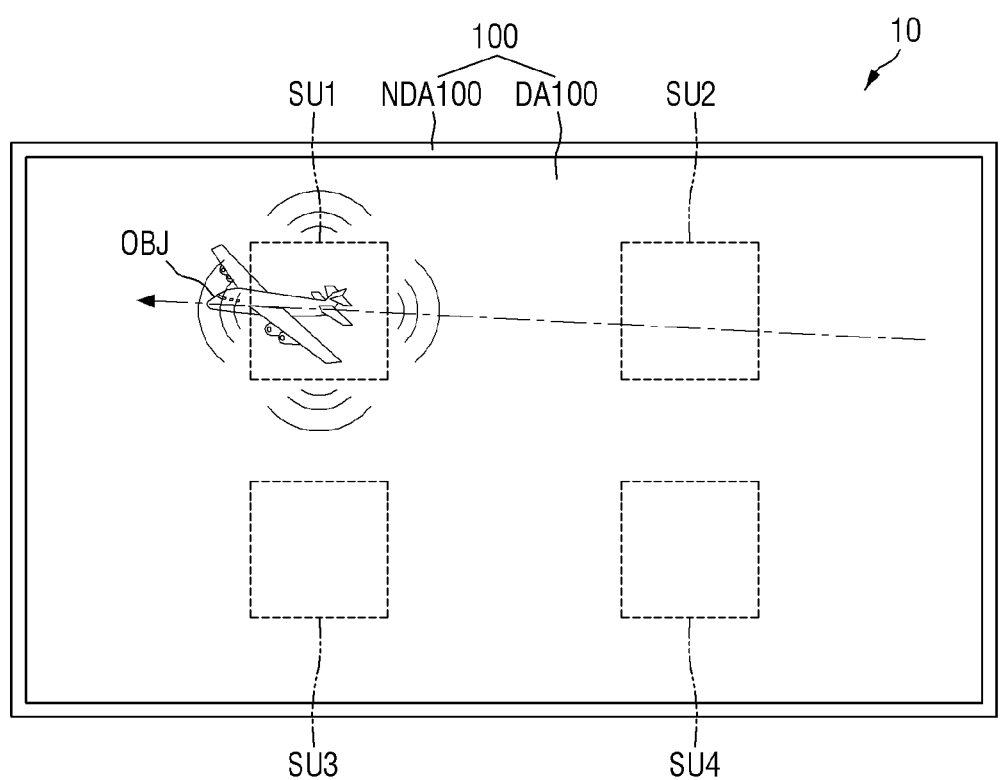

FIGS. 59 to 61 are views showing sound output by sound units according to an image displayed by the display device. In the example shown in FIGS. 59 to 61, the display device 10 is a television. In the example shown in FIGS. 59 to 61, images displayed on the display device 10 during the $n^{th}$ frame period, the $(n+1)^{th}$ frame period, and the $(n+2)^{th}$ frame period.

Referring to FIGS. 59 to 61, the display device 10 may calculate an object OBJ by analyzing digital video data in each of the $n^{th}$ to $(n+2)^{th}$ frame periods. For example, the display device 10 may calculate pixel coordinates of the object OBJ. The display device 10 may select at least one sound unit to be driven to output sound according to the pixel coordinates of the object OBJ in each of the $n^{th}$ to $(n+2)^{th}$ frame periods. For example, in a case that the object OBJ is displayed adjacent to the second sound unit SU2 during the $n^{th}$ frame period as shown in FIG. 59, the second sound unit SU2 may be driven to output sound. In addition, in a case that the object OBJ is displayed between the first sound unit SU1 and the second sound unit SU2 during the $(n+1)^{th}$ frame period, the first sound unit SU1 and the second sound unit SU2 may be driven to output sound. In addition, in a case that the object OBJ is displayed adjacent to the first sound unit SU1 during the (n+2)th frame period, the first sound unit SU1 may be driven to output sound.

As shown in FIGS. 59 to 61, sound may be output by using at least one sound unit to be driven to output the sound according to the position of the object calculated from the digital video data. In this manner, the user may feel as if the sound is output from the object, and thus may experience more realistic sound associated with the displayed image.

What is claimed is:

1. A display device comprising:
   a display panel comprising:
      a display layer comprising light-emitting elements disposed on a substrate; and
      a sensor electrode layer disposed on the display layer, wherein the sensor electrode layer comprises:
         a first sound electrode and a second sound electrode;
         a vibration layer electrically contacting the first sound electrode and the second sound electrode, the vibration layer being deformed in response to a first sound driving voltage applied to the first sound electrode and a second sound driving voltage applied to the second sound electrode; and
         sensor electrodes disposed on the vibration layer, the sensor electrodes sensing an input.

2. The display device of claim 1, wherein the first sound electrode and the second sound electrode are disposed on a same layer.

3. The display device of claim 2, wherein
   the first sound electrode comprises:
      a first sound stem electrode extended in one direction; and
      first sound branch electrodes protruding from the first sound stem electrode in another direction, and
   the second sound electrode comprises:
      a second sound stem electrode extended in the one direction; and
      second sound branch electrodes protruding from the second sound stem electrode in the another direction.

4. The display device of claim 3, wherein the first sound branch electrodes and the second sound branch electrodes are arranged alternately in the one direction.

5. The display device of claim 2, wherein the first sound electrode does not overlap the second sound electrode in a thickness direction of the substrate.

6. The display device of claim 2, wherein the vibration layer is disposed on the first sound electrode and the second sound electrode.

7. The display device of claim 6, wherein
   the sensor electrodes comprise:
      sensing electrodes arranged in a first direction; and
      driving electrodes arranged in a second direction, and
   the sensor electrode layer comprises:
      a first connection electrode electrically connected with adjacent ones of the driving electrodes in the second direction.

8. The display device of claim 7, wherein the vibration layer is disposed on the first connection electrode.

9. The display device of claim 8, wherein each of the adjacent ones of the driving electrodes in the second direction is electrically connected to the first connection electrode through a first contact hole penetrating the vibration layer.

10. The display device of claim 7, wherein the sensor electrode layer further comprises a first sensor insulating layer disposed on the first connection electrode.

11. The display device of claim 10, wherein each of the adjacent ones of the driving electrodes in the second direction is electrically connected to the first connection electrode through a first contact hole penetrating the first sensor insulating layer.

12. The display device of claim 2, wherein the first sound electrode and the second sound electrode are disposed on the vibration layer.

13. The display device of claim 12, wherein the sensor electrodes are disposed on the first sound electrode and the second sound electrode.

14. The display device of claim 12, wherein
   the sensor electrodes comprise:
      sensing electrodes arranged in a first direction; and
      driving electrodes arranged in a second direction, and
   the sensor electrode layer comprises:
      a first connection electrode electrically connected with adjacent ones of the driving electrodes in the second direction.

15. The display device of claim 14, wherein the first connection electrode is disposed on the vibration layer.

16. The display device of claim 15, wherein each of the adjacent ones of the driving electrodes in the second direction is electrically connected to the first connection electrode through a first contact hole penetrating the vibration layer.

17. The display device of claim 15, wherein the sensor electrode layer further comprises a first sensor insulating layer disposed on the first connection electrode.

18. The display device of claim 17, wherein the driving electrodes and the sensing electrodes are disposed on the first sensor insulating layer.

19. The display device of claim 1, wherein
the first sound electrode is disposed on the vibration layer, and
the vibration layer is disposed on the second sound electrode.

20. The display device of claim 19, wherein the first sound electrode overlaps the second sound electrode in a thickness direction of the substrate.

21. The display device of claim 19, wherein
the sensor electrodes comprise:
sensing electrodes arranged in a first direction; and
driving electrodes arranged in a second direction, and
the sensor electrode layer comprises:
a first connection electrode electrically connected with adjacent ones of the driving electrodes in the second direction.

22. The display device of claim 21, wherein the vibration layer is disposed on the first connection electrode.

23. The display device of claim 22, wherein the first connection electrode and the second sound electrode are disposed on a same layer.

24. The display device of claim 21, wherein the sensor electrode layer further comprises a first sensor insulating layer disposed on the first connection electrode.

25. The display device of claim 24, wherein each of the adjacent ones of the driving electrodes in the second direction is electrically connected to the first connection electrode through a first contact hole penetrating the first sensor insulating layer.

26. The display device of claim 1, wherein,
the sensor electrode layer is disposed on and directly over the display layer, and
the sensor electrodes are disposed on and directly over the vibration layer, the sensor electrodes sensing a touch input.

27. A display device comprising:
a display panel comprising:
a display layer comprising light-emitting elements disposed on a surface of a substrate; and
a sound electrode layer including sound units disposed on an opposite surface of the substrate, wherein
each of the sound units comprises:
a first sound electrode;
a second sound electrode disposed on the first sound electrode; and
a first vibration layer disposed between the first sound electrode and the second sound electrode, the vibration layer being deformed in response to a first sound driving voltage applied to the first sound electrode and a second sound driving voltage applied to the second sound electrode,
first sound electrodes of the sound units arranged in a first direction among the sound units are electrically connected to one another,
first sound electrodes of the sound units arranged in a second direction among the sound units are not electrically connected to one another,
second sound electrodes of the sound units arranged in the second direction among the sound units are electrically connected to one another, and
second sound electrodes of the sound units arranged in the first direction among the sound units are not electrically connected to one another.

28. The display device of claim 27, wherein the sound electrode layer further comprises
a first sound line disposed between the first sound electrodes of the sound units adjacent to each other in the first direction; and
a second sound line disposed between the second sound electrodes of the sound units adjacent to each other in the second direction.

29. The display device of claim 27, wherein the sound electrode layer further comprises a light-shielding layer disposed between the opposite surface of the substrate and the sound electrode layer.

30. The display device of claim 27, wherein
the display panel comprises a bottom panel cover disposed on the sound electrode layer,
the bottom panel cover comprises a buffer that absorbs an external shock applied to the display panel, and
the buffer does not overlap the sound units in a thickness direction of the substrate.

31. The display device of claim 30, wherein the buffer comprises through holes in which the sound units are disposed.

32. The display device of claim 31, wherein the bottom panel cover further comprises a heat dissipation member disposed on the buffer.

33. The display device of claim 30, wherein
the sound electrode layer comprises a fixed magnet disposed on the second sound electrode, and
the bottom panel cover further comprises a planar coil overlapping the fixed magnet in the thickness direction of the substrate and disposed on the buffer.

34. The display device of claim 33, wherein
a current flows through the planar coil to generate a magnetic field of the fixed magnet and a magnetic field of the planar coil,
the current flows from an end to another end of the planar coil to generate an attractive force between the fixed magnet and the planar coil, and
the current flows from the another end to the end of the planar coil to generate a repulsive force between the fixed magnet and the planar coil.

35. The display device of claim 27, wherein
the sound electrode layer comprises vibration units to produce haptic feedback to a user, the vibration units spaced apart from the sound units, and
each of the vibration units comprises:
a first vibration electrode;
a second vibration electrode disposed on the first vibration electrode; and
a second vibration layer disposed between the first vibration electrode and the second vibration electrode, the second vibration layer being deformed in response to a first vibration driving voltage applied to the first vibration electrode and a second vibration driving voltage applied to the second vibration electrode.

36. The display device of claim 35, wherein the sound units are adjacent to the vibration units.

37. The display device of claim 36, wherein each of the sound units comprises:
a first subsidiary sound unit disposed adjacent to a first side surface and a second side surface of the vibration units;
a second subsidiary sound unit disposed adjacent to the first side surface and a third side surface of the vibration units;

a third subsidiary sound unit disposed adjacent to the second side surface and a fourth side surface of the vibration units; and
a fourth subsidiary sound unit disposed adjacent to the third side surface and the fourth side surface of the vibration units.

38. The display device of claim 37, wherein
a first sound electrode of the first subsidiary sound unit is electrically connected to a first sound electrode of the second subsidiary sound unit,
a first sound electrode of the third subsidiary sound unit is electrically connected to a first sound electrode of the fourth subsidiary sound unit,
the first sound electrode of the first subsidiary sound unit is spaced apart from the first sound electrode of the third subsidiary sound unit, and
the first sound electrode of the second subsidiary sound unit is spaced apart from the first sound electrode of the fourth subsidiary sound unit.

39. The display device of claim 37, wherein
a second sound electrode of the first subsidiary sound unit is electrically connected to a second sound electrode of the third subsidiary sound unit,
a second sound electrode of the second subsidiary sound unit is electrically connected to a second sound electrode of the fourth subsidiary sound unit,
the second sound electrode of the first subsidiary sound unit is spaced apart from the second sound electrode of the second subsidiary sound unit, and
the second sound electrode of the third subsidiary sound unit is spaced apart from the second sound electrode of the fourth subsidiary sound unit.

40. The display device of claim 37, wherein the sound electrode layer comprises:
a first subsidiary sound connection line electrically connected to a first sound electrode of the first subsidiary sound unit and a first sound electrode of the second subsidiary sound unit;
a second subsidiary sound connection line electrically connected to a first sound electrode of the third subsidiary sound unit and a first sound electrode of the fourth subsidiary sound unit;
a third subsidiary sound connection line electrically connected to a second sound electrode of the first subsidiary sound unit and a second sound electrode of the third subsidiary sound unit; and
a fourth subsidiary sound connection line electrically connected to a second sound electrode of the second subsidiary sound unit and a second sound electrode of the fourth subsidiary sound unit.

41. The display device of claim 40, wherein the sound electrode layer further comprises:
a first vibration line electrically connected with the first sound electrodes of the vibration units adjacent to each other in the first direction; and
a second vibration line electrically connected with the second sound electrodes of the vibration units adjacent to each other in the second direction.

42. The display device of claim 41, wherein
the first vibration line is disposed between the first subsidiary sound connection line and the second subsidiary sound connection line, and
the second vibration line is disposed between the third subsidiary sound connection line and the fourth subsidiary sound connection line.

43. The display device of claim 41, wherein
the first vibration lines are disposed between the first subsidiary sound unit and the third subsidiary sound unit and disposed between the second subsidiary sound unit and the fourth subsidiary sound unit, and
the second vibration lines are disposed between the first subsidiary sound unit and the second subsidiary sound unit and disposed between the third subsidiary sound unit and the fourth subsidiary sound unit.

44. The display device of claim 27, wherein
the sound electrode layer comprises a shielding unit spaced apart from the sound units, and
the shielding unit comprises:
a first shielding electrode;
a second shielding electrode overlapping the first shielding electrode in a thickness direction of the substrate; and
a third vibration layer disposed between the first shielding electrode and the second shielding electrode, the third vibration layer being deformed in response to a first shielding driving voltage applied to the first shielding electrode and a second shielding driving voltage applied to the second shielding electrode.

45. The display device of claim 44, wherein
the first sound driving voltage applied to the first sound electrode of the sound unit adjacent to the shielding unit is equal to the second shielding driving voltage applied to the second shielding electrode of the shielding unit, and
the second sound driving voltage applied to the second sound electrode of the sound unit adjacent to the shielding unit is equal to the first shielding driving voltage applied to the first shielding electrode of the shielding unit.

46. The display device of claim 44, wherein
the second shielding electrode is electrically connected to at least one of the first sound electrodes, and
the first shielding electrode is electrically connected to at least one of the second sound electrodes.

47. The display device of claim 27, wherein
the sound electrode layer comprises force sensing units spaced apart from the sound units, and
each of the force sensing units comprises:
a force driving electrode;
a force sensing electrode spaced apart from the force driving electrode; and
a force sensing layer disposed on the force driving electrode and the force sensing electrode and having a resistance variable in response to a force applied to the force sensing layer.

48. The display device of claim 47, wherein the force driving electrode, the force sensing electrode, and the first sound electrode are made of a same material.

49. The display device of claim 47, wherein each of the force sensing units further comprises a bump disposed on the force sensing layer.

50. The display device of claim 49, wherein the bump and the second sound electrode are made of a same material.

51. The display device of claim 27, wherein the sound electrode layer further includes vibration units to produce haptic feedback to a user, the vibration units spaced apart from the sound units.

52. A display device comprising:
a display panel comprising:
a substrate comprising an upper surface and a side surface extended from a side of the upper surface;

a display layer comprising light-emitting elements disposed on a surface of the substrate in the upper surface and the side surface; and a sound electrode layer including a sound unit disposed on an opposite surface of the substrate; and a sensor unit disposed on the opposite surface of the substrate in the side surface, wherein the sound unit comprises
  a first sound electrode;
  a second sound electrode disposed on the first sound electrode; and
  a vibration layer disposed between the first sound electrode and the second sound electrode, the vibration layer being deformed in response to a first sound driving voltage applied to the first sound electrode and a second sound driving voltage applied to the second sound electrode.

53. The display device of claim 52, wherein the sensor unit is a fingerprint sensor unit that emits ultrasonic waves or light and detects ultrasonic waves or light reflected by a fingerprint.

54. The display device of claim 52, wherein the sensor unit is a force sensing unit that comprises:
  a force driving electrode;
  a force sensing electrode spaced apart from the force driving electrode; and
  a force sensing layer disposed on the force driving electrode and the force sensing electrode and having a resistance variable in response to a force applied to the force sensing layer.

55. The display device of claim 52, wherein the sound electrode layer comprises a second sound unit disposed on the opposite surface of the substrate in the side surface of the substrate.

* * * * *